United States Patent
Kurihara et al.

(10) Patent No.: US 9,335,359 B2
(45) Date of Patent: May 10, 2016

(54) FAR ELECTROMAGNETIC FIELD ESTIMATION METHOD AND APPARATUS, AND NEAR ELECTROMAGNETIC FIELD MEASUREMENT APPARATUS

(71) Applicant: TDK CORPORATION, Tokyo (JP)

(72) Inventors: Hiroshi Kurihara, Tokyo (JP); Masataka Midori, Tokyo (JP); Masashi Torii, Tokyo (JP)

(73) Assignee: TDK CORPORATION, Tokyo (JP)

( * ) Notice: Subject to any disclaimer, the term of this patent is extended or adjusted under 35 U.S.C. 154(b) by 94 days.

(21) Appl. No.: 14/454,963

(22) Filed: Aug. 8, 2014

(65) Prior Publication Data
US 2015/0042309 A1    Feb. 12, 2015

(30) Foreign Application Priority Data
Aug. 9, 2013    (JP) ................... 2013-166651

(51) Int. Cl.
*G01R 29/08*    (2006.01)

(52) U.S. Cl.
CPC ........ *G01R 29/0871* (2013.01); *G01R 29/0821* (2013.01); *G01R 29/0892* (2013.01)

(58) Field of Classification Search
CPC ............. G01R 29/0871; G01R 31/002; G01R 29/0814; G01R 29/0878; G01R 31/315; G01R 1/06772; G01R 29/10; G01R 31/311; G01R 33/345; H01Q 1/38; H01Q 9/0407; H01Q 21/28; H01Q 9/0421; H01L 2223/6677; H01L 2924/3025; A61N 1/08; A61N 1/3718; H03H 1/0007; G06K 19/07773; H01G 4/35; Y10T 29/49016

See application file for complete search history.

(56) References Cited

U.S. PATENT DOCUMENTS 4,201,987 A * 5/1980 Tricoles ................ G01R 29/10
                                                    343/703
6,456,070 B1    9/2002 Kazama et al.
(Continued)

FOREIGN PATENT DOCUMENTS

JP    H01-312472 A    12/1989
JP    H10-62467 A    3/1998
(Continued)

OTHER PUBLICATIONS

Hirakawa, Hiromasa, "New Physics Series 2: Electromagnetism", 1st Edition, 16th Printing, Baifukan Co., Ltd., Japan, pp. 47-48, Dec. 10, 1983.

(Continued)

Primary Examiner — Alesa Allgood
(74) Attorney, Agent, or Firm — Oliff PLC

(57) ABSTRACT

A far electromagnetic field estimation method includes assuming a measurement surface, setting a plurality of measurement points on the measurement surface, and measuring electromagnetic fields at the plurality of measurement points. The measurement surface in combination with a ground plane forms a closed surface surrounding a radiation source. A virtual observation point is outside a space formed inside the closed surface. Further, electromagnetic fields at a plurality of mirror image measurement points on a mirror image measurement surface having a plane-symmetrical relationship with the measurement surface are calculated on the basis of the electromagnetic fields at the plurality of measurement points. Then, a far electromagnetic field at the virtual observation point is estimated on the basis of the electromagnetic fields at the plurality of measurement points and at the plurality of mirror image measurement points.

15 Claims, 30 Drawing Sheets

(56) References Cited

U.S. PATENT DOCUMENTS

| | | | |
|---|---|---|---|
| 8,188,928 B2 * | 5/2012 | Lin | H01Q 9/0407 343/700 MS |
| 2003/0006786 A1 | 1/2003 | Kazama et al. | |
| 2003/0226892 A1 | 12/2003 | Arimura | |
| 2006/0033510 A1 | 2/2006 | Kazama et al. | |
| 2006/0220635 A1 | 10/2006 | Kazama et al. | |
| 2013/0249762 A1 * | 9/2013 | Grelier | H01Q 9/27 343/834 |

FOREIGN PATENT DOCUMENTS

| JP | A-2000-206163 | 7/2000 |
|---|---|---|
| JP | 2003-004783 A | 1/2003 |
| JP | 2003-318634 A | 11/2003 |
| JP | A-2004-69372 | 3/2004 |
| JP | A-2006-201007 | 8/2006 |
| JP | 2007-081647 A | 3/2007 |

OTHER PUBLICATIONS

Jun. 24, 2015 Office Action issued in Japanese Patent Application No. 2013-166651.

Masataka Midori et al., "A Fundamental Study on Estimation of 3 m Test-range from Near-field Electromagnetic Field Measurement," *The Institute of Electronics, Information and Communication Engineers (IEICE) Technical Report*, EMCJ2013-11 2013, pp. 7-12 (with abstract).

* cited by examiner

FAR ELECTROMAGNETIC FIELD ESTIMATION METHOD AND APPARATUS, AND NEAR ELECTROMAGNETIC FIELD MEASUREMENT APPARATUS

BACKGROUND OF THE INVENTION

1. Field of the Invention

The present invention relates to a far electromagnetic field estimation method and apparatus for measuring an electromagnetic field generated by a radiation source of electromagnetic waves, such as an electronic apparatus, near the radiation source and estimating, on the basis of the measured electromagnetic field, an electromagnetic field at a virtual observation point located farther from the radiation source, and to a near electromagnetic field measurement apparatus suited for implementing the far electromagnetic field estimation method.

2. Description of the Related Art

A test for measuring radiated emissions radiated from an electronic apparatus or the like is typically performed according to an internationally-defined test condition and test method, mostly by measuring the radiated emissions at a distance of 10 m or 3 m from the radiation source of the radiated emissions. A test for measuring radiated emissions in the frequency band of 30 MHz to 1 GHz is typically performed with an object to be measured, or the radiation source, arranged on or above a ground plane (metal floor surface).

In general, a test for measuring radiated emissions is performed in an open site or in a radio anechoic chamber that satisfies internationally-defined site compatibility. A radio anechoic chamber is constructed by attaching a radio wave absorber to the wall surfaces of a shield room. Depending on factors such as the intended use of the radio anechoic chamber and the frequency of electromagnetic waves in use, the size and shape of the shield room and the type of the radio wave absorber are selected. Typical radio anechoic chambers include a 10-m test range radio anechoic chamber and a 3-m test range radio anechoic chamber. A 10-m test range radio anechoic chamber has a length of approximately 20 m to 30 m, a width of approximately 10 m to 20 m, and a height of approximately 7 m to 12 m. A 3-m test range radio anechoic chamber has a length of approximately 7 m to 11 m, a width of approximately 4 m to 7 m, and a height of approximately 5 m to 7 m. Such radio anechoic chambers are used as appropriate according to the distance required for the test for measuring radiated emissions.

Disadvantageously, radio anechoic chambers need a relatively large length, width and height as described above, need a large-scale building and facility, and increase the total investment and the maintenance and operation costs for the building, facility, and various necessary equipment.

A small-scale apparatus that can measure radiated emissions in a smaller space is thus demanded. To meet such a demand, there have been proposed an apparatus for measuring a very near electromagnetic field and an apparatus for measuring a quasi-near electromagnetic field intended for a printed circuit board or the like, and a method for estimating a far electromagnetic field from a measured near electromagnetic field by using Love's equivalence theorem or the like.

For example, JP 2004-069372A describes a method including setting a virtual rectangular solid or circular cylinder to surround an object to be measured, measuring an electromagnetic field in such a manner as to scan the surfaces of the rectangular solid or circular cylinder and, on the basis of the measured electromagnetic field, estimating an electromagnetic field in a position distant from the object. JP 2004-069372A further describes that only five of the six faces of the virtual rectangular solid may be scanned with the remaining one as a ground plane.

Masataka MIDORI et. al, "A Fundamental Study on Estimation of 3 m Test-range from Near-field Electromagnetic Field Measurement," The Institute of Electronics, Information and Communication Engineers (IEICE) technical report, EMCJ2013-11 (2013-05) describes a method including selecting a dipole antenna as the object to be measured (radiation source), and determining a far electromagnetic field at an observation point in the following manner under the condition that the dipole antenna is arranged on a ground plane. According to the method, the amplitudes and phases of tangential components of a near electromagnetic field on six planes set to surround the object to be measured are initially measured. Next, assuming that the ground plane is an infinite conductor flat plate, a mirror image of the observation point formed by the conductor flat plate is assumed as a mirror image observation point. Electromagnetic fields at the two points, the observation point and the mirror image observation point, are then estimated. The two estimated electromagnetic fields are then vectorially added to determine the far electromagnetic field at the observation point.

According to the method described in JP 2004-069372A, the virtual rectangular solid or circular cylinder is set to surround the object to be measured without considering a ground plane. Then, the surfaces of the rectangular solid or circular cylinder are scanned, or five of the six faces of the virtual rectangular solid are scanned with the remaining one assumed as a ground plane. Thus, the method does not take account of the effect of a ground plane. If such a method is applied to a test performed under the foregoing condition that the object to be measured is arranged on a ground plane, it can be easily imagined that the estimated electromagnetic field differs greatly from the actually measured electromagnetic field due to the effect of the ground plane.

According to the method described in the literature of MIDORI et. al, it is necessary to measure the near electromagnetic field at the surface under the object to be measured. In actuality, however, it is difficult to float the object to be measured in the air, and therefore the near electromagnetic field at the surface under the object to be measured is difficult to measure. Such a method is thus difficult to apply to a test for measuring radiated emissions. In addition, the method needs calculation processing for estimating the electromagnetic fields at the two points, the observation point and the mirror image observation point, and calculation processing for vectorially adding the electromagnetic fields estimated at the two points. This causes the problem that a lot of calculation processing time is needed.

OBJECT AND SUMMARY OF THE INVENTION

It is a first object of the present invention to provide a far electromagnetic field estimation method and apparatus that can easily and accurately estimate an electromagnetic field at a virtual observation point distant from a radiation source of an electromagnetic wave on the basis of an electromagnetic field measured near the radiation source under the condition that there is a ground plane.

It is a second object of the present invention to provide a near electromagnetic field measurement apparatus suited for implementing the far electromagnetic field estimation method of the present invention.

A far electromagnetic field estimation method of the present invention is a method for determining at least either one of an electric field and a magnetic field that are estimated to be formed by a radiation source of an electromagnetic wave at a virtual observation point distant from the radiation source, the radiation source being located in either one of two spaces sectioned by a ground plane.

The far electromagnetic field estimation method of the present invention includes: a first step of assuming a measurement surface and setting a plurality of measurement points on the measurement surface, the measurement surface forming a closed surface in combination with the ground plane, the closed surface surrounding the radiation source, the virtual observation point being outside a space formed inside the closed surface; a second step of measuring either a plurality of measurement-point electric fields or a plurality of measurement-point magnetic fields, or both, the plurality of measurement-point electric fields being components of electric fields in tangential directions of the measurement surface at the plurality of measurement points, the plurality of measurement-point magnetic fields being components of magnetic fields in the tangential directions of the measurement surface at the plurality of measurement points; a third step of setting a plurality of mirror image measurement points which have a plane-symmetrical positional relationship with the plurality of measurement points about the ground plane on a mirror image measurement surface which has a plane-symmetrical positional relationship with the measurement surface about the ground plane, and calculating either a plurality of mirror image measurement-point electric fields or a plurality of mirror image measurement-point magnetic fields, or both, on the basis of either the plurality of measurement-point electric fields or the plurality of measurement-point magnetic fields, or both, measured in the second step, the plurality of mirror image measurement-point electric fields being components of electric fields in tangential directions of the mirror image measurement surface at the plurality of mirror image measurement points, the plurality of mirror image measurement-point magnetic fields being components of magnetic fields in the tangential directions of the mirror image measurement surface at the plurality of mirror image measurement points; and a fourth step of calculating at least either one of the electric field and the magnetic field that are estimated to be formed at the virtual observation point, on the basis of either the plurality of measurement-point electric fields or the plurality of measurement-point magnetic fields, or both, measured in the second step, and either the plurality of mirror image measurement-point electric fields or the plurality of mirror image measurement-point magnetic fields, or both, calculated in the third step.

A far electromagnetic field estimation apparatus of the present invention is an apparatus for determining at least either one of an electric field and a magnetic field that are estimated to be formed by a radiation source of an electromagnetic wave at a virtual observation point distant from the radiation source, the radiation source being located in either one of two spaces sectioned by a ground plane. The far electromagnetic field estimation apparatus includes a near electromagnetic field measurement apparatus and an arithmetic processing unit.

The near electromagnetic field measurement apparatus includes a probe to detect at least either one of an electric field and a magnetic field, a position control mechanism capable of changing the relative position of the probe with respect to the radiation source, and a control unit to control measurement of the at least either one of the electric field and the magnetic field, the measurement being performed using the probe and the position control mechanism.

The control unit performs: a first operation of assuming a measurement surface and setting a plurality of measurement points on the measurement surface, the measurement surface forming a closed surface in combination with the ground plane, the closed surface surrounding the radiation source, the virtual observation point being outside a space formed inside the closed surface; and a second operation of measuring either a plurality of measurement-point electric fields or a plurality of measurement-point magnetic fields, or both, by using the probe while controlling the position control mechanism, the plurality of measurement-point electric fields being components of electric fields in tangential directions of the measurement surface at the plurality of measurement points, the plurality of measurement-point magnetic fields being components of magnetic fields in the tangential directions of the measurement surface at the plurality of measurement points.

The arithmetic processing unit performs: first arithmetic processing for setting a plurality of mirror image measurement points which have a plane-symmetrical positional relationship with the plurality of measurement points about the ground plane on a mirror image measurement surface which has a plane-symmetrical positional relationship with the measurement surface about the ground plane, and calculating either a plurality of mirror image measurement-point electric fields or a plurality of mirror image measurement-point magnetic fields, or both, on the basis of either the plurality of measurement-point electric fields or the plurality of measurement-point magnetic fields, or both, measured by the second operation, the plurality of mirror image measurement-point electric fields being components of electric fields in tangential directions of the mirror image measurement surface at the plurality of mirror image measurement points, the plurality of mirror image measurement-point magnetic fields being components of magnetic fields in the tangential directions of the mirror image measurement surface at the plurality of mirror image measurement points; and second arithmetic processing for calculating at least either one of the electric field and the magnetic field that are estimated to be formed at the virtual observation point, on the basis of either the plurality of measurement-point electric fields or the plurality of measurement-point magnetic fields, or both, measured by the second operation, and either the plurality of mirror image measurement-point electric fields or the plurality of mirror image measurement-point magnetic fields, or both, calculated by the first arithmetic processing.

In the far electromagnetic field estimation method and apparatus of the present invention, the plurality of measurement points may be arranged to be aligned in two intersecting directions. In such a case, the distance between two adjacent measurement points in each of the two intersecting directions on the measurement surface may be smaller than or equal to ½ of the wavelength of the electromagnetic wave.

In the far electromagnetic field estimation method and apparatus of the present invention, the plurality of measurement-point electric fields, the plurality of measurement-point magnetic fields, the plurality of mirror image measurement-point electric fields, and the plurality of mirror image measurement-point magnetic fields may each include a horizontal component parallel to the ground plane and a vertical component perpendicular to the ground plane. In such a case, the horizontal components of the plurality of mirror image measurement-point electric fields are equal in amplitude but opposite in phase to the horizontal components of respective corresponding ones of the plurality of measurement-point electric fields. The vertical components of the plurality of mirror image measurement-point electric fields are equal in amplitude and phase to the vertical components of the respective corresponding ones of the plurality of measurement-point electric fields. The horizontal components of the plurality of mirror image measurement-point magnetic fields are equal in amplitude and phase to the horizontal components of respective corresponding ones of the plurality of measurement-point magnetic fields. The vertical components of the plurality of mirror image measurement-point magnetic fields are equal in amplitude but opposite in phase to the vertical components of the respective corresponding ones of the plurality of measurement-point magnetic fields.

In the far electromagnetic field estimation method of the present invention, the radiation source may be located in a radio anechoic chamber that has a metal floor surface constituting the ground plane. In the far electromagnetic field estimation apparatus of the present invention, the radiation source, the probe and the position control mechanism may be located in a radio anechoic chamber that has a metal floor surface constituting the ground plane.

In the far electromagnetic field estimation apparatus of the present invention, the probe may include an electric field detection unit configured to output a signal responsive to the electric field, and a magnetic field detection unit configured to output a signal responsive to the magnetic field. The electric field detection unit may include an electric field antenna unit configured to generate a differential signal responsive to the electric field, two electric field output ports configured to output the differential signal generated by the electric field antenna unit, and an electric field shielding unit for shielding a part of the electric field antenna unit. The magnetic field detection unit may include a magnetic field antenna unit configured to generate a differential signal responsive to the magnetic field, two magnetic field output ports configured to output the differential signal generated by the magnetic field antenna unit, and a magnetic field shielding unit for shielding a part of the magnetic field antenna unit.

The second operation may measure only either the plurality of measurement-point electric fields or the plurality of measurement-point magnetic fields, not both. The arithmetic processing unit may then calculate the plurality of measurement-point electric fields or magnetic fields that were not measured by the second operation, on the basis of the plurality of measurement-point electric fields or magnetic fields that were measured by the second operation and on the basis of first correction information and second correction information determined in advance. The first correction information is information for correcting an amplitude and a phase of the signal output from the electric field detection unit to values corresponding to an amplitude and a phase of the electric field that the electric field detection unit actually undergoes. The second correction information is information for correcting an amplitude and a phase of the signal output from the magnetic field detection unit to values corresponding to an amplitude and a phase of the magnetic field that the magnetic field detection unit actually undergoes. In such a case, the first arithmetic processing may calculate the plurality of mirror image measurement-point electric fields and the plurality of mirror image measurement-point magnetic fields on the basis of the plurality of measurement-point electric fields and the plurality of measurement-point magnetic fields. The second arithmetic processing may calculate at least either one of the electric field and the magnetic field that are estimated to be formed at the virtual observation point on the basis of the plurality of measurement-point electric fields, the plurality of measurement-point magnetic fields, the plurality of mirror image measurement-point electric fields, and the plurality of mirror image measurement-point magnetic fields.

A near electromagnetic field measurement apparatus of the present invention is an apparatus for measuring either a plurality of measurement-point electric fields or a plurality of measurement-point magnetic fields, or both. The plurality of measurement-point electric fields are components of electric fields in tangential directions of a measurement surface at a plurality of measurement points on the measurement surface. The plurality of measurement-point magnetic fields are components of magnetic fields in the tangential directions of the measurement surface at the plurality of measurement points. The measurement surface is assumed to surround a radiation source of an electromagnetic wave that is located in either one of two spaces sectioned by a ground plane.

The near electromagnetic field measurement apparatus of the present invention includes a probe to detect at least either one of an electric field and a magnetic field, a position control mechanism capable of changing the relative position of the probe with respect to the radiation source, and a control unit to control measurement of the at least either one of the electric field and the magnetic field, the measurement being performed using the probe and the position control mechanism.

The control unit performs: a first operation of assuming the measurement surface to form, in combination with the ground plane, a closed surface that surrounds the radiation source, and setting the plurality of measurement points on the measurement surface; and a second operation of measuring either the plurality of measurement-point electric fields or the plurality of measurement-point magnetic fields, or both, by using the probe while controlling the position control mechanism.

In the near electromagnetic field measurement apparatus of the present invention, the plurality of measurement points may be arranged to be aligned in two intersecting directions. In such a case, the distance between two adjacent measurement points in each of the two intersecting directions on the measurement surface may be smaller than or equal to ½ of the wavelength of the electromagnetic wave.

In the near electromagnetic field measurement apparatus of the present invention, the radiation source, the probe and the position control mechanism may be located in a radio anechoic chamber that has a metal floor surface constituting the ground plane.

In the near electromagnetic field measurement apparatus of the present invention, the probe may include an electric field detection unit configured to output a signal responsive to the electric field, and a magnetic field detection unit configured to output a signal responsive to the magnetic field. The electric field detection unit may include an electric field antenna unit configured to generate a differential signal responsive to the electric field, two electric field output ports configured to output the differential signal generated by the electric field antenna unit, and an electric field shielding unit for shielding a part of the electric field antenna unit. The magnetic field detection unit may include a magnetic field antenna unit configured to generate a differential signal responsive to the magnetic field, two magnetic field output ports configured to output the differential signal generated by the magnetic field antenna unit, and a magnetic field shielding unit for shielding a part of the magnetic field antenna unit.

According to the far electromagnetic field estimation method and apparatus of the present invention, a plurality of measurement points are set on a measurement surface, and either a plurality of measurement-point electric fields or a plurality of measurement-point magnetic fields, or both, are measured. In addition, a plurality of mirror image measurement points are set on a mirror image measurement surface, and either a plurality of mirror image measurement-point electric fields or a plurality of mirror image measurement-point magnetic fields, or both, are calculated on the basis of the plurality of measurement-point electric fields and/or the plurality of measurement-point magnetic fields measured. At least either one of an electric field and a magnetic field that are estimated to be formed at the virtual observation point is then calculated on the basis of the plurality of measurement-point electric fields and/or the plurality of measurement-point magnetic fields measured and the plurality of mirror image measurement-point electric fields and/or the plurality of mirror image measurement-point magnetic fields calculated. The present invention thereby makes it possible that an electromagnetic field at a virtual observation point distant from a radiation source of electromagnetic waves can be easily and accurately estimated on the basis of an electromagnetic field measured near the radiation source under the condition that there is a ground plane.

Further, the near electromagnetic field measurement apparatus of the present invention makes it possible to measure either the plurality of measurement-point electric fields or the plurality of measurement-point magnetic fields, or both, which are needed to implement the far electromagnetic field estimation method of the present invention.

Other and further objects, features and advantages of the invention will appear more fully from the following description.

DETAILED DESCRIPTION OF THE PREFERRED EMBODIMENTS

First Embodiment

Preferred embodiments of the present invention will now be described in detail with reference to the drawings. First, reference is made to FIG. 1 to describe an overview of a far electromagnetic field estimation method according to a first embodiment of the invention.

Figure 1:
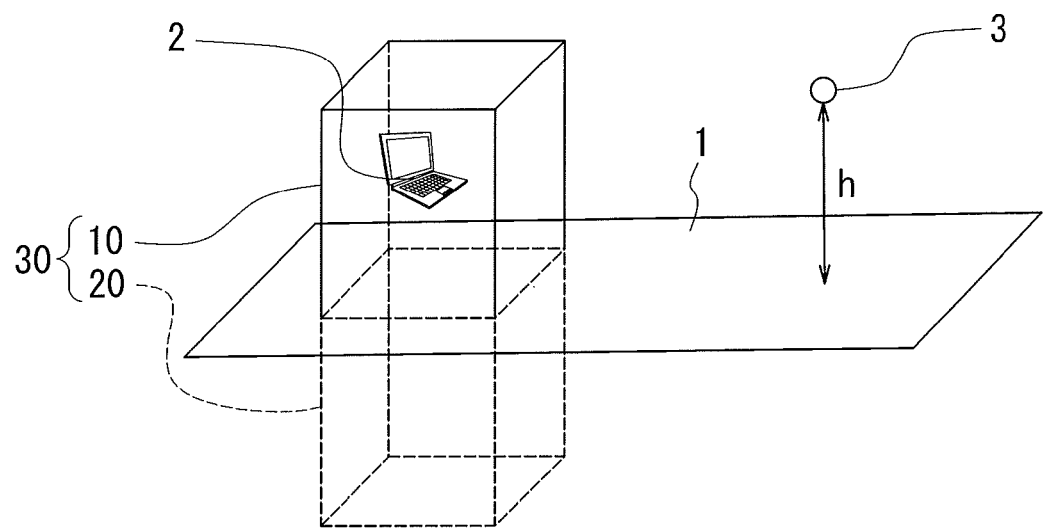
FIG. 1 is an explanatory diagram for explaining an overview of a far electromagnetic field estimation method according to a first embodiment of the invention.

As shown in FIG. 1, the far electromagnetic field estimation method according to the first embodiment is a method for determining at least either one of an electric field and a magnetic field that are estimated to be formed at a virtual observation point 3 distant from a radiation source 2 of electromagnetic waves under the condition that the radiation source 2 is located in either one of two spaces sectioned by a ground plane 1. The far electromagnetic field estimation method according to the first embodiment is used, for example, for a test for measuring radiated emissions radiated from the radiation source 2 according to the EMC standards.

The ground plane 1 is an isopotential plane. For example, the ground plane 1 is implemented by a metal floor surface. If the ground plane 1 is horizontally situated as shown in FIG. 1, the two spaces sectioned by the ground plane 1 refer to the spaces above and below the ground plane 1. In FIG. 1, the radiation source 2 is located in the space above the ground plane 1. An example of the radiation source 2 is an electronic apparatus that generates electromagnetic waves. An example of such a situation is where the radiation source 2 is located in a radio anechoic chamber that has a metal floor surface constituting the ground plane 1. In FIG. 1, the height of the observation point 3 with respect to the ground plane 1 is denoted by the symbol h.

The far electromagnetic field estimation method according to the first embodiment includes a first, a second, a third and a fourth step described below. The first step assumes a measurement surface 10 and sets a plurality of measurement points on the measurement surface 10. The measurement surface 10 forms a closed surface in combination with the ground plane 1. The closed surface surrounds the radiation source 2. The virtual observation point 3 is outside a space that is formed inside the closed surface. The plurality of measurement points are positions at which the electromagnetic field near the radiation source 2 is to be measured. In FIG. 1, the plurality of measurement points are not shown. The plurality of measurement points will be described in detail later.

In the first embodiment, the measurement surface 10 has a shape formed by five of the six faces of a rectangular solid with the remaining one excluded. The measurement surface 10 is arranged in such an orientation that the opening present in the position of the one face excluded from the six faces of the rectangular solid is closed by the ground plane 1. The measurement surface 10 in combination with the ground plane 1 thus forms the six faces of the rectangular solid, i.e., a closed surface. In the present invention, the shape of the measurement surface 10 is not limited to that shown in FIG. 1. Other examples of the shape of the measurement surface 10 will be described in other embodiments.

The second step measures either a plurality of measurement-point electric fields or a plurality of measurement-point magnetic fields, or both. The plurality of measurement-point electric fields are components of electric fields in tangential directions of the measurement surface 10 at the plurality of measurement points. The plurality of measurement-point magnetic fields are components of magnetic fields in the tangential directions of the measurement surface 10 at the plurality of measurement points.

The third step sets a plurality of mirror image measurement points on a mirror image measurement surface 20. The plurality of mirror image measurement points have a plane-symmetrical positional relationship with the plurality of measurement points about the ground plane 1. The mirror image measurement surface 20 has a plane-symmetrical positional relationship with the measurement surface 10 about the ground plane 1. In the example shown in FIG. 1, the mirror image measurement surface 20 has a shape formed by five of the six faces of a rectangular solid with the remaining one excluded, like the measurement surface 10. The mirror image measurement surface 20 is arranged on a side opposite from the measurement surface 10 with respect to the ground plane 1 in such an orientation that the opening is closed by the ground plane 1. Consequently, the measurement surface 10 and the mirror image measurement surface 20, in combination, form a closed surface 30 constituted by the six faces of a rectangular solid. In FIG. 1, the plurality of mirror image measurement points are not shown. The plurality of mirror image measurement points will be described in detail later.

The third step further calculates either a plurality of mirror image measurement-point electric fields or a plurality of mirror image measurement-point magnetic fields, or both, on the basis of either the plurality of measurement-point electric fields or the plurality of measurement-point magnetic fields, or both, measured by the second step. The plurality of mirror image measurement-point electric fields are components of electric fields in tangential directions of the mirror image measurement surface at the plurality of mirror image measurement points. The plurality of mirror image measurement-point magnetic fields are components of magnetic fields in the tangential directions of the mirror image measurement surface at the plurality of mirror image measurement points.

The fourth step calculates at least either one of the electric field and the magnetic field that are estimated to be formed at the virtual observation point 3 on the basis of either the plurality of measurement-point electric fields or the plurality of measurement-point magnetic fields, or both, measured by the second step, and either the plurality of mirror image measurement-point electric fields or the plurality of mirror image measurement-point magnetic fields, or both, calculated by the third step. Hereinafter, at least either one of the electric field and the magnetic field that are estimated to be formed at the virtual measurement point 3 will sometimes be referred to as the far electromagnetic field at the virtual measurement point 3.

Figure 2A:
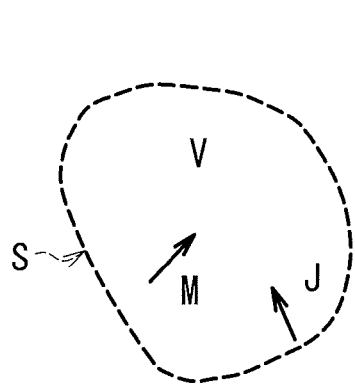
FIG. 2A and FIG. 2B are explanatory diagrams for explaining Love's equivalence theorem.

In the fourth step, the far electromagnetic field is calculated by using Love's equivalence theorem, for example. Love's equivalence theorem will be described with reference to FIG. 2A and FIG. 2B. Initially, as shown in FIG. 2A, suppose that a region V including a radiation source lies inside a closed surface S. An electric current J and a magnetic current M caused by the radiation source shall exist in the region V, producing an electric field E and a magnetic field H on the surface S. J, M, E, and H are all vectors including a time factor.

Figure 2B:
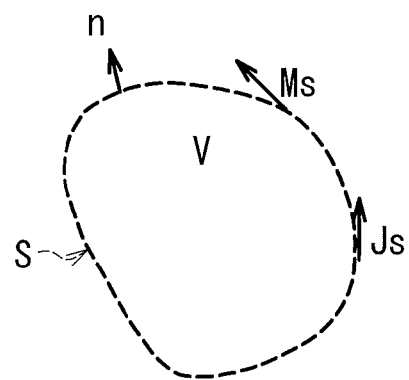

As shown in FIG. 2B, remove the radiation source from inside the region V, and assume an equivalent surface electric current Js and an equivalent surface magnetic current Ms on the surface S that produce the electric field E and the magnetic field H on the surface S, instead of the electric current J and the magnetic current M inside the region V. Js and Ms are both vectors including a time factor. Js and Ms are expressed by the following Equations (1) and (2) using E and H. Here, n is a unit normal vector of the surface S.

$$Js = n \times H \quad (1)$$

$$Ms = -n \times E \quad (2)$$

When the surface electric current Js and the surface magnetic current Ms are distributed over the surface S, an electric field E(r) and a magnetic field H(r) at an observation point located at a distance r from the radiation source are given by the following Equations (3) and (4), respectively.

$$E(r) = \int_S [-j\eta k \{Js G + (1/l^2) \cdot Js \cdot \nabla \nabla G\} - Ms \times \nabla G] dS \quad (3)$$

$$H(r) = \int_S [-j \cdot (1/\eta) \cdot k \{Ms G + (1/k^2) \cdot Ms \cdot \nabla \nabla G\} + Js \times \nabla G] dS \quad (4)$$

In Equations (3) and (4), ∫s represents a surface integral over the surface S. G, ∇G, Js·∇∇G, and Ms·∇∇G in Equations (3) and (4) are given as follows. Here, η is the intrinsic impedance, G is the Green's function of the free space, k is $2\pi/\lambda$, λ is the wavelength of the electromagnetic waves, dS is a small area of the surface S, and $r_V$ is a unit directional vector toward the observation point.

$$G = \exp(-jkr)/4\pi r$$

$$\nabla G = \{-(1 + jkr)/r\} G r_V$$

$$\nabla(G/r) = \{-(2 + jkr)/r^2\} G r_V$$

$$Js \cdot \nabla \nabla G = (Js \cdot r_V)\{-\nabla(G/r) - jk \nabla G\}$$
$$= (Js \cdot r_V)\{-k^2 - 2k^2/jkr - 2k^2/(jkr)^2\} G r_V$$

$$Ms \cdot \nabla \nabla G = (Ms \cdot r_V)\{-\nabla(G/r) - jk \nabla G\}$$
$$= (Ms \cdot r_V)\{-k^2 - 2k^2/jkr - 2k^2/(jkr)^2\} G r_V$$

Equations (3) and (4) mean the following. Suppose that a correct distribution of components of the electromagnetic field on the surface S in the tangential directions of the surface S is known. In such a case, the electromagnetic field at an observation point in any arbitrary position can be determined on the basis of the uniqueness of solution of the electromagnetic field by using the distribution as a wave source. The equivalent surface electric current Js and surface magnetic current Ms on the surface S can be expressed by the Fourier transform. To accurately determine the electromagnetic field at an observation point in any arbitrary position, the interval of positions where to measure the components of the electromagnetic field on the surface S in the tangential directions of the surfaces S needs to be λ/2 or less on the basis of the sampling theorem, a characteristic of the Fourier transform.

In the first embodiment, the closed surface 30 formed by combining the measurement surface 10 and the mirror image measurement surface 20 corresponds to the closed surface S described above. The plurality of measurement-point electric fields, the plurality of measurement-point magnetic fields, the plurality of mirror image measurement-point electric fields, and the plurality of mirror image measurement-point magnetic fields correspond to the components of the electromagnetic field on the surface S in the tangential directions of the surface S.

To calculate the far electromagnetic field at the virtual observation point 3 by using Love's equivalence theorem, the fourth step uses Equations (1) and (2) to determine the distributions of the surface electric current Js and the surface magnetic current Ms on the surface 30 on the basis of the plurality of measurement-point electric fields, the plurality of measurement-point magnetic fields, the plurality of mirror image measurement-point electric fields, and the plurality of mirror image measurement-point magnetic fields. The fourth step further uses Equations (3) and (4) to calculate the far electromagnetic field at the virtual observation point 3 from the distributions of the surface electric current Js and the surface magnetic current Ms on the surface 30.

Figure 3:
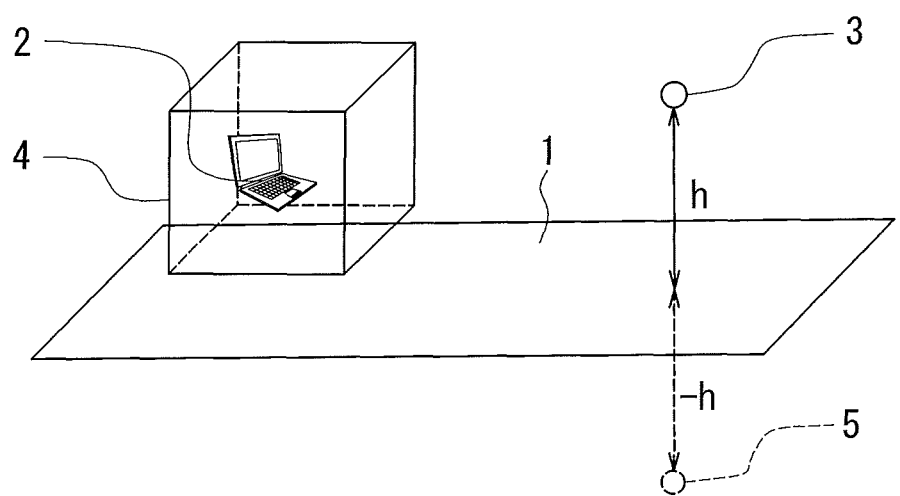
FIG. 3 is an explanatory diagram for explaining a far electromagnetic field estimation method of a comparative example.

The advantage of the far electromagnetic field estimation method according to the first embodiment will now be described in comparison with a far electromagnetic field estimation method of a comparative example. First, the far electromagnetic field estimation method of the comparison example will be described with reference to FIG. 3. The far electromagnetic field estimation method of this comparative example is the method discussed in the literature of MIDORI et al. According to the far electromagnetic field estimation method of the comparative example, as shown in FIG. 3, a measurement surface 4 is initially assumed to surround a radiation source 2 located in a space above a ground plane 1. The measurement surface 4 is constituted by the six faces of a rectangular solid, for example. Next, the amplitudes and phases of tangential components of a near electromagnetic field on the measurement surface 4 are measured. Next, a mirror image of a measurement point 3 formed by the ground plane 1 is assumed as a mirror image observation point 5. As shown in FIG. 3, if the measurement point 3 is positioned at a height h with respect to the ground plane 1, the mirror image observation point 5 is positioned at a height -h on the side opposite from the observation point 3 with respect to the ground plane 1. Next, the electromagnetic fields at the two points, i.e., the observation point 3 and the mirror image observation point 5, are estimated. The two estimated electromagnetic fields are then vectorially added to determine the far electromagnetic field at the observation point 3.

According to the far electromagnetic field estimation method of the comparative example, it is necessary to measure the near electromagnetic field even on the face lying under the radiation source 2 (between the radiation source 2 and the ground plane 1) among the six faces constituting the measurement surface 4. In actuality, however, it is difficult to float the object to be measured serving as the radiation source 2 in the air. The near electromagnetic field on the face lying under the radiation source 2 is therefore difficult to measure. Such a method is thus difficult to apply to a test for measuring radiated emissions. In addition, this method needs the arithmetic processing for estimating the electromagnetic fields at the two points, the observation point 3 and the mirror image observation point 5, and the arithmetic processing for vectorially adding the electromagnetic fields estimated at the two points. This causes the problem that a lot of arithmetic processing time is needed.

In contrast, the far electromagnetic field estimation method according to the first embodiment does not need to measure the electromagnetic field on the face lying under the radiation source 2 (between the radiation source 2 and the ground plane 1). The first embodiment thus allows for easy measurement of the electromagnetic field near the radiation source 2 needed to estimate the far electromagnetic field at the observation point 3.

The first embodiment does not need the processing for measuring the electromagnetic field on the face lying under the radiation source 2, calculating the surface electric current Js and the surface magnetic current Ms on that face, and calculating the electromagnetic fields at the observation point 3 and the mirror image observation point 5 by using the surface electric current Js and the surface magnetic current Ms on the face. The first embodiment does not need the arithmetic processing for estimating the electromagnetic fields at the two points, the observation point 3 and the mirror image observation point 5, and vectorially adding the electromagnetic fields estimated at the two points, either. It suffices that the far electromagnetic field is estimated only at the observation point 3. Consequently, the first embodiment allows for reduction in the time for the measurement and the arithmetic processing when compared with the comparative example.

The first embodiment uses either the plurality of mirror image measurement-point electric fields or the plurality of mirror image measurement-point magnetic fields, or both, when estimating the far electromagnetic field at the observation point 3. The effect of the ground plane 1 is thus taken into account.

Consequently, the first embodiment makes it possible that the electromagnetic field at the virtual observation point 3 distant from the radiation source 2 can be easily and accurately estimated on the basis of the electromagnetic field measured near the radiation source 2 under the condition that there is the ground plane 1.

Figure 4:
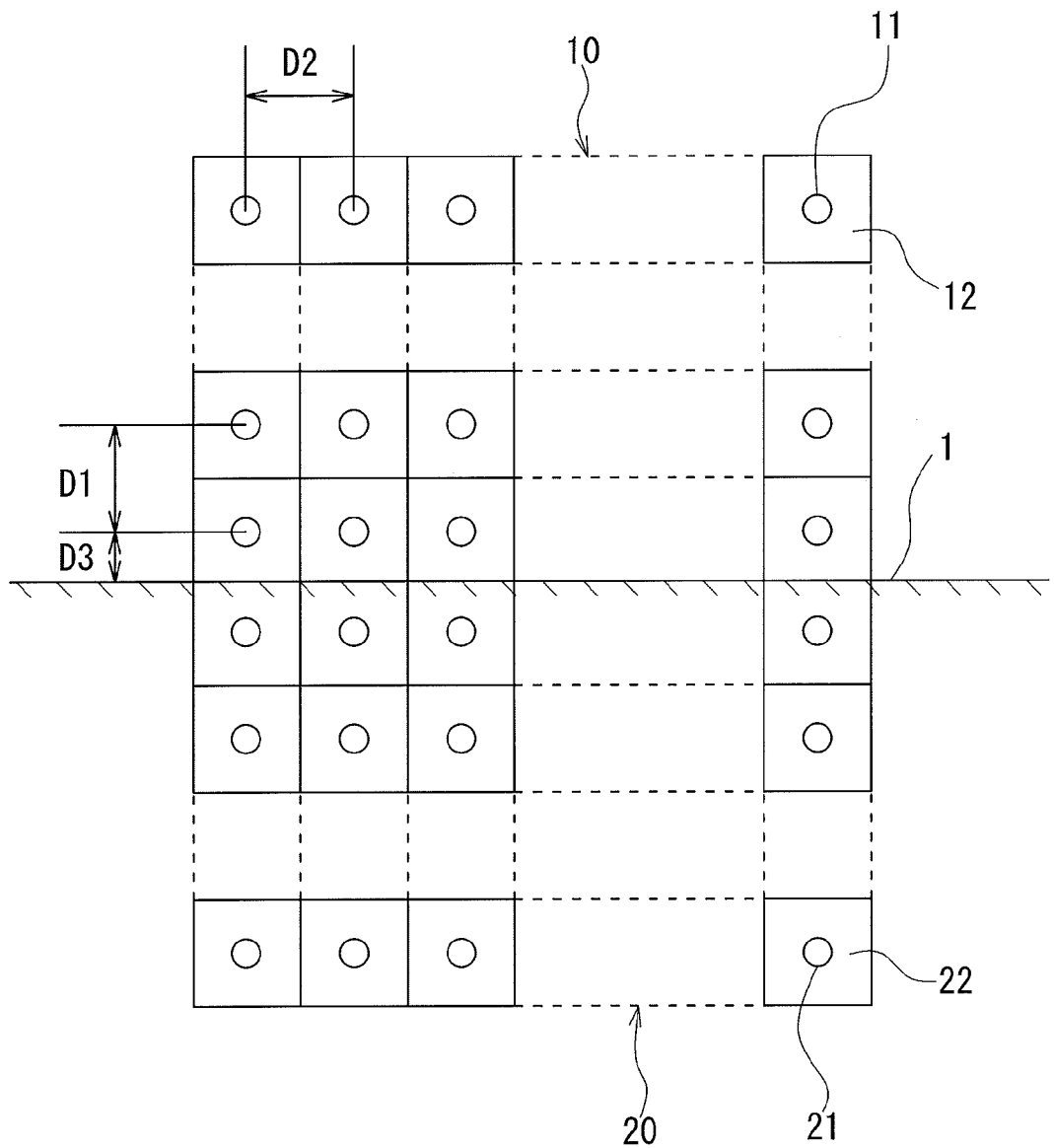
FIG. 4 is an explanatory diagram illustrating a plurality of measurement points and a plurality of mirror image measurement points for the far electromagnetic field estimation method according to the first embodiment of the invention.

The plurality of measurement points and the plurality of mirror image measurement points in the first embodiment will now be described with reference to FIG. 4. In the first embodiment, as shown in FIG. 4, the plurality of measurement points 11 are arranged to be aligned in two intersecting directions on the measurement surface 10. More specifically, in the first embodiment, each of the five faces constituting the measurement surface 10 is divided into a plurality of regions 12 in a grid-like configuration. Each of the plurality of measurement points 11 is placed at a predetermined position on the border of or within a corresponding one of the plurality of regions 12. The predetermined position may be the center of each region 12 or any one of the four corners of the border of each region 12. The area of a single region 12 corresponds to dS in Equations (3) and (4).

In each of the five faces constituting the measurement surface 10, ones of the plurality of measurement points 11 that are adjacent to the boundaries (ridges) with other ones of the five faces are preferably positioned extremely close to the boundaries.

A plurality of mirror image regions 22 and a plurality of mirror image measurement points 21 are set on the mirror image measurement surface 20. The plurality of mirror image regions 22 have a plane-symmetrical positional relationship with the plurality of regions 12 about the ground plane 1. The plurality of mirror image measurement points 21 have a plane-symmetrical positional relationship with the plurality of measurement points 11 about the ground plane 1.

Let D1 be the distance between two adjacent measurement points 11 on the measurement surface 10 in one of the two directions in which the plurality of measurement points 11 are aligned. Let D2 be the distance between two adjacent measurement points 11 on the measurement surface 10 in the other of the two directions in which the plurality of measurement points 11 are aligned. According to the sampling theorem, D1 and D2 are set to values that are greater than 0 and smaller than or equal to ½ of the wavelength of the electromagnetic waves. D1 and D2 are preferably smaller than or equal to ⅙ of the wavelength of the electromagnetic waves.

Let D3 be the distance between the ground plane 1 and each measurement point 11 located in a row of regions 12 adjacent to the ground plane 1. D3 is set to a value that is greater than 0 and smaller than or equal to ¼ of the wavelength of the electromagnetic waves. This is for the purpose of making the distance between a measurement point 11 and a mirror image measurement point 21 that are adjacent to each other with the ground plane 1 therebetween be of a value smaller than or equal to ½ of the wavelength of the electromagnetic waves.

If the electromagnetic waves to be measured have a range of wavelengths, then D1, D2 and D3 can be determined on the basis of the lower-limit wavelength of the electromagnetic waves. For example, if the upper-limit frequency of the electromagnetic waves is 1 GHz, then the lower-limit wavelength of the electromagnetic waves is 30 cm. In such a case, D1 and D2 are set to 15 cm or smaller, preferably 5 cm or smaller, and D3 is set to 7.5 cm or smaller.

The distance between two adjacent mirror image measurement points 21 on the mirror image measurement surface 20 and the distance between the ground plane 1 and each mirror image measurement point 21 located in a row of regions 22 adjacent to the ground plane 1 are as in the case of the measurement points 11.

Figures 5A, 5B:
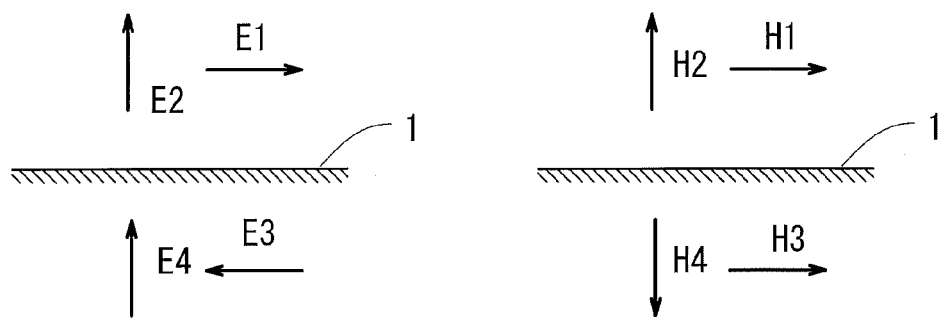
FIG. 5A and FIG. 5B are explanatory diagrams for explaining how to calculate mirror image measurement-point electric fields and mirror image measurement-point magnetic fields in the far electromagnetic field estimation method according to the first embodiment of the invention.

Reference is now made to FIG. 5A and FIG. 5B to describe how to calculate the mirror image measurement-point electric fields and the mirror image measurement-point magnetic fields. First, how to calculate the mirror image measurement-point electric fields will be described with reference to FIG. 5A. Suppose here that the plurality of measurement-point electric fields each include a horizontal component E1 parallel to the ground plane 1 and a vertical component E2 perpendicular to the ground plane 1. In this case, the plurality of mirror image measurement-point electric fields also each include a horizontal component E3 parallel to the ground plane 1 and a vertical component E4 perpendicular to the ground plane 1. The horizontal components E3 and the vertical components E4 of the plurality of mirror image measurement-point electric fields are given to satisfy the boundary condition of the ground plane 1 as follows. The horizontal components E3 of the plurality of mirror image measurement-point electric fields are equal in amplitude but opposite in phase to the horizontal components E1 of respective corresponding ones of the plurality of measurement-point electric fields. The vertical components E4 of the plurality of mirror image measurement-point electric fields are equal in amplitude and phase to the vertical components E2 of the respective corresponding ones of the plurality of measurement-point electric fields. FIG. 5A shows the horizontal component E1 and the vertical component E2 of one measurement-point electric field, and the horizontal component E3 and the vertical component E4 of one mirror image measurement-point electric field corresponding thereto.

Next, how to calculate the mirror image measurement-point magnetic fields will be described with reference to FIG.

5B. Suppose here that the plurality of measurement-point magnetic fields each include a horizontal component H1 parallel to the ground plane 1 and a vertical component H2 perpendicular to the ground plane 1. In this case, the plurality of mirror image measurement-point magnetic fields also each include a horizontal component H3 parallel to the ground plane 1 and a vertical component H4 perpendicular to the ground plane 1. The horizontal components H3 and the vertical components H4 of the plurality of mirror image measurement-point magnetic fields are given to satisfy the boundary condition of the ground plane 1 as follows. The horizontal components H3 of the plurality of mirror image measurement-point magnetic fields are equal in amplitude and phase to the horizontal components H1 of respective corresponding ones of the plurality of measurement-point magnetic fields. The vertical components H4 of the plurality of mirror image measurement-point magnetic fields are equal in amplitude but opposite in phase to the vertical components H2 of the respective corresponding ones of the plurality of measurement-point magnetic fields. FIG. 5B shows the horizontal component H1 and the vertical component H2 of one measurement-point magnetic field, and the horizontal component H3 and the vertical component 114 of one mirror image measurement-point magnetic field corresponding thereto.

[Verification Experiment]

An experiment was performed to verify the validity of the far electromagnetic field estimation method according to the first embodiment. The experiment will now be described with reference to FIG. 6 to FIG. 17 and FIG. 18A to FIG. 25C. The experiment was separately performed for a case where the electromagnetic waves radiated from the radiation source 2 were horizontally polarized ones (hereinafter referred to as the case of horizontally polarized waves) and for a case where the electromagnetic waves radiated from the radiation source 2 were vertically polarized ones (hereinafter referred to as the case of vertically polarized waves).

Figure 6:
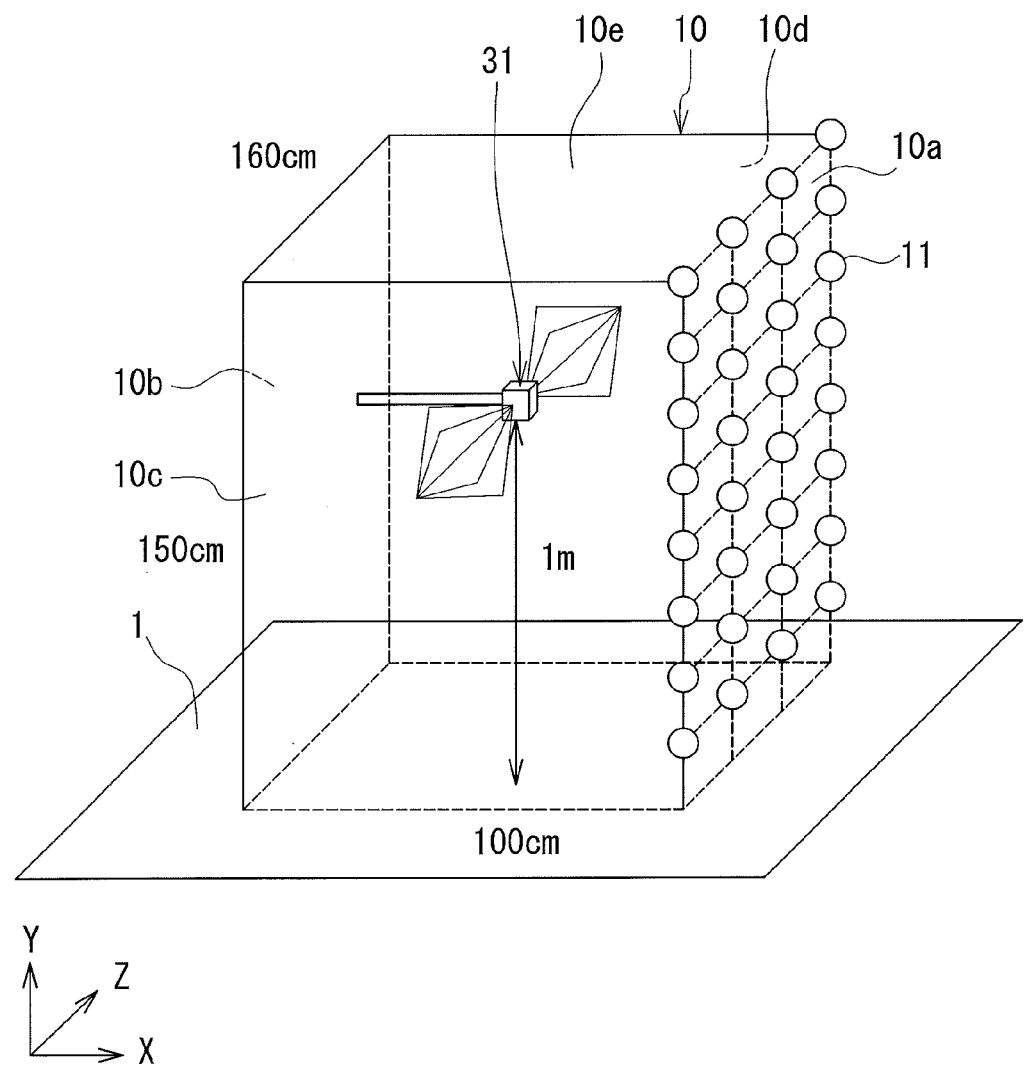
FIG. 6 is an explanatory diagram for explaining a method of an experiment which was performed on the far electromagnetic field estimation method according to the first embodiment of the invention.

FIG. 6 is an explanatory diagram for explaining the experiment method for the case of horizontally polarized waves. In the experiment, a biconical antenna 31 was used as the radiation source 2. For the case of horizontally polarized waves, as shown in FIG. 6, the biconical antenna 31 was positioned at a height of 1 m with respect to the ground plane 1 in such an orientation as to radiate horizontally polarized electromagnetic waves.

Now, two mutually orthogonal directions parallel to the ground plane 1 will be defined as the X direction and the Z direction, and a direction perpendicular to the ground plane 1 as the Y direction. For the case of horizontally polarized waves, the measurement surface 10 was assumed to be constituted by five quadrangular planes 10a, 10b, 10c, 10d and 10e. The five planes correspond to five of the six faces of a rectangular solid. The planes 10a and 10b are perpendicular to the X direction, and each have a side in contact with the ground plane 1. The planes 10c and 10d are perpendicular to the Z direction, and each have a side in contact with the ground plane 1. The plane 10e is perpendicular to the Y direction and opposed to the ground plane 1. The measurement surface 10 and the ground plane 1, in combination, form a rectangular solid having dimensions of 100 cm, 150 cm, and 160 cm in the X, Y, and Z directions, respectively. The planes 10a and 10b are positioned at equal distances from the biconical antenna 31. The planes 10c and 10d are also positioned at equal distances from the biconical antenna 31. A plurality of measurement points 11 are arranged on the measurement surface 10. The distance between two adjacent measurement points 11 in each of the X, Y and Z directions on the measurement surface 10 is 10 cm.

Figure 7:
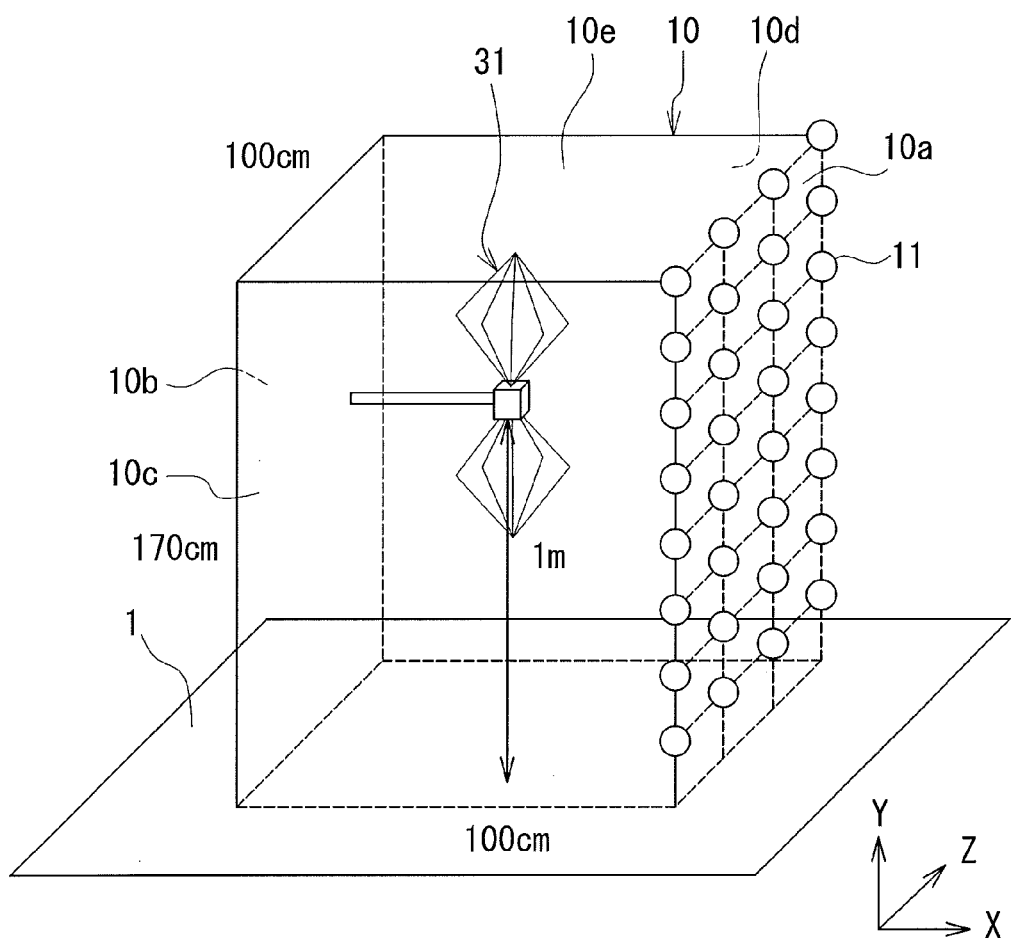
FIG. 7 is an explanatory diagram for explaining the method of the experiment on the far electromagnetic field estimation method according to the first embodiment of the invention.

FIG. 7 is an explanatory diagram for explaining the experiment method for the case of vertically polarized waves. For this case, as shown in FIG. 7, the biconical antenna 31 was positioned at a height of 1 m with respect to the ground plane 1 in such an orientation as to radiate vertically polarized electromagnetic waves. As with the case of horizontally polarized waves, the measurement surface 10 was assumed to be constituted by the five quadrangular planes 10a, 10b, 10c, 10d and 10e. The measurement surface 10 and the ground plane 1, in combination, form a rectangular solid having dimensions of 100 cm, 170 cm, and 100 cm in the X, Y, and Z directions, respectively. The planes 10a and 10b are positioned at equal distances from the biconical antenna 31. The planes 10c and 10d are also positioned at equal distances from the biconical antenna 31. A plurality of measurement points 11 are arranged on the measurement surface 10. The distance between two adjacent measurement points 11 in each of the X, Y and Z directions on the measurement surface 10 is 10 cm.

In the experiment, the measurement-point electric fields and the measurement-point magnetic fields at the plurality of measurement points 11 were measured for both the cases of horizontally polarized waves and vertically polarized waves by using an electromagnetic field probe to be described later. Electromagnetic waves having four different frequencies of 30 MHz, 80 MHz, 100 MHz, and 200 MHz were used. The measurement-point electric fields and the measurement-point magnetic fields for the case of horizontally polarized waves respectively correspond to the horizontal components of the measurement-point electric fields and the horizontal components of the measurement-point magnetic fields which have been described with reference to FIG. 5A and FIG. 5B. The measurement-point electric fields and the measurement-point magnetic fields for the case of vertically polarized waves respectively correspond to the vertical components of the measurement-point electric fields and the vertical components of the measurement-point magnetic fields which have been described with reference to FIG. 5A and FIG. 5B.

Figure 8:
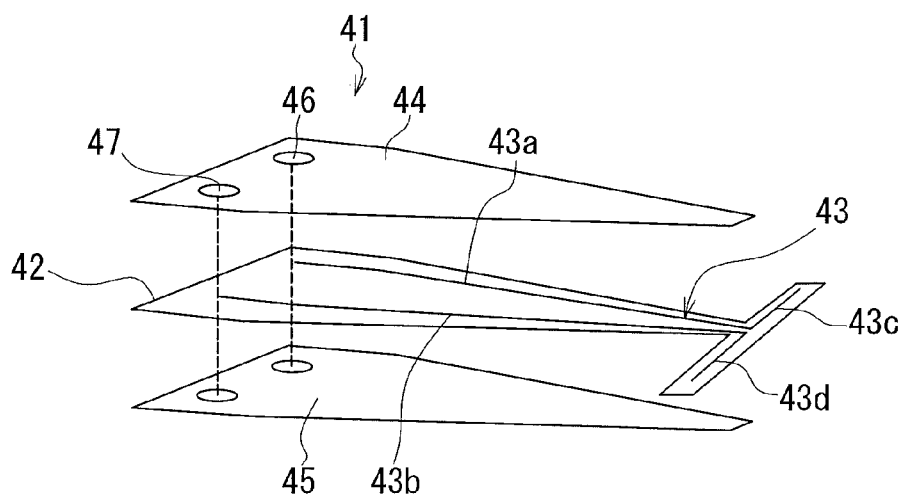
FIG. 8 is an exploded perspective view of an electric field detection unit of an electromagnetic field probe.
Figure 9:
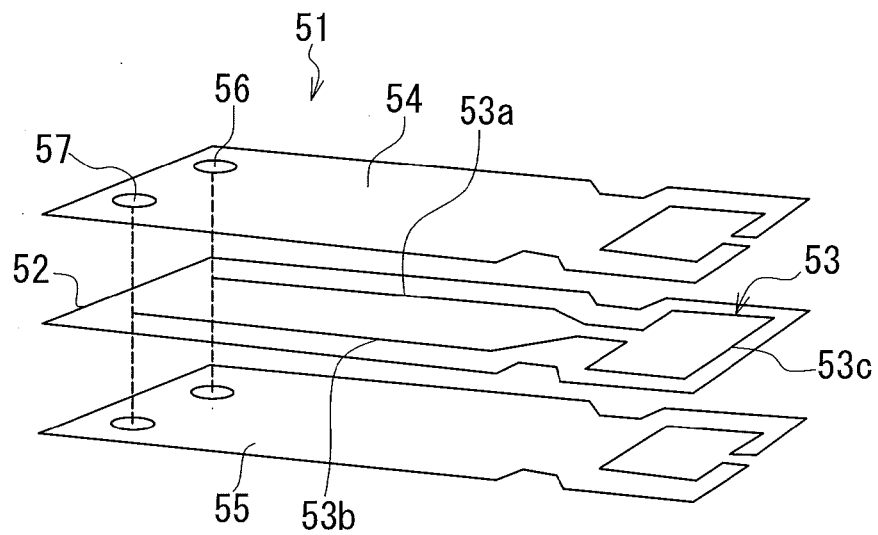
FIG. 9 is an exploded perspective view of a magnetic field detection unit of the electromagnetic field probe.

The electromagnetic field probe will now be described with reference to FIG. 8 and FIG. 9. The electromagnetic field probe used for the experiment was one including an electric field detection unit 41 configured to output a signal responsive to the electric field, and a magnetic field detection unit 51 configured to output a signal responsive to the magnetic field. FIG. 8 is an exploded perspective view of the electric field detection unit 41. FIG. 9 is an exploded perspective view of the magnetic field detection unit 51. The electric field detection unit 41 and the magnetic field detection unit 51 are coupled to each other to form the electromagnetic field probe. The electromagnetic field probe will hereinafter be denoted by the reference numeral 40.

As shown in FIG. 8, the electric field detection unit 41 includes a printed circuit board 42, and shield plates 44 and 45 placed on top and bottom of the printed circuit board 42. The printed circuit board 42 includes an electric field antenna unit 43 formed of a patterned conductor layer. The shield plates 44 and 45 are each formed of a conductor. The electric field antenna unit 43 forms a dipole antenna. The electric field antenna unit 43 includes two cable units 43a and 43b, an element 43c connected to a first end of the cable unit 43a, and an element 43d connected to a first end of the cable unit 43b. The two elements 43c and 43d are each 10 mm long.

The electric field detection unit 41 further includes two electric field output ports 46 and 47 formed of two through holes penetrating the shield plates 44 and 45 and the printed circuit board 42. The electric field output port 46 is connected to a second end of the cable unit 43a. The electric field output port 47 is connected to a second end of the cable unit 43b. The shield plates 44 and 45 are shaped to sandwich the cable units 43a and 43b, which are part of the electric field antenna unit 43, from above and below. The electric field antenna unit 43 and the electric field output ports 46 and 47 are insulated from the shield plates 44 and 45. The shield plates 44 and 45 are electrically connected to each other via a plurality of through holes (not illustrated). The shield plates 44 and 45 constitute an electric field shielding unit for shielding a part of the electric field antenna unit 43. The electric field antenna unit 43 generates a differential signal responsive to the detected electric field. The two electric field output ports 46 and 47 output the differential signal generated by the electric field antenna unit 43. The differential signal is composed of two signals that are equal in amplitude and opposite in phase.

As shown in FIG. 9, the magnetic field detection unit 51 includes a printed circuit board 52, and shield plates 54 and 55 placed on top and bottom of the printed circuit board 52. The printed circuit board 52 includes a magnetic field antenna unit 53 formed of a patterned conductor layer. The shield plates 54 and 55 are each formed of a conductor. The magnetic field antenna unit 53 forms a loop antenna. The magnetic field antenna unit 53 includes two cable units 53a and 53b, and a loop unit 53c connecting a first end of the cable unit 53a to a first end of the cable unit 53b. The loop unit 53c is approximately square with each side 20 mm in length.

The magnetic field detection unit 51 further includes two magnetic field output ports 56 and 57 formed of two through holes penetrating the shield plates 54 and 55 and the printed circuit board 52. The magnetic field output port 56 is connected to a second end of the cable unit 53a. The magnetic field output port 57 is connected to a second end of the cable unit 53b. The shield plates 54 and 55 are shaped to sandwich a part of the magnetic field antenna unit 53. More specifically, the shield plates 54 and 55 are shaped to sandwich the whole of the cable units 53a and 53b and sandwich the loop unit 53c except a part thereof. The magnetic field antenna unit 53 and the magnetic field output ports 56 and 57 are insulated from the shield plates 54 and 55. The shield plates 54 and 55 are electrically connected to each other via a plurality of through holes (not illustrated). The shield plates 54 and 55 constitute a magnetic field shielding unit for shielding a part of the magnetic field antenna unit 53. The magnetic field antenna unit 53 generates a differential signal responsive to the detected magnetic field. The two magnetic field output ports 56 and 57 output the differential signal generated by the magnetic field antenna unit 53.

As described above, each of the electric field detection unit 41 and the magnetic field detection unit 51 generates a differential signal. Such an electric field detection unit 41 and magnetic field detection unit 51 have the advantage that they are capable of cancelling out stationary noises occurring in phase with each other in the two signals constituting the differential signal, and have low dependence on the direction of detection.

To measure the amplitude and phase of an electric field and the amplitude and phase of a magnetic field by using the electromagnetic field probe 40, first correction information and second correction information are needed. The first correction information is information for correcting the amplitude and phase of the output signal of the electric field detection unit 41 to values corresponding to the amplitude and phase of the electric field that the electric field detection unit 41 actually undergoes, according to the intrinsic reception characteristics of the electric field detection unit 41. The second correction information is information for correcting the amplitude and phase of the output signal of the magnetic field detection unit 51 to values corresponding to the amplitude and phase of the magnetic field that the magnetic field detection unit 51 actually undergoes, according to the intrinsic reception characteristics of the magnetic field detection unit 51. Hereinafter, the first correction information will be referred to as the electric field probe coefficient, and the second correction information will be referred to as the magnetic field probe coefficient. In the experiment, the electric field probe coefficient and the magnetic field probe coefficient were determined in advance by the following method.

Figure 10:
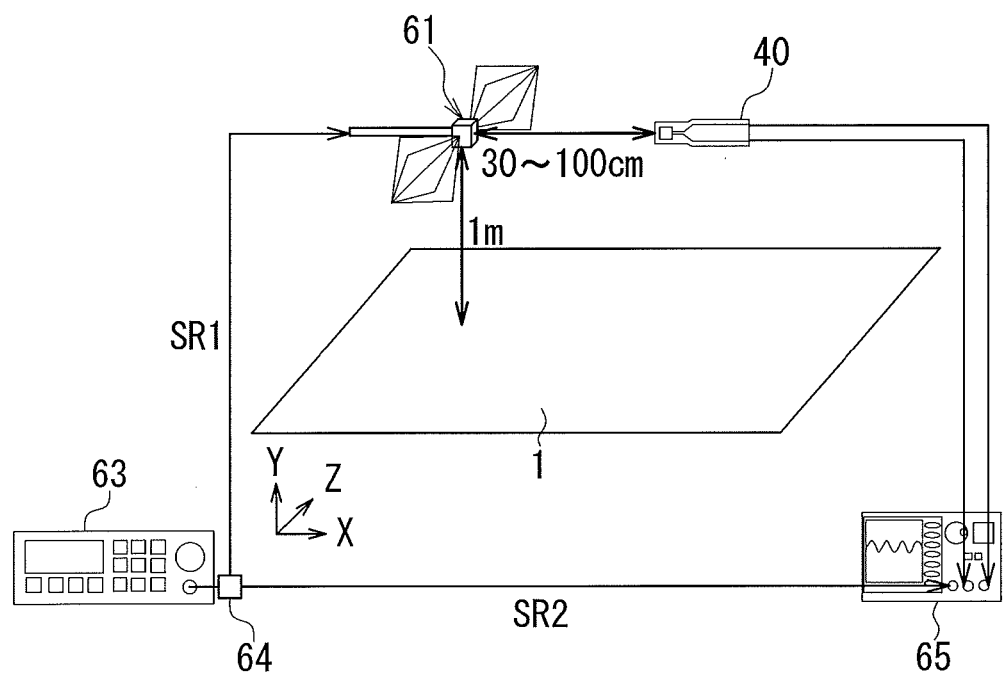
FIG. 10 is an explanatory diagram for explaining a method for determining the electric field probe coefficient and the magnetic field probe coefficient.
Figure 11:
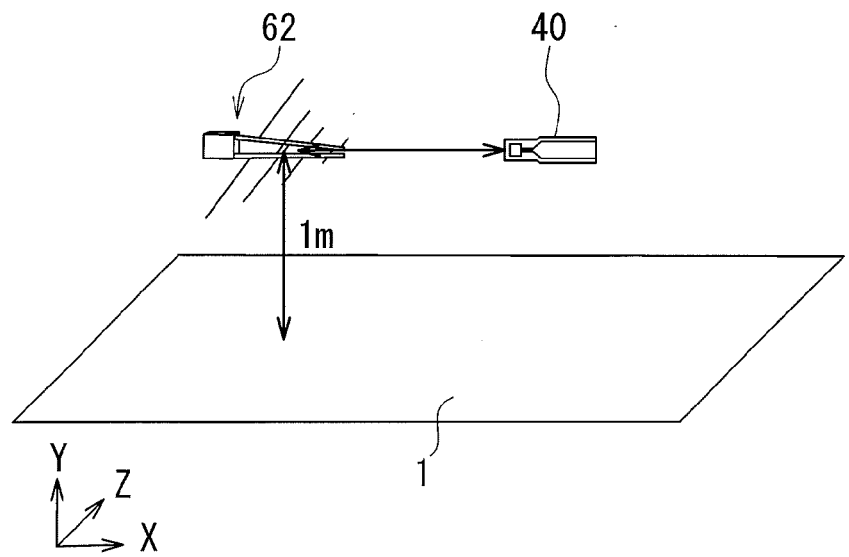
FIG. 11 is an explanatory diagram for explaining the method for determining the electric field probe coefficient and the magnetic field probe coefficient.

FIG. 10 and FIG. 11 are explanatory diagrams for explaining the method for determining the electric field probe coefficient and the magnetic field probe coefficient (hereinafter, referred to as the method for determining probe coefficients). In the method for determining probe coefficients, first, electromagnetic waves serving as a reference were made to be radiated from a radiation source. Then, the electromagnetic waves were detected by using the electromagnetic field probe 40 to collect basis data for determining the electric field probe coefficient and the magnetic field probe coefficient. A biconical antenna 61 shown in FIG. 10 and a log periodic antenna 62 shown in FIG. 11 were used as the radiation source.

The case where the biconical antenna 61 was used as the radiation source will be described first, with reference to FIG. 10. The method for determining probe coefficients used a reference signal generator 63, a signal distributor 64, and a receiver 65 as well as the electromagnetic field probe 40 and the biconical antenna 61. The reference signal generator 63 generated a reference signal. The signal distributor 64 divided the reference signal into two reference signals SR1 and SR2. The reference signal SR1 was supplied to the biconical antenna 61 with a magnitude of 1 V. The reference signal SR2 was supplied to the receiver 65. The biconical antenna 61 radiated electromagnetic waves on the basis of the reference signal SR1. The electromagnetic field probe 40 detected the electromagnetic waves.

In the method for determining probe coefficients, the biconical antenna 61 and the electromagnetic field probe 40 were positioned at a height of 1 m with respect to the ground plane 1. The distance between the biconical antenna 61 and the electromagnetic field probe 40 was varied within the range of 30 cm to 100 cm in units of 10 cm. The biconical antenna 61 was arranged in such an orientation as to radiate horizontally polarized electromagnetic waves. The electromagnetic field probe 40 was arranged in such an orientation that the electric field detection unit 41 detected the horizontal component of the electric field and the magnetic field detection unit 51 detected the vertical component of the magnetic field. The frequency of the electromagnetic waves radiated from the biconical antenna 61 was varied within the range of 30 MHz to 300 MHz. The two differential signals output from the electric field detection unit 41 and the magnetic field detection unit 51 of the electromagnetic field probe 40 were supplied to the receiver 65. The receiver 65 generated a plurality of pieces of measurement data corresponding to the reference signal SR2 and the two differential signals received. The plurality of pieces of measurement data were transmitted from the receiver 65 to a computer (not illustrated).

Next, the case where the log periodic antenna 62 was used as the radiation source will be described with reference to FIG. 11. In this case, instead of the biconical antenna 61, the log periodic antenna 62 was positioned at a height of 1 m with respect to the ground plane 1. The distance between the log periodic antenna 62 and the electromagnetic field probe 40 was varied within the range of 30 cm to 100 cm in units of 10 cm. The log periodic antenna 62 was arranged in such an orientation as to radiate horizontally polarized electromagnetic waves. The frequency of the electromagnetic waves radiated from the log periodic antenna 62 was varied within the range of 300 MHz to 1 GHz. The other conditions in the case of using the log periodic antenna 62 were the same as in the case of using the biconical antenna 61.

In the method for determining probe coefficients, the aforementioned computer was used to determine the electric field probe coefficient and the magnetic field probe coefficient as follows. Initially, a difference between the two signals constituting the differential signal output from the electric field detection unit 41 was determined as an electric field detection signal SE, and a difference between the two signals constituting the differential signal output from the magnetic field detection unit 51 was determined as a magnetic field detection signal SH. Next, a value SE/SR2 obtained by dividing the electric field detection signal SE by the reference signal SR2 was determined as an electric field measurement value Emeas, and a value SH/SR2 obtained by dividing the magnetic field detection signal SH by the reference signal SR2 was determined as a magnetic field measurement value Hmeas. The electric field measurement value Emeas and the magnetic field measurement value Hmeas are the basic data for determining the electric field probe coefficient and the magnetic field probe coefficient.

In the method for determining probe coefficients, the measurement system shown in FIG. 10 and the measurement system shown in FIG. 11 were both modeled to determine an electric field calculation value Ecal and a magnetic field calculation value Hcal by the method of moments. The electric field calculation value Ecal is a calculation value corresponding to the electric field measurement value Emeas. The magnetic field calculation value Hcal is a calculation value corresponding to the magnetic field measurement value Hmeas. The electric field probe coefficient $PF_E$ and the magnetic field probe coefficient $PF_H$ were then determined by the following Equations (5) and (6).

$$PF_E = Ecal/Emeas \quad (5)$$

$$PF_H = Hcal/Hmeas \quad (6)$$

The electric field probe coefficient $PF_E$ and the magnetic field probe coefficient $PF_H$ each include information on amplitude and information on phase. The information on amplitude included in the electric field probe coefficient $PF_E$ will be referred to as the electric field amplitude coefficient. The information on phase included in the electric field probe coefficient $PF_E$ will be referred to as the electric field phase coefficient. The information on amplitude included in the magnetic field probe coefficient $PF_H$ will be referred to as the magnetic field amplitude coefficient. The information on phase included in the magnetic field probe coefficient $PF_H$ will be referred to as the magnetic field phase coefficient.

The electric field amplitude coefficient, the electric field phase coefficient, the magnetic field amplitude coefficient, and the magnetic field phase coefficient mentioned above were determined by varying the distance between the antenna 61 or 62 and the electromagnetic field probe 40 and the frequency of the electromagnetic waves radiated from the antenna 61 or 62. As a result, the aforementioned coefficients at each frequency were found to be almost constant regardless of the distance between the antenna 61 or 62 and the electromagnetic field probe 40.

The average values of the electric field amplitude coefficient, the electric field phase coefficient, the magnetic field amplitude coefficient, and the magnetic field phase coefficient (the averages of a respective plurality of values of those coefficients obtained with different distances between the antenna 61 or 62 and the electromagnetic field probe 40) at each frequency will be referred to as electric field amplitude coefficient $PF_{Em}$, electric field phase coefficient $PF_{Ep}$, magnetic field amplitude coefficient $PF_{Hm}$, and magnetic field phase coefficient $PF_{Hp}$, respectively. In the method for determining probe coefficients, the electric field amplitude coefficient $PF_{Em}$ was determined as the information on amplitude of the electric field probe coefficient, the electric field phase coefficient $PF_{Ep}$ was determined as the information on phase of the electric field probe coefficient, the magnetic field amplitude coefficient $PF_{Hm}$ was determined as the information on amplitude of the magnetic field probe coefficient, and the magnetic field phase coefficient $PF_{Hp}$ was determined as the information on phase of the magnetic field probe coefficient. In the following description, the electric field probe coefficient $PF_E$ shall have an amplitude indicated by the electric field amplitude coefficient $PF_{Em}$ and a phase indicated by the electric field phase coefficient $PF_{Ep}$, and the magnetic field probe coefficient $PF_H$ shall have an amplitude indicated by the magnetic field amplitude coefficient $PF_{Hm}$ and a phase indicated by the magnetic field phase coefficient $PF_{Hp}$.

Figure 12:
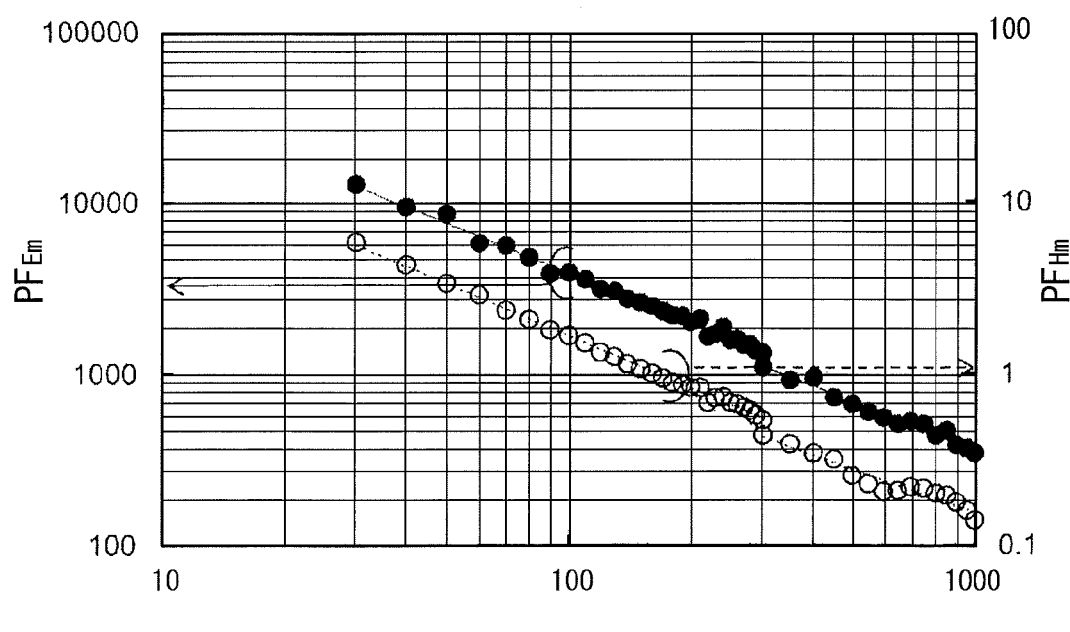
FIG. 12 is a characteristic diagram illustrating the electric field amplitude coefficient and the magnetic field amplitude coefficient.

FIG. 12 is a characteristic diagram illustrating the electric field amplitude coefficient $PF_{Em}$ and the magnetic field amplitude coefficient $PF_{Hm}$. In FIG. 12, the horizontal axis represents frequency, and the vertical axes represent $PF_{Em}$ and $PF_{Hm}$. In FIG. 12, the filled circles indicate the frequency-by-frequency electric field amplitude coefficient $PF_{Em}$, and the hollow circles indicate the frequency-by-frequency magnetic field amplitude coefficient $PF_{Hm}$.

Figure 13:
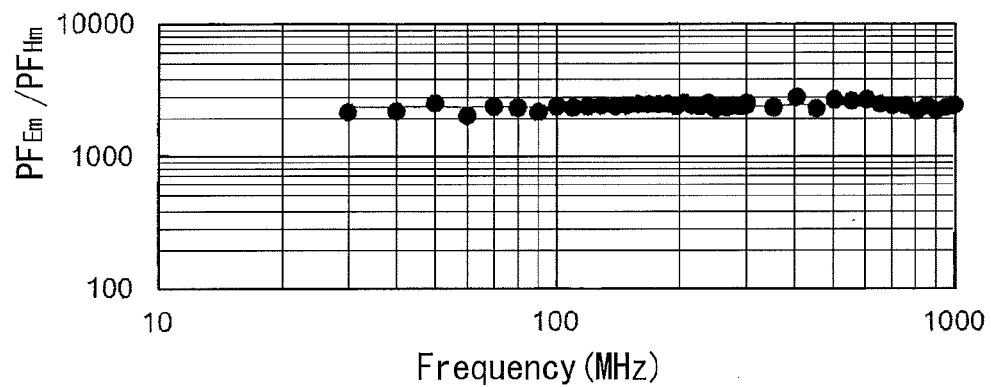
FIG. 13 is a characteristic diagram illustrating the ratio of the electric field amplitude coefficient to the magnetic field amplitude coefficient.

FIG. 13 is a characteristic diagram illustrating the ratio $PF_{Em}/PF_{Hm}$ of the electric field amplitude coefficient $PF_{Em}$ to the magnetic field amplitude coefficient $PF_{Hm}$. In FIG. 13, the horizontal axis represents frequency, and the vertical axis represents $PF_{Em}/PF_{Hm}$.

Figure 14:
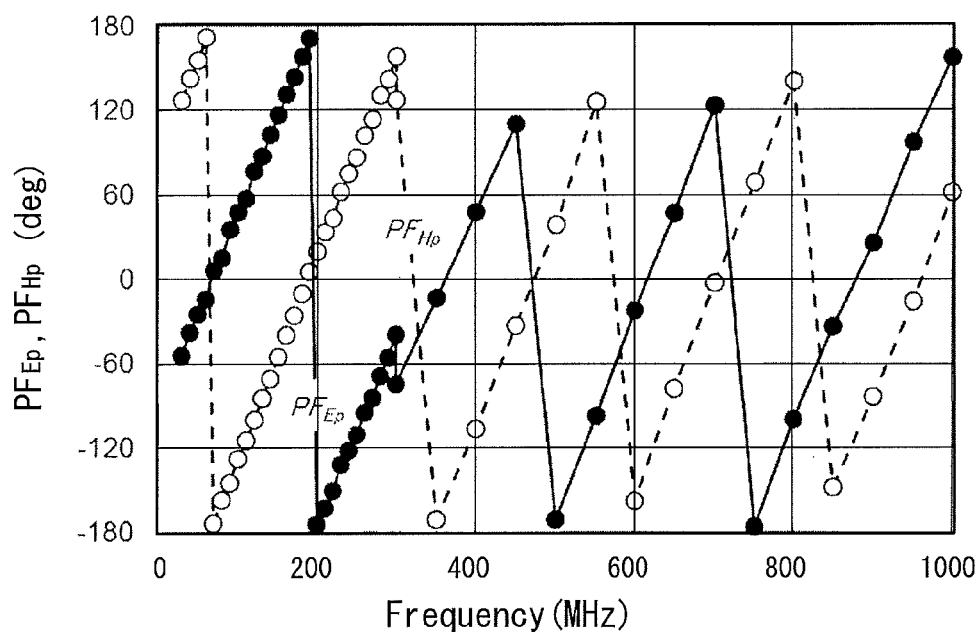
FIG. 14 is a characteristic diagram illustrating the electric field phase coefficient and the magnetic field phase coefficient.

FIG. 14 is a characteristic diagram illustrating the electric field phase coefficient $PF_{Ep}$ and the magnetic field phase coefficient $PF_{Hp}$. In FIG. 14, the horizontal axis represents frequency, and the vertical axis represents $PF_{Ep}$ and $PF_{Hp}$. $PF_{Ep}$ and $PF_{Hp}$ are in degrees (deg). In FIG. 14, the filled circles indicate the frequency-by-frequency electric field phase coefficient $PF_{Ep}$, and the hollow circles indicate the frequency-by-frequency magnetic field phase coefficient $PF_{Hp}$.

Figure 15:
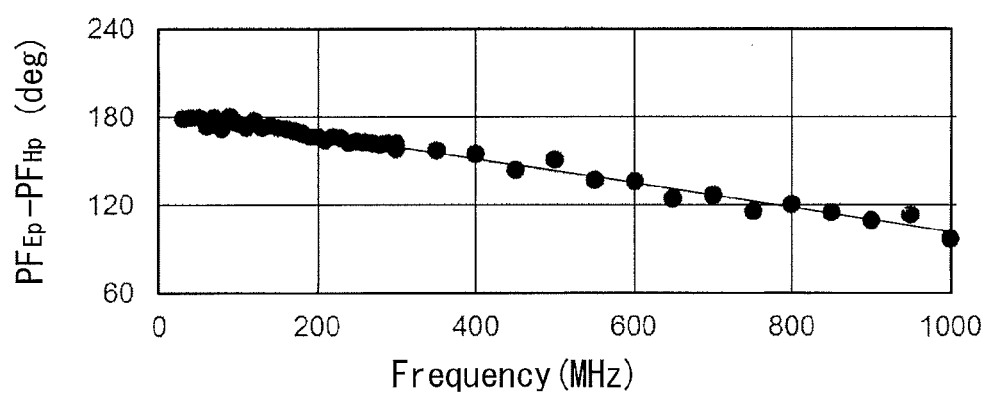
FIG. 15 is a characteristic diagram illustrating the difference between the electric field phase coefficient and the magnetic field phase coefficient.

FIG. 15 is a characteristic diagram illustrating the difference $PF_{Ep}-PF_{Hp}$ between the electric field phase coefficient $PF_{Ep}$ and the magnetic field phase coefficient $PF_{Hp}$. In FIG. 15, the horizontal axis represents frequency, and the vertical axis represents the difference $PF_{Ep}-PF_{Hp}$. The difference $PF_{Ep}-PF_{Hp}$ is in degrees (deg).

Suppose that the electric field probe coefficient $PF_E$ has been determined in advance for the electromagnetic field probe 40 in use. In such a case, the electric field probe coefficient $PF_E$ can be used to correct the amplitude and phase of the output signal of the electric field detection unit 41 to values free from the effect of the intrinsic reception characteristics of the electric field detection unit 41, that is, values corresponding to the amplitude and phase of the electric field that the electric field detection unit 41 actually undergoes. Similarly, suppose that the magnetic field probe coefficient $PF_H$ has been determined in advance for the electromagnetic field probe 40 in use. In such a case, the magnetic field probe coefficient $PF_H$ can be used to correct the amplitude and phase of the output signal of the magnetic field detection unit 51 to values free from the effect of the intrinsic reception characteristics of the magnetic field detection unit 51, that is, values corresponding to the amplitude and phase of the magnetic field that the magnetic field detection unit 51 actually undergoes. More specifically, the corrected electric field is obtained by multiplying the output signal of the electric field detection unit 41 by the electric field probe coefficient $PF_E$, and the corrected magnetic field is obtained by multiplying the output signal of the magnetic field detection unit 51 by the magnetic field probe coefficient $PF_H$.

Further, suppose that the ratio $PF_{Em}/PF_{Hm}$ of the electric field amplitude coefficient $PF_{Em}$ to the magnetic field amplitude coefficient $PF_{Hm}$, as shown in FIG. 13, and the difference $PF_{Ep}-PF_{Hp}$ between the electric field phase coefficient $PF_{Ep}$ and the magnetic field phase coefficient $PF_{Hp}$, as shown in FIG. 15, have been determined in advance for the electromagnetic field probe 40 in use. In such a case, by measuring the amplitude and phase of either one of the electric field and the magnetic field, the amplitude and phase of the other of the electric field and the magnetic field can be determined by calculation using the measurement results, the ratio $PF_{Em}/PF_{Hm}$, and the difference $PF_{Ep}-PF_{Hp}$ in the following manner.

If the amplitude and phase of the horizontal component of the electric field and the amplitude and phase of the vertical component of the electric field are measured, the amplitude of the vertical component of the magnetic field can be determined by dividing the amplitude of the horizontal component of the electric field by the ratio $PF_{Em}/PF_{Hm}$. The amplitude of the horizontal component of the magnetic field can be determined by dividing the amplitude of the vertical component of the electric field by the ratio $PF_{Em}/PF_{Hm}$. The phase of the vertical component of the magnetic field can be determined by subtracting the difference $PF_{Ep}-PF_{Hp}$ from the phase of the horizontal component of the electric field. The phase of the horizontal component of the magnetic field can be determined by subtracting the difference $PF_{Ep}-PF_{Hp}$ from the phase of the vertical component of the electric field.

If the amplitude and phase of the horizontal component of the magnetic field and the amplitude and phase of the vertical component of the magnetic field are measured, the amplitude of the vertical component of the electric field can be determined by multiplying the amplitude of the horizontal component of the magnetic field by the ratio $PF_{Em}/PF_{Hm}$. The amplitude of the horizontal component of the electric field can be determined by multiplying the amplitude of the vertical component of the magnetic field by the ratio $PF_{Em}/PF_{Hm}$. The phase of the vertical component of the electric field can be determined by adding the difference $PF_{Ep}-PF_{Hp}$ to the phase of the horizontal component of the magnetic field. The phase of the horizontal component of the electric field can be determined by adding the difference $PF_{Ep}-PF_{Hp}$ to the phase of the vertical component of the magnetic field.

In the experiment, the amplitudes and phases of the measurement-point electric fields and magnetic fields at the plurality of measurement points 11 were measured by using the electromagnetic field probe 40 for the case of horizontally polarized waves shown in FIG. 6 and for the case of vertically polarized waves shown in FIG. 7. The amplitudes and phases of the measurement-point electric fields and magnetic fields were values corrected by using the electric field probe coefficient $PF_E$ and the magnetic field probe coefficient $PF_H$.

In the experiment, a plurality of mirror image measurement points 21 (see FIG. 4) were then set on the mirror image measurement surface 20 having a plane-symmetrical positional relationship with the measurement surface 10 about the ground plane 1. The amplitudes and phases of the mirror image measurement-point electric fields and magnetic fields at the plurality of mirror image measurement points 21 were then calculated on the basis of the amplitudes and phases of the measurement-point electric fields and magnetic fields at the plurality of measurement points 11. Next, the distributions of the surface electric current Js and the surface magnetic current Ms on the surface 30 (see FIG. 1) were determined by using Equations (1) and (2) on the basis of the amplitudes and phases of the measurement-point electric fields and magnetic fields at the plurality of measurement points 11 and the amplitudes and phases of the mirror image measurement-point electric fields and magnetic fields at the plurality of mirror image measurement points 21. Next, the far electromagnetic field at the virtual observation point 3 was determined from the distributions of the surface electric current Js and the surface magnetic current Ms on the surface 30 by using Equations (3) and (4). In the experiment, the electric field strength at the virtual observation point 3 was determined in particular. The virtual observation point 3 was assumed to be 10 m distant from the radiation source 2 (biconical antenna 31) in the X direction. The height of the virtual observation point 3 with respect to the ground plane 1 (hereinafter referred to as the observation point height) was varied within the range of 1 m to 4 m. The electric field strength at the observation point 3 thus determined will hereinafter be referred to as the electric field strength obtained with the present embodiment.

In the experiment, a theoretical value of the electric field strength at the observation point 3 was determined by using the method of moments. Further, in the experiment, the electric field strength at the observation point 3 was determined by using the far electromagnetic field estimation method of the comparative example shown in FIG. 3. The conditions under which the electric field strength at the observation point 3 was determined by using the far electromagnetic field estimation method of the comparative example will be described with reference to FIG. 16 and FIG. 17. Like the experiment method shown in FIG. 6 and FIG. 7, the measurement of the comparative example was separately performed for the case of horizontally polarized waves and for the case of vertically polarized waves.

Figure 16:
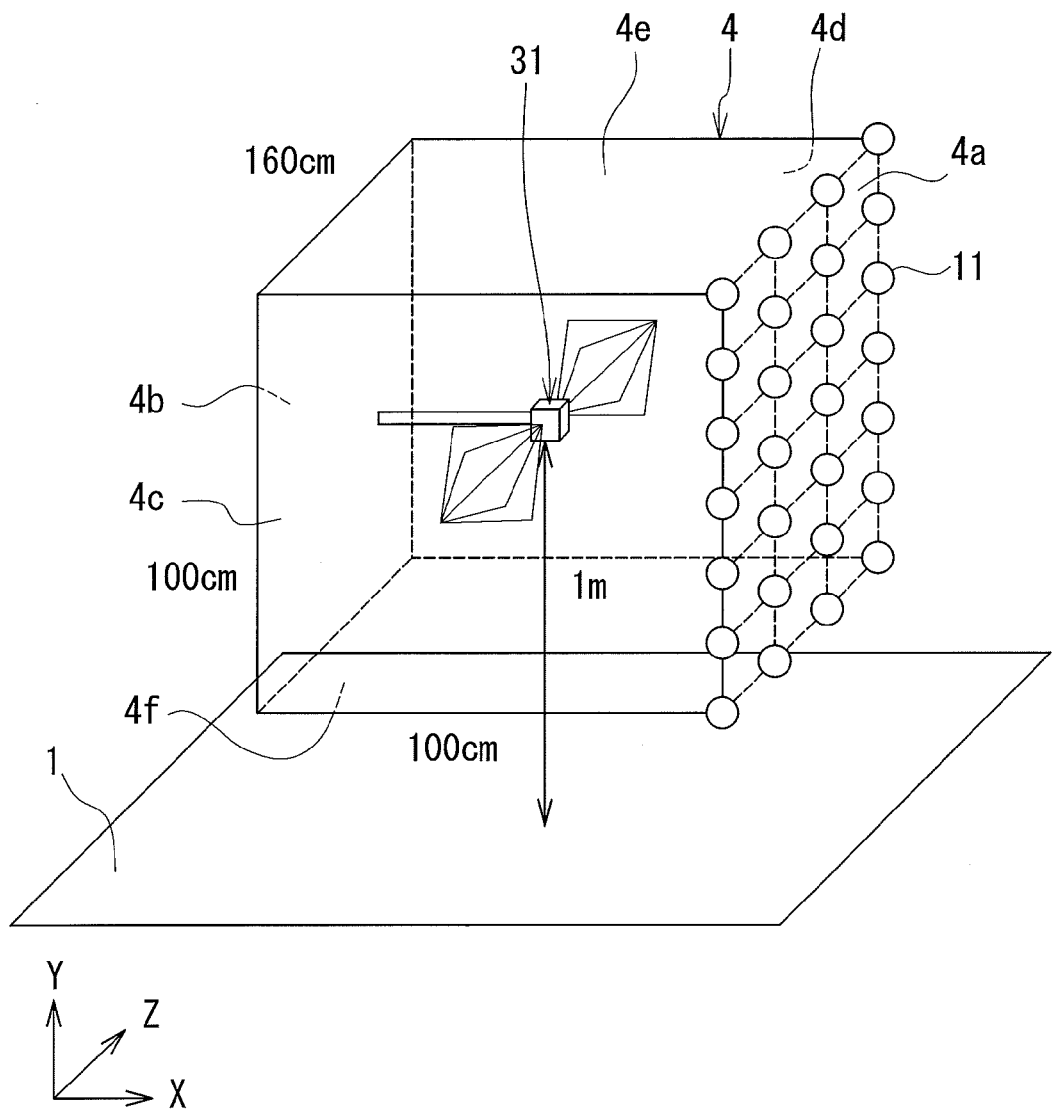
FIG. 16 is an explanatory diagram for explaining the conditions for the comparative example in the experiment.

FIG. 16 is an explanatory diagram for explaining the conditions for the comparative example for the case of horizontally polarized waves. For this case, the biconical antenna 31 serving as the radiation source 2 was arranged in the same position and orientation as in the experiment shown in FIG. 6. In the comparative example, as shown in FIG. 16, a measurement surface 4 constituted by six quadrangular planes 4a, 4b, 4c, 4d, 4e and 4f was assumed to surround the biconical antenna 31. The six planes correspond to the six faces of a rectangular solid. The rectangular solid has dimensions of 100 cm, 100 cm, and 160 cm in the X, Y, and Z directions, respectively. A plurality of measurement points 11 are arranged on the measurement surface 4. The distance between two adjacent measurement points 11 in each of the X, Y and Z directions on the measurement surface 4 is 10 cm.

Figure 17:
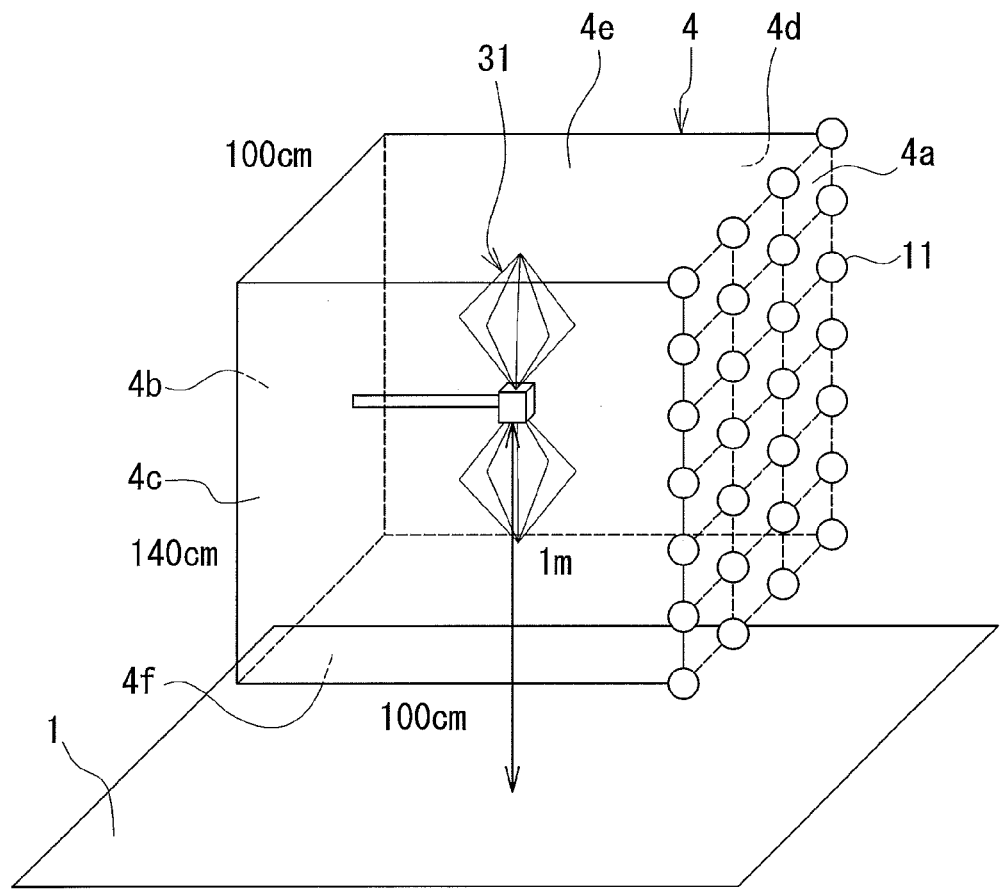
FIG. 17 is an explanatory diagram for explaining the conditions for the comparative example in the experiment.

FIG. 17 is an explanatory diagram for explaining the conditions for the comparative example for the case of vertically polarized waves. For this case, the biconical antenna 31 serving as the radiation source 2 was arranged in the same position and orientation as in the experiment shown in FIG. 7. In the comparative example, as shown in FIG. 17, a measurement surface 4 constituted by six quadrangular planes 4a, 4b, 4c, 4d, 4e and 4f was assumed to surround the biconical antenna 31. The six planes correspond to the six faces of a rectangular solid. The rectangular solid has dimensions of 100 cm, 140 cm, and 100 cm in the X, Y, and Z directions, respectively. A plurality of measurement points 11 are arranged on the measurement surface 4. The distance between two adjacent measurement points 11 in each of the X, Y and Z directions on the measurement surface 4 is 10 cm.

In the comparative example, the amplitudes and phases of the measurement-point electric fields and magnetic fields at the plurality of measurement points 11 were measured by using the electromagnetic field probe 40 for the case of horizontally polarized waves shown in FIG. 16 and for the case of vertically polarized waves shown in FIG. 17. In the comparative example, a mirror image observation point 5 was then assumed, and electric fields were estimated at the two points, the observation point 3 and the mirror image observation point 5. Next, the two estimated electric fields were vectorially added to determine the electric field strength at the observation point 3. The electric field strength at the observation point 3 thus determined will hereinafter be referred to as the electric field strength obtained with the comparative example.

Figure 18A:
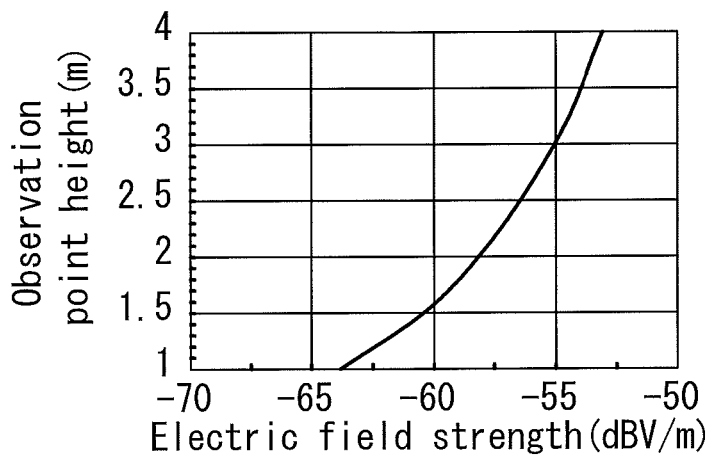
FIG. 18A to FIG. 18C are characteristic diagrams illustrating experimental results for the case of horizontally polarized electromagnetic waves having a frequency of 30 MHz.
Figure 18B:
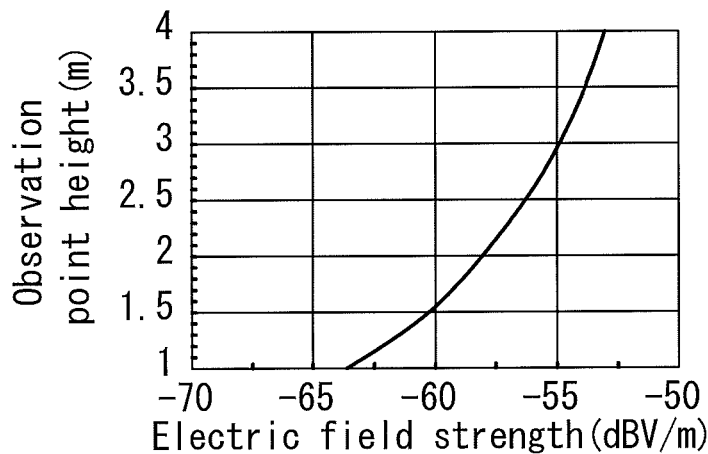
Figure 18C:
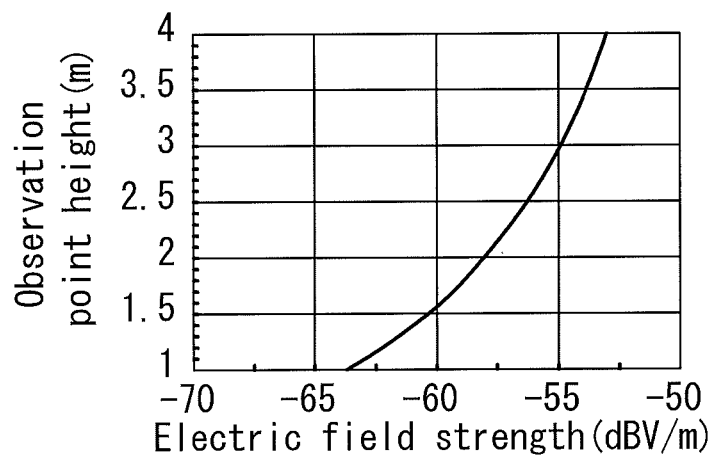
Figure 19A:
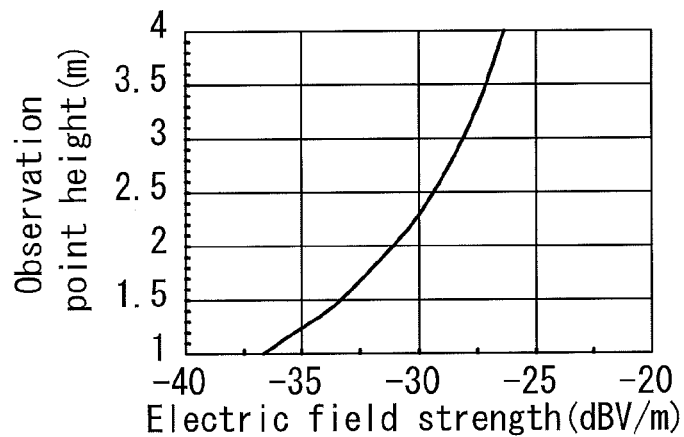
FIG. 19A to FIG. 19C are characteristic diagrams illustrating experimental results for the case of horizontally polarized electromagnetic waves having a frequency of 80 MHz.
Figure 19B:
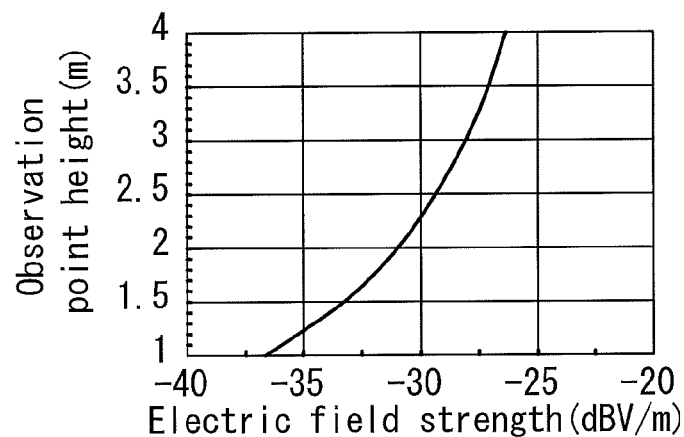
Figure 19C:
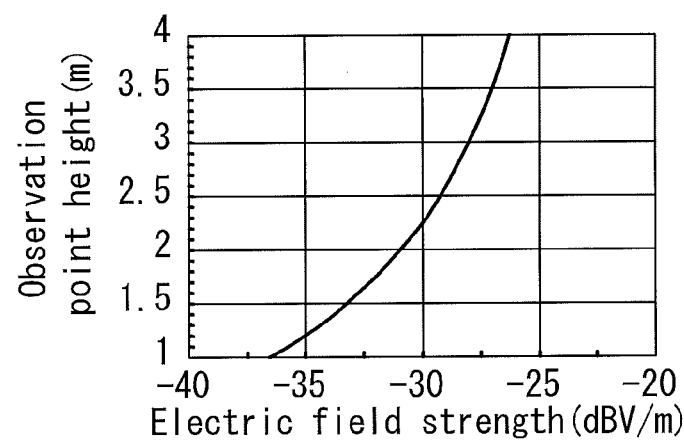
Figure 20A:
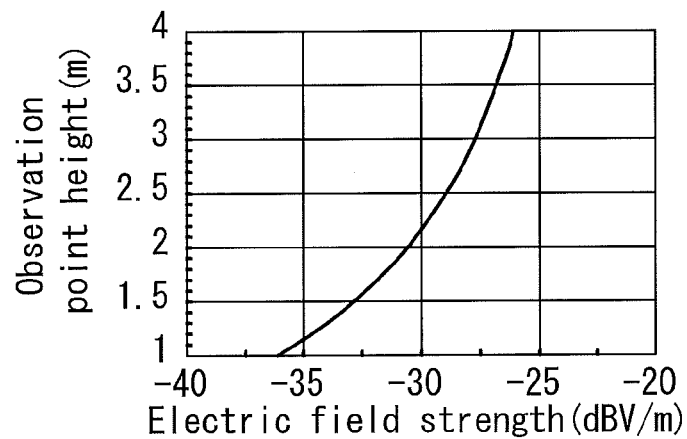
FIG. 20A to FIG. 20C are characteristic diagrams illustrating experimental results for the case of horizontally polarized electromagnetic waves having a frequency of 100 MHz.
Figure 20B:
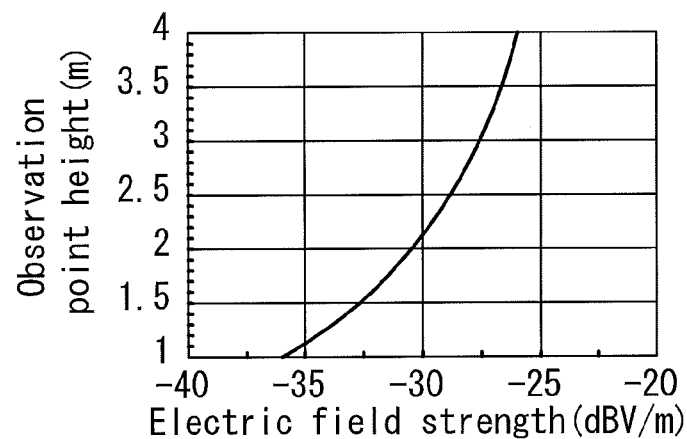
Figure 20C:
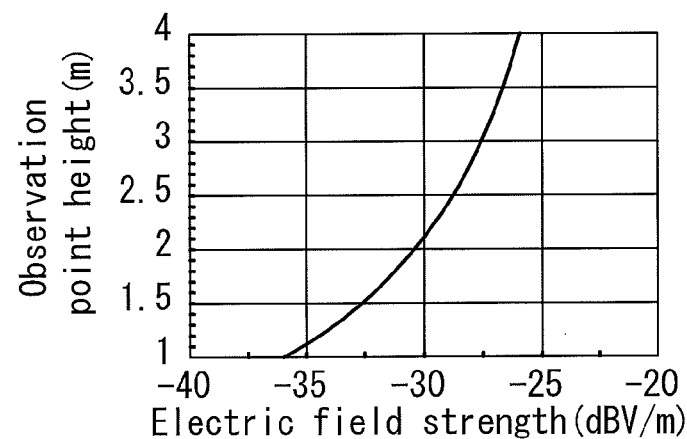
Figure 21A:
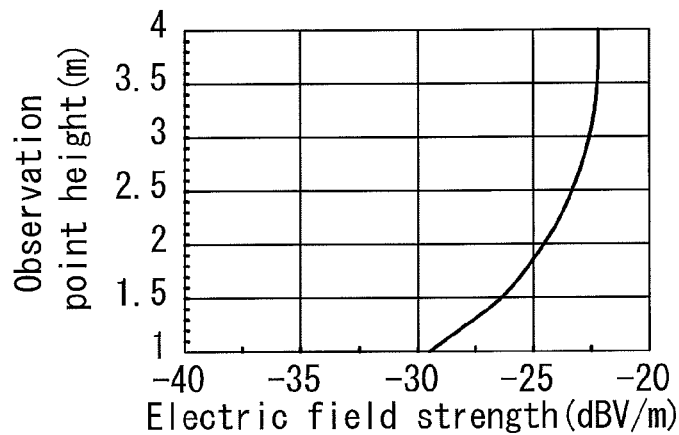
FIG. 21A to FIG. 21C are characteristic diagrams illustrating experimental results for the case of horizontally polarized electromagnetic waves having a frequency of 200 MHz.
Figure 21B:
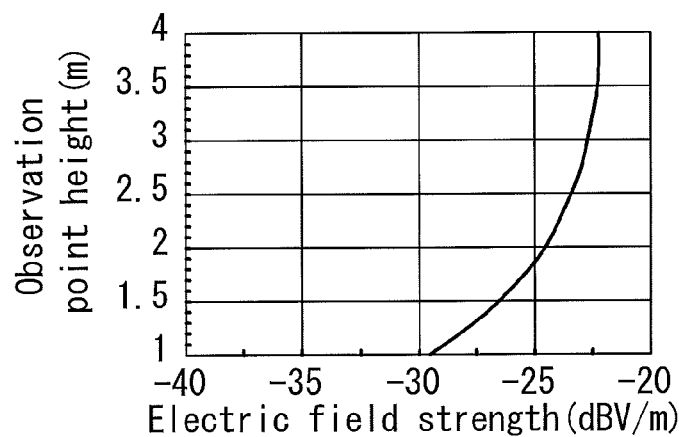
Figure 21C:
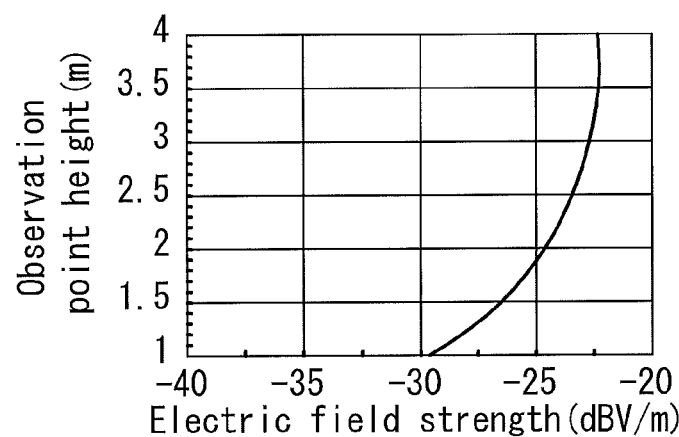
Figure 22A:
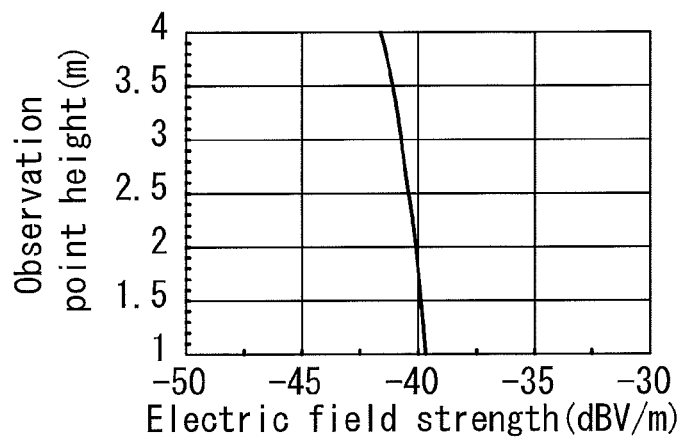
FIG. 22A to FIG. 22C are characteristic diagrams illustrating experimental results for the case of vertically polarized electromagnetic waves having a frequency of 30 MHz.
Figure 22B:
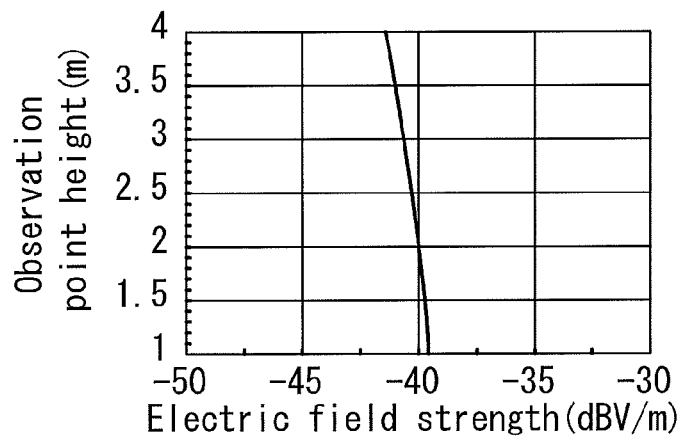
Figure 22C:
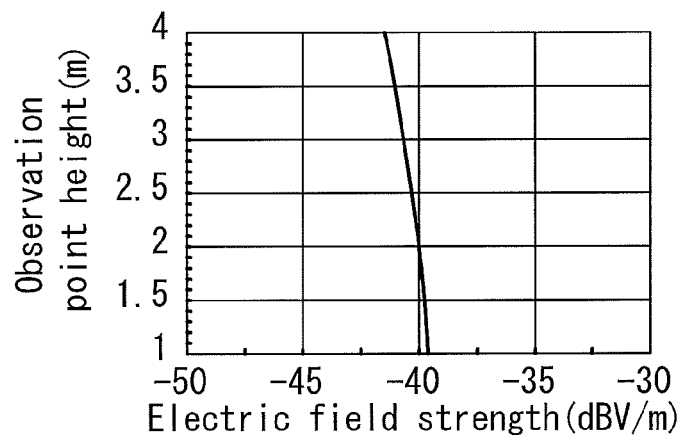
Figure 23A:
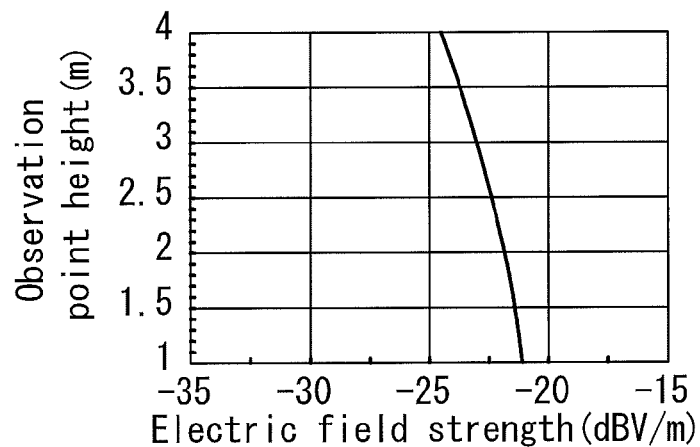
FIG. 23A to FIG. 23C are characteristic diagrams illustrating experimental results for the case of vertically polarized electromagnetic waves having a frequency of 80 MHz.
Figure 23B:
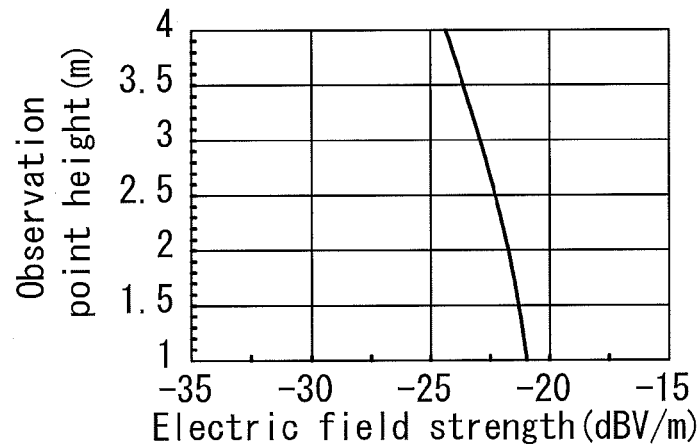
Figure 23C:
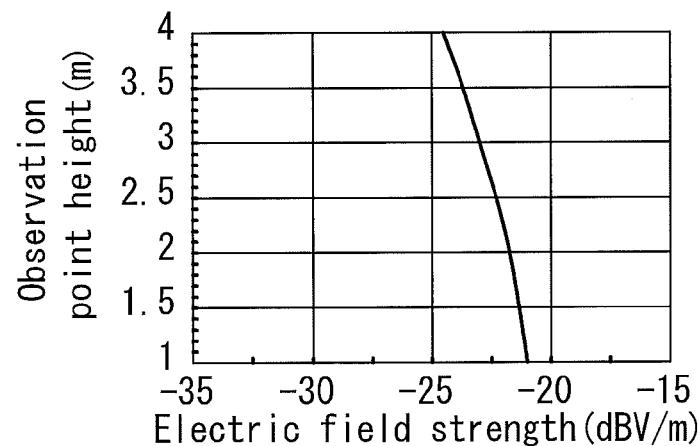
Figure 24A:
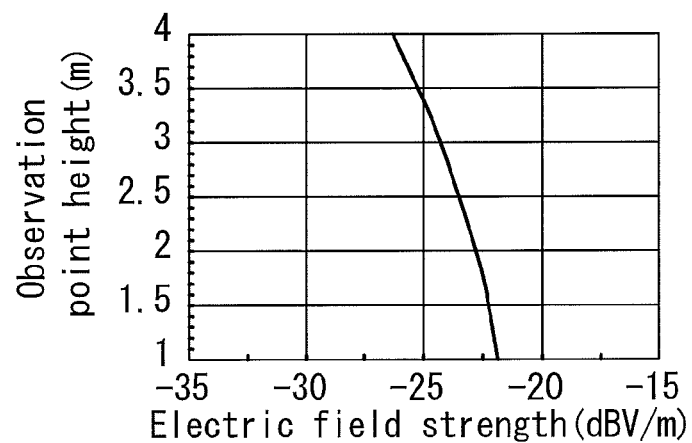
FIG. 24A to FIG. 24C are characteristic diagrams illustrating experimental results for the case of vertically polarized electromagnetic waves having a frequency of 100 MHz.
Figure 24B:
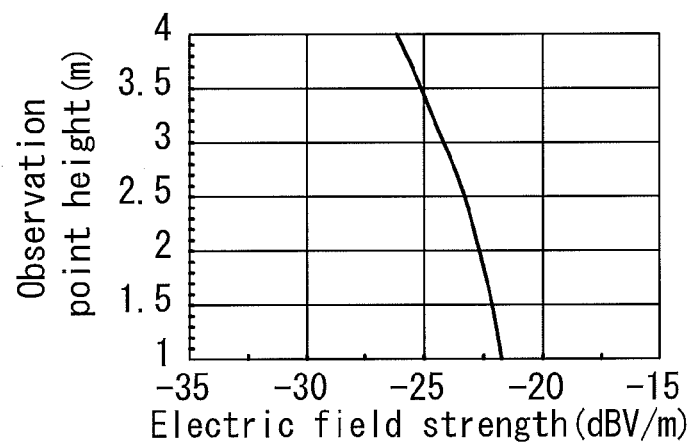
Figure 24C:
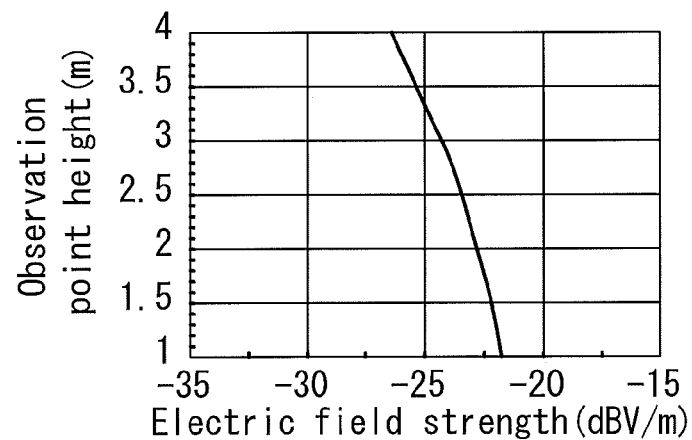
Figure 25A:
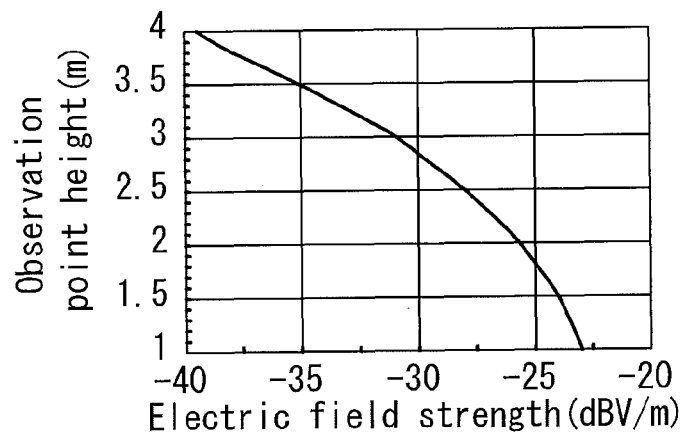
FIG. 25A to FIG. 25C are characteristic diagrams illustrating experimental results for the case of vertically polarized electromagnetic waves having a frequency of 200 MHz.
Figure 25B:
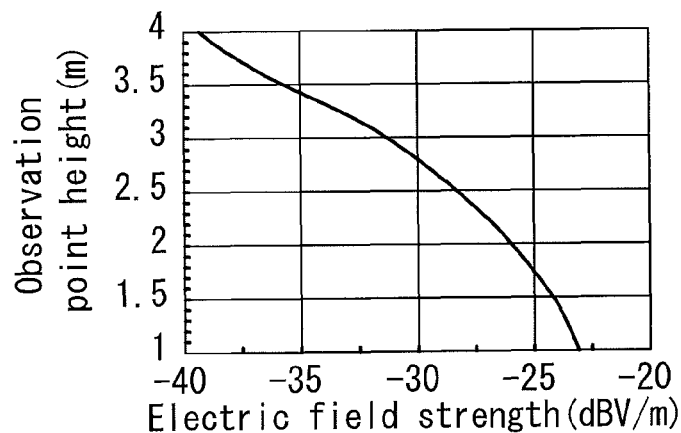
Figure 25C:
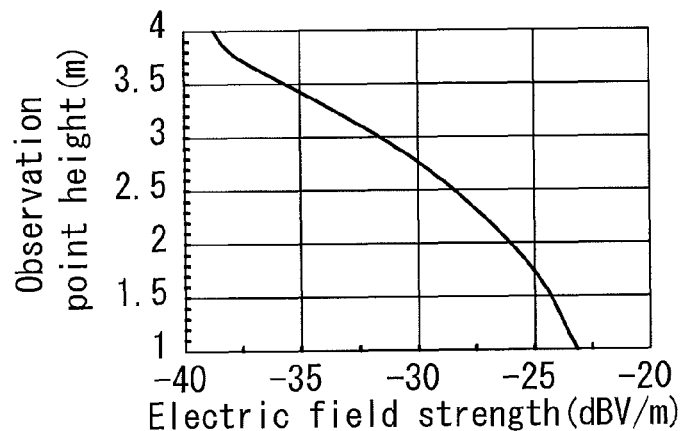

The experimental results are shown in FIG. 18A to FIG. 25C. FIG. 18A to FIG. 18C show the experimental results for the case of horizontally polarized waves where the electromagnetic waves had a frequency of 30 MHz. FIG. 19A to FIG. 19C show the experimental results for the case of horizontally polarized waves where the electromagnetic waves had a frequency of 80 MHz. FIG. 20A to FIG. 20C show the experimental results for the case of horizontally polarized waves where the electromagnetic waves had a frequency of 100 MHz. FIG. 21A to FIG. 21C show the experimental results for the case of horizontally polarized waves where the electromagnetic waves had a frequency of 200 MHz. FIG. 22A to FIG. 22C show the experimental results for the case of vertically polarized waves where the electromagnetic waves had a frequency of 30 MHz. FIG. 23A to FIG. 23C show the experimental results for the case of vertically polarized waves where the electromagnetic waves had a frequency of 80 MHz. FIG. 24A to FIG. 24C show the experimental results for the case of vertically polarized waves where the electromagnetic waves had a frequency of 100 MHz. FIG. 25A to FIG. 25C show the experimental results for the case of vertically polarized waves where the electromagnetic waves had a frequency of 200 MHz.

FIG. nA (n is an integer between 18 and 25 inclusive) shows the relationship between the observation point height and the theoretical value of the electric field strength. FIG. nB shows the relationship between the observation point height and the electric field strength obtained with the present embodiment. FIG. nC shows the relationship between the observation point height and the electric field strength obtained with the comparative example. In FIG. 18A to FIG. 25C, the vertical axis represents the observation point height (m), and the horizontal axis represents the electric field strength (dBV/m).

As shown in FIG. 18A to FIG. 25C, the electric field strength obtained with the present embodiment substantially agrees with the theoretical value of the electric field strength, and also with the electric field strength obtained with the comparative example. Such results confirm the validity of the far electromagnetic field estimation method according to the first embodiment.

[Far Electromagnetic Field Estimation Apparatus and Near Electromagnetic Field Measurement Apparatus]

A far electromagnetic field estimation apparatus and a near electromagnetic field measurement apparatus according to the first embodiment will now be described with reference to FIG. 26 to FIG. 35. The far electromagnetic field estimation apparatus according to the first embodiment is an apparatus for implementing the far electromagnetic field estimation method according to the first embodiment. More specifically, the far electromagnetic field estimation apparatus determines at least either one of an electric field and a magnetic field that are estimated to be formed by the radiation source 2 of electromagnetic waves at the virtual observation point 3 distant from the radiation source 2 which is located in either one of two spaces sectioned by the ground plane 1. The far electromagnetic field estimation apparatus includes the near electromagnetic field measurement apparatus according to the first embodiment and an arithmetic processing unit.

The near electromagnetic field measurement apparatus according to the first embodiment will be described first, with reference to FIG. 26. The near electromagnetic field measurement apparatus 60 includes one or more probes to detect at least either one of an electric field and a magnetic field, a position control mechanism 70 capable of changing the relative position of the one or more probes with respect to the radiation source 2, and a control unit to control measurement of the at least either one of the electric field and the magnetic field performed using the one or more probes and the position control mechanism 70. The one or more probes employed in the first embodiment is the electromagnetic field probe 40 including the electric field detection unit 41 shown in FIG. 8 and the magnetic field detection unit 51 shown in FIG. 9. The control unit is not shown in FIG. 26.

The control unit performs a first operation and a second operation. The first operation assumes a measurement surface 10 (see FIG. 1) and sets a plurality of measurement points 11 (see FIG. 4) on the measurement surface 10. The measurement surface 10, in combination with the ground plane 1, forms a closed surface surrounding the radiation source 2. The virtual observation point 3 is outside the space formed inside the closed surface. The second operation measures either a plurality of measurement-point electric fields or a plurality of measurement-point magnetic fields, or both, by using the electromagnetic field probe 40 while controlling the position control mechanism 70. The plurality of measurement-point electric fields are components of electric fields in tangential directions of the measurement surface 10 at the plurality of measurement points 11. The plurality of measurement-point magnetic fields are components of magnetic fields in the tangential directions of the measurement surface 10 at the plurality of measurement points 11. In the first operation of the first embodiment, in particular, the measurement surface 10 is assumed to have a shape formed by five of the six faces of a rectangular solid as shown in FIG. 1, with the remaining one face excluded.

The position control mechanism 70 includes two rails 71, 71 provided on the ground plane 1, and a movable frame 72. The movable frame 72 includes a frame body 72A, and four wheels 72B attached to the frame body 72A and movable along the two rails 71, 71. The frame body 72A includes two vertical portions extending vertically above the two rails 71, 71, and a horizontal portion extending horizontally and connecting the top ends of the two vertical portions to each other.

The position control mechanism 70 further includes an arm 73 to support the electromagnetic field probe 40. The arm 73 is attached to the frame body 72A in such a manner as to be movable along the frame body 72A. The arm 73 is configured to be capable of changing the orientation of the electromagnetic field probe 40 so that the directions of the electric field and the magnetic field that the electromagnetic field probe 40 is to detect can be changed.

The position control mechanism 70 further includes a rotating table 74 of disc-like shape attached to the ground plane 1. The rotating table 74 can rotate about an axis in a direction perpendicular to the ground plane 1. A direction from the center of rotation of the rotating table 74 to a predetermined point on the outer periphery of the rotating table 74 will be defined as the front direction of the rotating table 74. The radiation source 2 is placed, for example, on a pedestal 75 lying on the rotating table 74.

Although not illustrated, the position control mechanism 70 further includes a driving device for moving the movable frame 72 along the two rails 71, 71, a driving device for moving the arm 73 along the frame body 72A, a driving device for changing the orientation of the electromagnetic field probe 40 supported by the arm 73, and a driving device for rotating the rotating table 74. The control unit controls these driving devices to perform the second operation. Note that there may be provided a plurality of pairs of electromagnetic field probe 40 and arm 73.

The far electromagnetic field estimation apparatus according to the first embodiment further includes a reference point antenna 61. The reference point antenna 61 is placed at a predetermined position above the ground plane 1 and outside the space surrounded by the measurement surface 10. The function of the reference point antenna 61 will be described in detail later.

Figure 26:
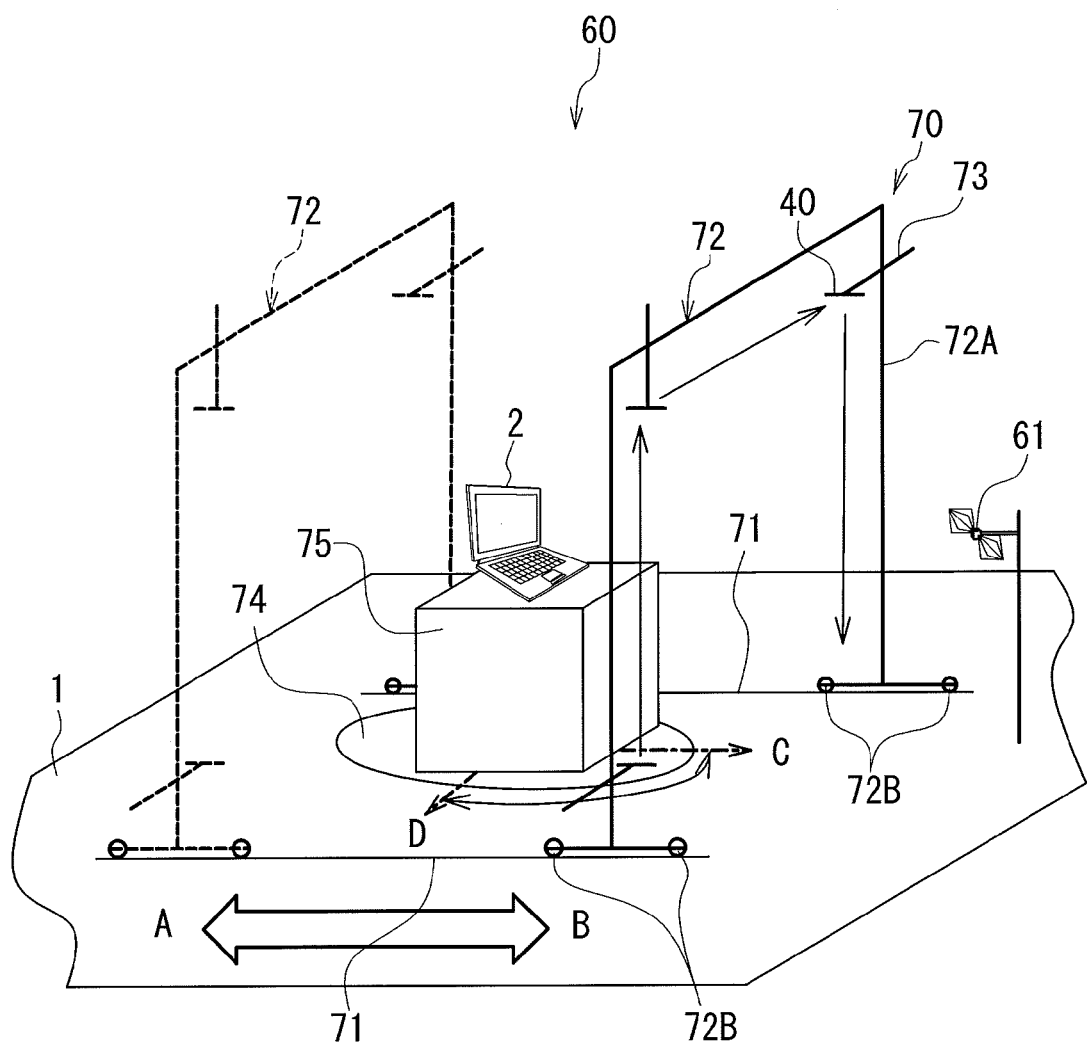
FIG. 26 is a perspective view of a near electromagnetic field measurement apparatus according to the first embodiment of the invention.
Figure 27:
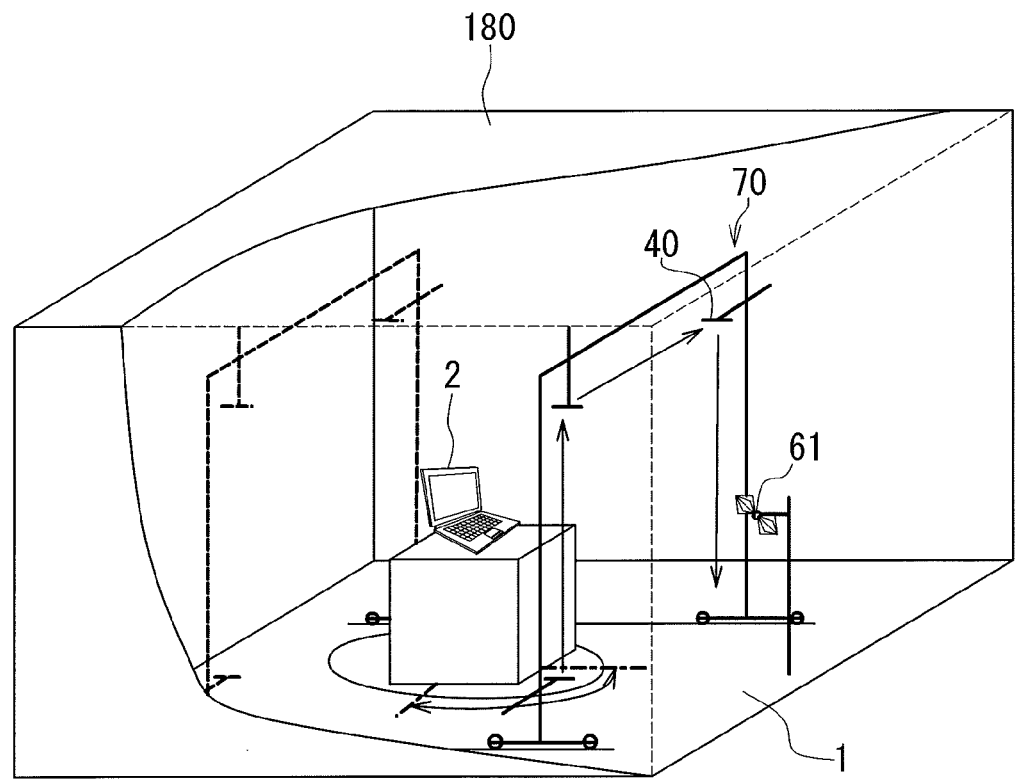
FIG. 27 is a perspective view illustrating an example of arrangement of the near electromagnetic field measurement apparatus shown in FIG. 26.

FIG. 27 is a perspective view illustrating an example of arrangement of the near electromagnetic field measurement apparatus 60 shown in FIG. 26. In this example, the radiation source 2, the electromagnetic field probe 40, the position control mechanism 70, and the reference point antenna 61 are disposed in a radio anechoic chamber 180 having a metal floor surface constituting the ground plane 1. The radio anechoic chamber 180 is constructed by attaching a radio wave absorber to the wall surfaces of a shield room except the metal floor surface.

Figure 28:
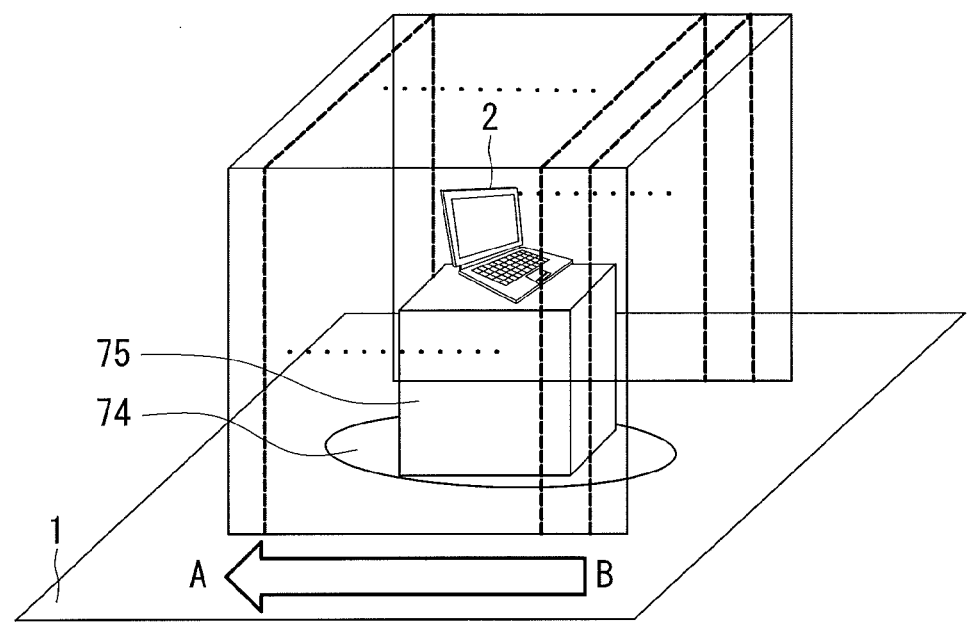
FIG. 28 is an explanatory diagram for explaining the operation of the near electromagnetic field measurement apparatus shown in FIG. 26.
Figure 29:
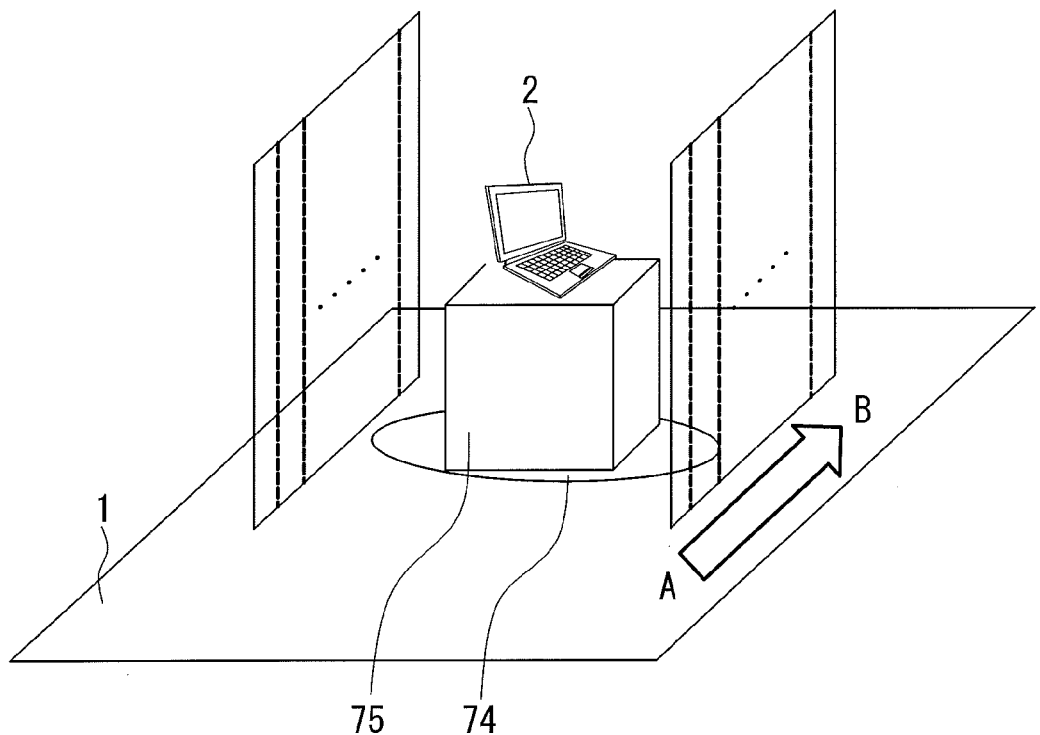
FIG. 29 is an explanatory diagram for explaining the operation of the near electromagnetic field measurement apparatus shown in FIG. 26.

Reference is now made to FIG. 28 and FIG. 29 to describe an overview of the operation of the near electromagnetic field measurement apparatus 60 when used in measuring either the measurement-point electric fields or the measurement-point magnetic fields, or both, at the plurality of measurement points 11. Initially, in FIG. 26, the position of the movable frame 72 shown by broken lines will be defined as the A position, and the position of the movable frame 72 shown by solid lines will be defined as the B position. The position of the rotating table 74 when the front direction of the rotating table 74 is situated in the direction indicated by the symbol C in FIG. 26 will be defined as the C position. The position of the rotating table 74 when the front direction of the rotating table 74 is situated in the direction indicated by the symbol D in FIG. 26 will be defined as the D position. The direction indicated by the symbol D is the direction rotated by 90° in the rotational direction of the rotating table 74 from the direction indicated by the symbol C.

In an initial state, the movable frame 72 is in the B position and the rotating table 74 is in the C position. To measure at least either the measurement-point electric fields or the measurement-point magnetic fields at the plurality of measurement points 11, the following A-direction scanning and B-direction scanning are performed.

In the A-direction scanning, with the rotating table 74 in the C position, the movable frame 72 is moved from the B position to the A position with temporary stops at a predetermined plurality of positions including the B position and the A position. FIG. 28 shows how the movable frame 72 is moved. In FIG. 28, the plurality of positions at which the movable frame 72 is stopped between the B position and the A position are shown by broken lines. The intervals between the plurality of positions at which the movable frame 72 is stopped are equal to the distance between two adjacent measurement points 11 on the measurement surface 10. At each stop position of the movable frame 72, the arm 73 is moved along the frame body 72A and the orientation of the electromagnetic field probe 40 is adjusted to measure either the measurement-point electric fields or the measurement-point magnetic fields, or both, at the measurement points 11. In such a manner, at least either the measurement-point electric fields or the measurement-point magnetic fields at the measurement points 11 on three of the five planes constituting the measurement surface 10 are measured.

In the B-direction scanning, the rotating table 74 is brought into the D position. As a result, the relative position of the movable frame 72 with respect to the radiation source 2 is rotated by 90° in the rotational direction of the rotating table 74 relative to when the rotating table 74 is in the C position. Next, the movable frame 72 is moved from the A position to the B position with temporary stops at a predetermined plurality of positions including the A position and the B position. FIG. 29 shows how the movable frame 72 is moved. In FIG. 29, the plurality of positions at which the movable frame 72 is stopped between the A position and the B position are shown by broken lines. The intervals between the plurality of positions at which the movable frame 72 is stopped are equal to the distance between two adjacent measurement points 11 on the measurement surface 10. At each stop position of the movable frame 72, the arm 73 is moved along the two vertical portions of the frame body 72A and the orientation of the electromagnetic field probe 40 is adjusted to measure either the measurement-point electric fields or the measurement-point magnetic fields, or both, at the measurement points 11. In such a manner, at least either the measurement-point electric fields or the measurement-point magnetic fields at the measurement points 11 on two of the five planes constituting the measurement surface 10 where no measurement has been performed in the A-direction scanning are measured.

By performing the foregoing A-direction scanning and B-direction scanning, either the measurement-point electric fields or the measurement-point magnetic fields, or both, at all the measurement points 11 on the measurement surface 10 are measured. The operation of the far electromagnetic field estimation apparatus when measuring the measurement-point electric fields and/or the measurement-point magnetic fields at the plurality of measurement points 11 will be described in detail later.

Figure 30:
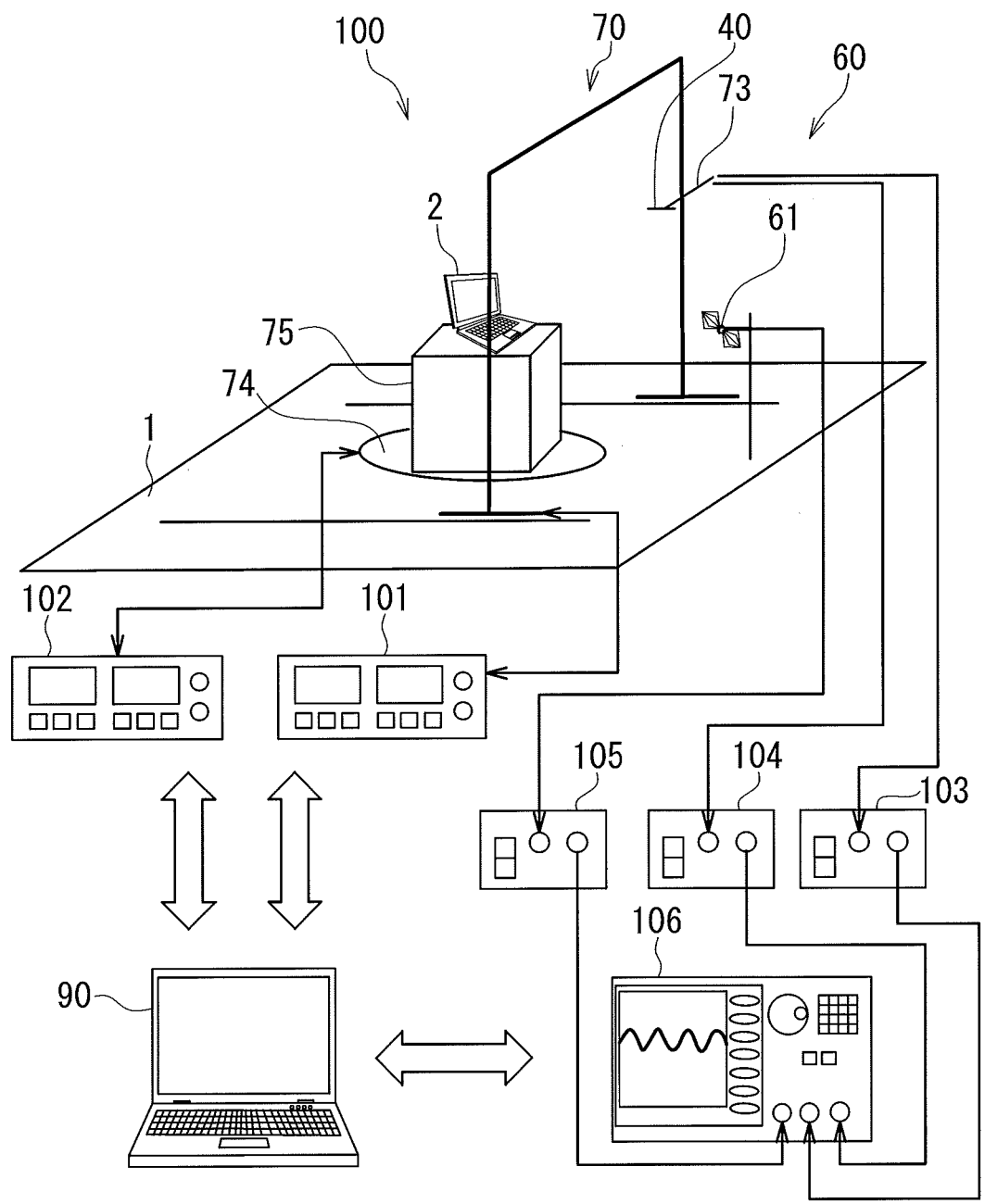
FIG. 30 is an explanatory diagram illustrating the configuration of a far electromagnetic field estimation apparatus according to the first embodiment of the invention.
Figure 31:
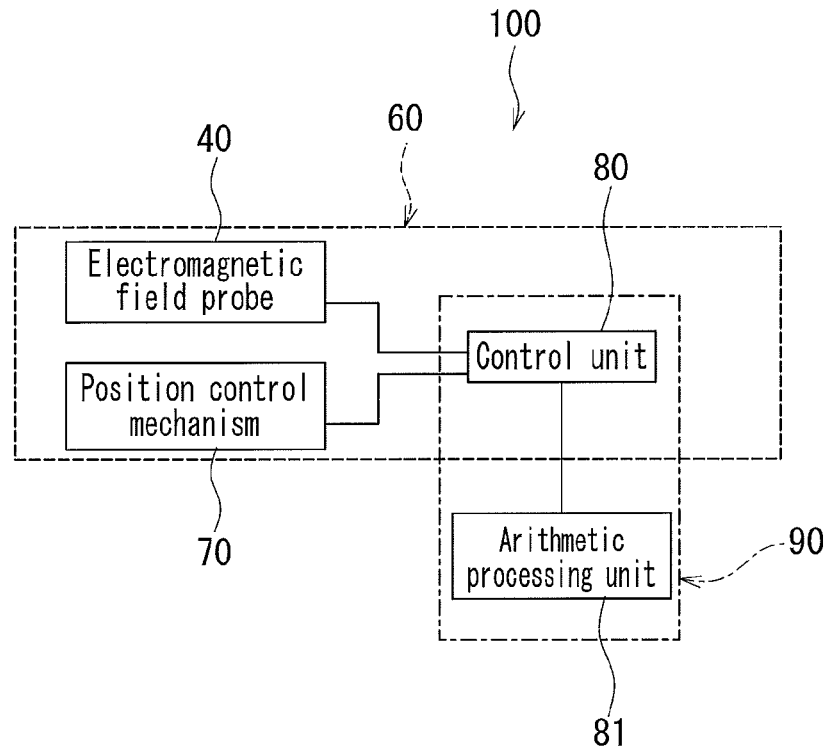
FIG. 31 is a block diagram illustrating the main components of the far electromagnetic field estimation apparatus according to the first embodiment of the invention.

The configuration of the far electromagnetic field estimation apparatus according to the first embodiment will now be described in detail with reference to FIG. 30 to FIG. 32. FIG. 30 is an explanatory diagram illustrating the configuration of the far electromagnetic field estimation apparatus. FIG. 31 is a block diagram illustrating the main components of the far electromagnetic field estimation apparatus. The far electromagnetic field estimation apparatus 100 according to the first embodiment includes the near electromagnetic field measurement apparatus 60 and an arithmetic processing unit 81 as shown in FIG. 31. The near electromagnetic field measurement apparatus 60 includes the electromagnetic field probe 40, the position control mechanism 70, and the control unit 80 to control measurement of at least either one of the electric field and the magnetic field performed using the electromagnetic field probe 40 and the position control mechanism 70. The processing to be performed by the arithmetic processing unit 81 will be described in detail later. In the first embodiment, the control unit 80 and the arithmetic processing unit 81 are implemented by a computer 90.

Figure 32:
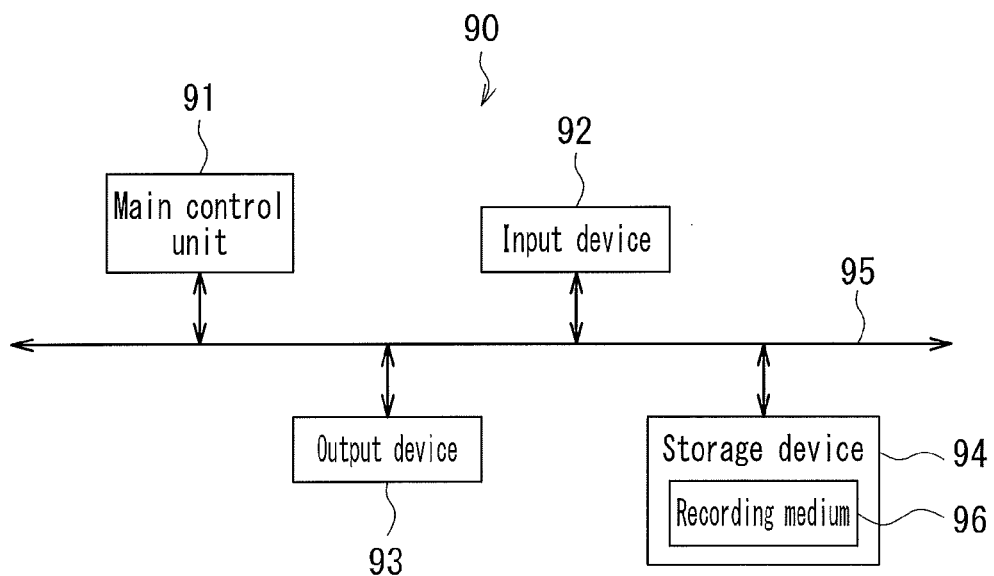
FIG. 32 is a block diagram illustrating the configuration of the computer of FIG. 31.

FIG. 32 is a block diagram illustrating a hardware configuration of the computer 90 in FIG. 31. The computer 90 includes a main control unit 91, an input device 92, an output device 93, a storage device 94, and a bus 95 connecting these. The main control unit 91 includes a central processing unit (CPU) and a random access memory (RAM). The input device 92 is used to enter information needed for the operation of the far electromagnetic field estimation apparatus and give instructions about various operations. The output device 93 is used to output (including to display) various types of information related to the operation of the far electromagnetic field estimation apparatus.

The storage device 94 may be of any form as long as information can be stored. Examples thereof may include a hard disk drive and an optical disk drive. The storage device 94 is configured to write data on a computer-readable recording medium 96 and read data from the recording medium 96. Examples of the recording medium 96 may include a hard disk and an optical disk. The recording medium 96 may be one with a program for implementing the control unit 80 and the arithmetic processing unit 81 shown in FIG. 31 stored thereon.

The main control unit 91 is configured, for example, to execute the program stored on the recording medium 96 of the storage device 94, thereby exercising the functions of the control unit 80 and the arithmetic processing unit 81 shown in FIG. 31. Note that the control unit 80 and the arithmetic processing unit 81 shown in FIG. 31 are not physically separate elements but implemented by software.

As shown in FIG. 30, the far electromagnetic field estimation apparatus 100 includes the reference point antenna 61 in addition to the near electromagnetic field measurement apparatus 60 and the arithmetic processing unit 81 (computer 90). The near electromagnetic field measurement apparatus 60 includes controllers 101 and 102, preamplifiers 103, 104 and 105, and a receiver 106 in addition to the electromagnetic field probe 40, the position control mechanism 70 and the control unit 80 (computer 90). Each of the controllers 101 and 102 and the receiver 106 is connected to the computer 90 via a communication cable, for example.

In response to instructions from the control unit 80 implemented by the computer 90, the controller 101 controls the driving device for moving the movable frame 72, the driving device for moving the arm 73, and the driving device for changing the orientation of the electromagnetic field probe 40 supported by the arm 73. In response to instructions from the control unit 80 implemented by the computer 90, the controller 102 controls the driving device for rotating the rotating table 74.

The preamplifiers 103 and 104 amplify the two signals constituting the differential signal output from the electric field detection unit 41 or the magnetic field detection unit 51 of the electromagnetic field probe 40, and transmit the amplified signals to the receiver 106. The preamplifier 105 amplifies the output signal from the reference point antenna 61 and transmits the amplified signal to the receiver 106. The receiver 106 generates a plurality of pieces of measurement data corresponding to the received signals. The plurality of pieces of measurement data are transmitted from the receiver 106 to the computer 90.

Figure 33:
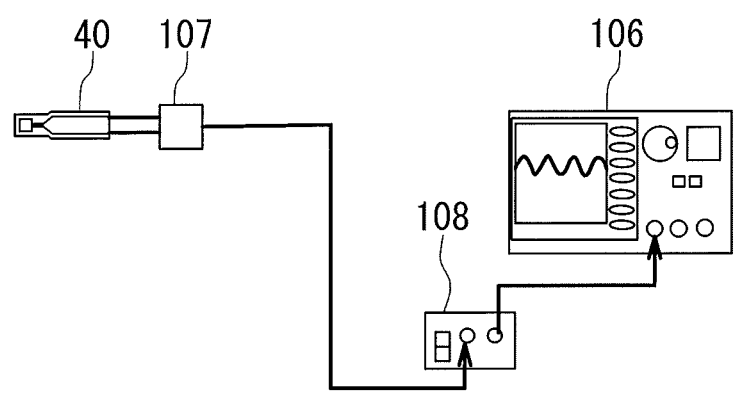
FIG. 33 is an explanatory diagram illustrating a modification example of the far electromagnetic field estimation apparatus shown in FIG. 30.

FIG. 33 is an explanatory diagram illustrating a modification example of the far electromagnetic field estimation apparatus 100 shown in FIG. 30. The far electromagnetic field estimation apparatus 100 of this modification example includes a 180-degree phase synthesizer 107 and a preamplifier 108 instead of the preamplifiers 103 and 104 in FIG. 30. The 180-degree phase synthesizer 107 synchronizes in phase and synthesizes the two signals constituting the differential signal output from the electric field detection unit 41 or the magnetic field detection unit 51 of the electromagnetic field probe 40 to generate an output signal. The preamplifier 108 amplifies the output signal from the 180-degree phase synthesizer 107 and transmits the amplified signal to the receiver 106. This modification example allows for a reduction in the number of reception channels of the receiver 106 by one as compared with the configuration shown in FIG. 30. To employ the configuration of the modification example, the electric field probe coefficient $PF_E$ and the magnetic field probe coefficient $PF_H$ need to have been determined in consideration of changes in amplitude and in phase due to the 180-degree phase synthesizer 107 and the preamplifier 108.

Now, the function of the reference point antenna 61 will be described. The reference point antenna 61 receives the electromagnetic waves radiated from the radiation source 2 and outputs a voltage responsive to the electric field of the electromagnetic waves as an output signal. The receiver 106 generates a reference voltage Vref corresponding to the output signal from the reference point antenna 61. The reference voltage Vref has an amplitude and a phase.

The receiver 106 generates a measurement voltage Vprobe on the basis of the differential signal output from the electric field detection unit 41 or the magnetic field detection unit 51 of the electromagnetic field probe 40. The measurement voltage Vprobe is a voltage corresponding to the electric field detected by the electric field detection unit 41 or the magnetic field detected by the magnetic field detection unit 51. The measurement voltage Vprobe has an amplitude and a phase.

The computer 90 converts the measurement voltage Vprobe into a signal referenced to the phase of the reference voltage Vref in the following manner. Specifically, if the measurement voltage Vprobe is one corresponding to the electric field, the computer 90 converts the measurement voltage Vprobe into an electric field signal E referenced to the phase of the reference voltage Vref by using the following Equation (7). Here, $PF_E$ is the electric field probe coefficient described previously.

$$E = (Vprobe/Vref) \cdot |Vref| \cdot PF_E \tag{7}$$

If the measurement voltage Vprobe is one corresponding to the magnetic field, the computer 90 converts the measurement voltage Vprobe into a magnetic field signal H referenced to the phase of the reference voltage Vref by using the following Equation (8). Here, $PF_H$ is the magnetic field probe coefficient described previously.

$$H = (Vprobe/Vref) \cdot |Vref| \cdot PF_H \tag{8}$$

In the first embodiment, the measurement-point electric fields are expressed by the electric field signal E, and the measurement-point magnetic fields are expressed by the magnetic field signal H. Consequently, even if the measurement-point electric fields and the measurement-point magnetic fields at the plurality of measurement points 11 are measured in different timing, the phases of the measurement-point electric fields and the measurement-point magnetic fields at the plurality of measurement points 11 can be expressed with reference to the phase of the reference voltage Vref.

The reception level of the reference point antenna 61 decreases at some frequencies due to the effect of reflected waves from the ground plane 1. The reference point antenna 61 is thus configured to be capable of changing the height and the distance from the radiation source 2. The relationship in phase between the electromagnetic waves radiated from the radiation source 2 and the electromagnetic waves received by the reference point antenna 61 is desirably stable. The reference point antenna 61 is thus desirably configured to be movable to follow the rotation of the rotating table 74 so that the radiation source 2 and the reference point antenna 61 have a constant positional relationship in the A-direction scanning shown in FIG. 28 and the B-direction scanning shown in FIG. 29.

The operation of the far electromagnetic field estimation apparatus 100 will now be described in detail. The control unit 80 of the near electromagnetic field measurement apparatus 60 performs the first operation and the second operation described above. The first operation corresponds to the first step of the far electromagnetic field estimation method according to the first embodiment. The second operation corresponds to the second step of the far electromagnetic field estimation method according to the first embodiment.

The arithmetic processing unit 81 performs first arithmetic processing and second arithmetic processing. The first arithmetic processing corresponds to the third step of the far electromagnetic field estimation method according to the first embodiment. The second arithmetic processing corresponds to the fourth step of the far electromagnetic field estimation method according to the first embodiment.

In the first arithmetic processing, the arithmetic processing unit 81 sets a plurality of mirror image measurement points 21 having a plane-symmetrical positional relationship with the plurality of measurement points 11 about the ground plane 1 on a mirror image measurement surface 20 having a plane-symmetrical positional relationship with the measurement surface 10 about the ground plane 1, and calculates either a plurality of mirror image measurement-point electric fields or a plurality of mirror image measurement-point magnetic fields, or both, on the basis of either the plurality of measurement-point electric fields or the plurality of measurement-point magnetic fields, or both, measured by the second operation. The plurality of mirror image measurement-point electric fields are components of electric fields in the tangential directions of the mirror image measurement surface 20 at the plurality of mirror image measurement points 21. The plurality of mirror image measurement-point magnetic fields are components of magnetic fields in the tangential directions of the mirror image measurement surface 20 at the plurality of mirror image measurement points 21.

In the second arithmetic processing, the arithmetic processing unit 81 calculates at least either one of the electric field and the magnetic field that are estimated to be formed at the virtual observation point 3, on the basis of either the plurality of measurement-point electric fields or the plurality of measurement-point magnetic fields, or both, measured by the second operation, and either the plurality of mirror image measurement-point electric fields or the plurality of mirror image measurement-point magnetic fields, or both, calculated by the first arithmetic processing.

A series of steps of the far electromagnetic field estimation method implemented by using the far electromagnetic field estimation apparatus 100 will be described below. The series of steps of the far electromagnetic field estimation method is broadly divided into measurement processing and subsequent arithmetic processing. The measurement processing includes the first and second steps of the far electromagnetic field estimation method. The measurement processing also includes the execution of the first and second operations by the control unit 80. The arithmetic processing includes the third and fourth steps of the far electromagnetic field estimation method. The arithmetic processing also includes the execution of the first and second arithmetic processing by the arithmetic processing unit 81.

Figure 34:
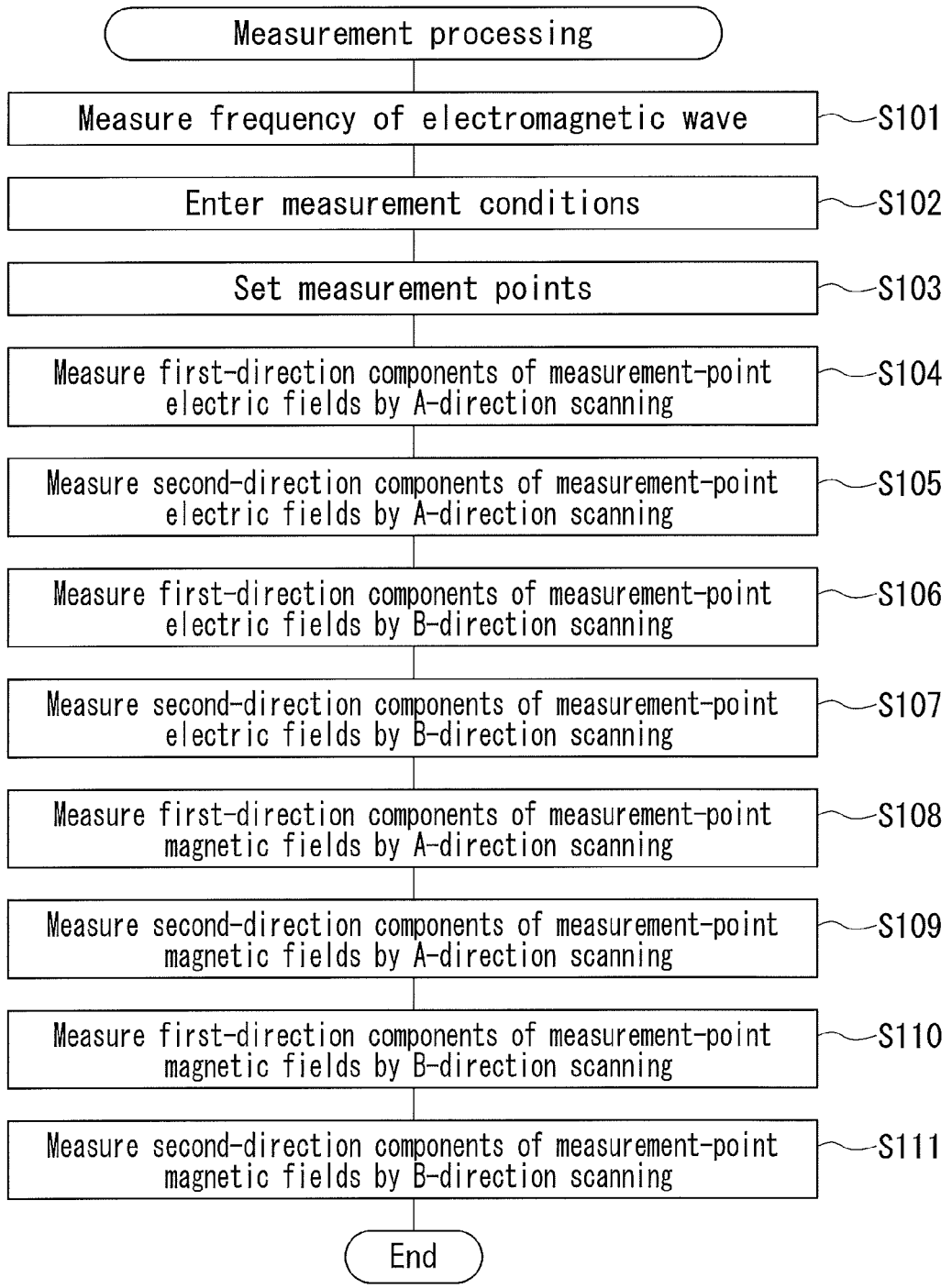
FIG. 34 is a flowchart illustrating measurement processing in the far electromagnetic field estimation method according to the first embodiment of the invention.

The measurement processing will be described in detail below by using an example where both the measurement-point electric fields and the measurement-point magnetic fields at the plurality of measurement points 11 are measured in the second step (the second operation). FIG. 34 is a flowchart illustrating the measurement processing. As shown in FIG. 34, the measurement processing starts with step S101 in which the receiver 106 measures the frequency of the electromagnetic waves radiated from the radiation source 2 on the basis of the output signal from the reference point antenna 61. The wavelength of the electromagnetic waves, which is needed when determining the far electromagnetic field later using Equations (3) and (4), is determined on the basis of the frequency of the electromagnetic waves.

Next, in step S102, the operator enters measurement conditions into the computer 90. The measurement conditions include the frequency of the electromagnetic waves, information on the shape of the measurement surface 10, and the distance between two adjacent measurement points 11 on the measurement surface 10.

Next, in step S103, the control unit 80 assumes the measurement surface 10 and sets a plurality of measurement points 11 on the measurement surface 10. Step S103 corresponds to the first step and the first operation. Suppose here that the measurement surface 10 is constituted by the five planes 10a, 10b, 10c, 10d, and 10e shown in FIG. 6. As the tangential directions of the measurement surface 10, a first direction and a second direction will be defined as follows. On the planes 10a and 10b, the Z direction is the first direction and the Y direction is the second direction. On the planes 10c and 10d, the X direction is the first direction and the Y direction is the second direction. On the plane 10e, the Z direction is the first direction and the X direction is the second direction.

Next, in step S104, the A-direction scanning which has been described with reference to FIG. 28 is performed to measure the first-direction components of the measurement-point electric fields at the plurality of measurement points 11. Next, in step S105, the A-direction scanning is performed to measure the second-direction components of the measurement-point electric fields at the plurality of measurement points 11. Next, in step S106, the B-direction scanning which has been described with reference to FIG. 29 is performed to measure the first-direction components of the measurement-point electric fields at the plurality of measurement points 11. Next, in step S107, the B-direction scanning is performed to measure the second-direction components of the measurement-point electric fields at the plurality of measurement points 11. In each of steps S104 to S107, before the measurement, the orientation of the electromagnetic field probe 40 is adjusted so that the components of the measurement-point electric fields to be measured in the step can be detected, and the differential signal from the electric field detection unit 41 is set to be input to the preamplifiers 103 and 104 or the 180-degree phase synthesizer 107.

Next, in step S108, the A-direction scanning is performed to measure the first-direction components of the measurement-point magnetic fields at the plurality of measurement points 11. Next, in step S109, the A-direction scanning is performed to measure the second-direction components of the measurement-point magnetic fields at the plurality of measurement points 11. Next, in step S110, the B-direction scanning is performed to measure the first-direction components of the measurement-point magnetic fields at the plurality of measurement points 11. Next, in step S111, the B-direction scanning is performed to measure the second-direction components of the measurement-point magnetic fields at the plurality of measurement points 11. The measurement processing thus ends. In each of steps S108 to S111, before the measurement, the orientation of the electromagnetic field probe 40 is adjusted so that the components of the measurement-point magnetic fields to be measured in the step can be detected, and the differential signal from the magnetic field detection unit 51 is set to be input to the preamplifiers 103 and 104 or the 180-degree phase synthesizer 107.

In each of steps S104 to S111, the control unit 80 converts the voltages corresponding to the first-direction components or the second-direction components of the measurement-point electric fields or the measurement-point magnetic fields obtained by the measurement into the electric field signal E or the magnetic field signal H by using Equation (7) or (8). The resultant electric field signal E or magnetic field signal H serves as information on the first-direction components or the second-direction components of the measurement-point electric fields or the measurement-point magnetic fields. The control unit 80 stores this information in association with the positions of the measurement points 11 and the directions of the components of the measurement-point electric fields or the measurement-point magnetic fields. Steps S104 to S111 correspond to the second step and the second operation.

By the foregoing measurement processing, information on the amplitudes and phases of the components of the measurement-point electric fields and the measurement-point magnetic fields in the three directions, i.e., the X, Y, and Z directions, is obtained at all the measurement points 11 on the measurement surface 10. Such information concerning the measurement-point electric fields and the measurement-point magnetic fields at the measurement points 11 corresponds to the electric field E expressed as a vector in Equation (2) and the magnetic field H expressed as a vector in Equation (1).

Figure 35:
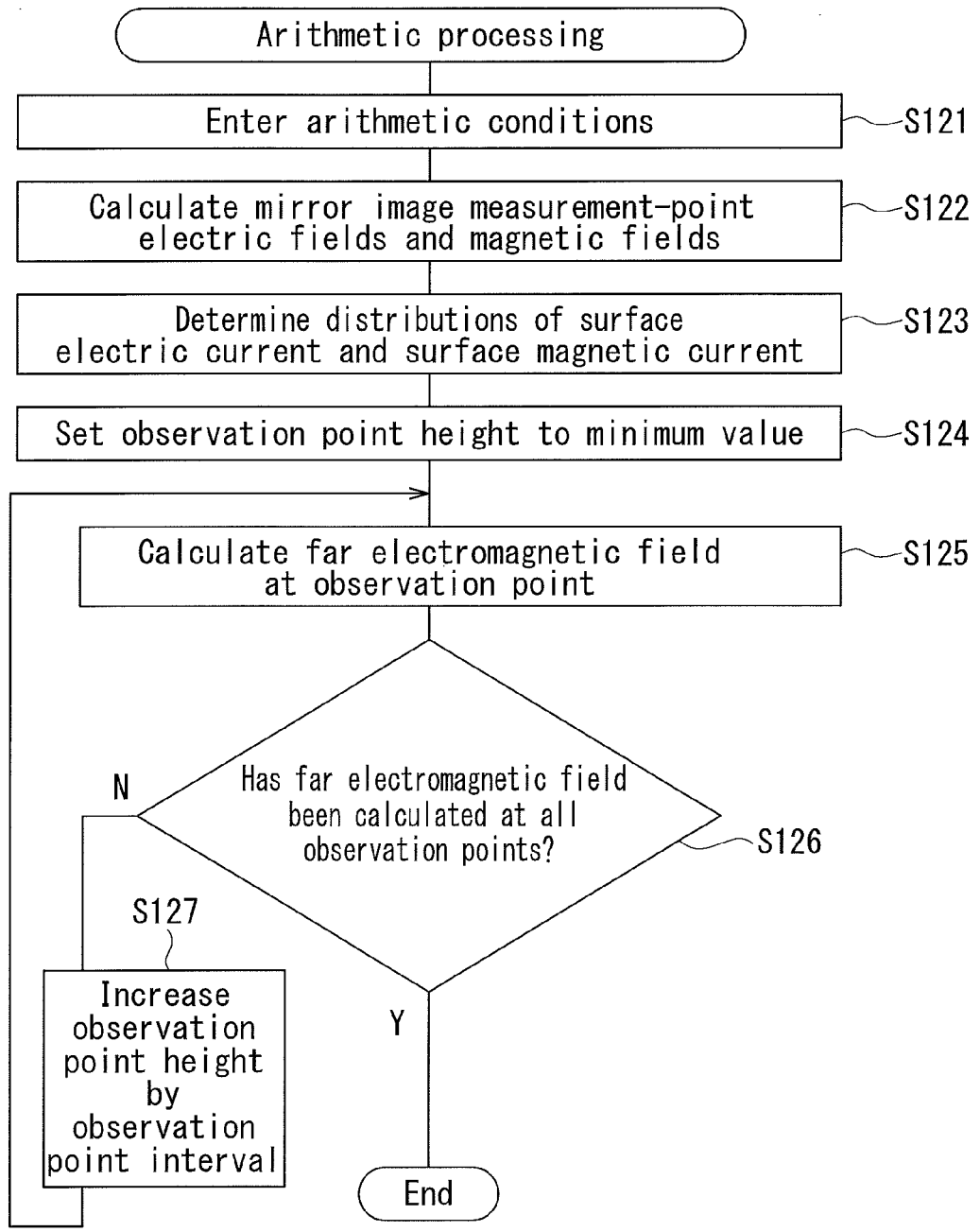
FIG. 35 is a flowchart illustrating arithmetic processing in the far electromagnetic field estimation method according to the first embodiment of the invention.

Next, the arithmetic processing will be described in detail. FIG. 35 is a flowchart illustrating the arithmetic processing. As shown in FIG. 35, the arithmetic processing starts with step S121 in which the operator enters arithmetic conditions. The arithmetic conditions include the height of the radiation source 2, the horizontal distance from the radiation source 2 to the virtual observation point 3, the range of the observation point height, and the interval between a plurality of observation points (hereinafter referred to as the observation point interval) set within the range. In a test according to the EMC standards, the range of the observation point height is from 1 m to 4 m.

Next, in step S122, the arithmetic processing unit 81 performs the first arithmetic processing. More specifically, the arithmetic processing unit 81 sets a plurality of mirror image measurement points 21 on the mirror image measurement surface 20, and calculates a plurality of mirror image measurement-point electric fields and a plurality of mirror image measurement-point magnetic fields at the plurality of mirror image measurement points 21 on the basis of the plurality of measurement-point electric fields and the plurality of measurement-point magnetic fields measured by the second operation. Like the measurement-point electric fields and the measurement-point magnetic fields, the phases of the mirror image measurement-point electric fields and the mirror image measurement-point magnetic fields are expressed with reference to the phase of the reference voltage Vref.

Next, in step S123, the arithmetic processing unit 81 determines the distributions of the surface electric current Js and the surface magnetic current Ms on the surface 30 by using Equations (1) and (2) on the basis of the plurality of measurement-point electric fields, the plurality of measurement-point magnetic fields, the plurality of mirror image measurement-point electric fields, and the plurality of mirror image measurement-point magnetic fields.

Next, in step S124, the arithmetic processing unit 81 sets the observation point height to the minimum value within the range of the observation point height entered.

Next, in step S125, the arithmetic processing unit 81 determines the distance from the radiation source 2 to the observation point 3 from the height of the radiation source 2, the horizontal distance from the radiation source 2 to the observation point 3, and the observation point height. Next, the arithmetic processing unit 81 calculates the far electromagnetic field at the observation point 3 from the distributions of the surface electric current Js and the surface magnetic current Ms on the surface 30 by using Equations (3) and (4), and stores the information. In a test according to the EMC standards, the electric field strength at the observation point 3 is calculated and stored in step S125, in particular.

While Equations (1) to (4) are expressed by using vectors, the actual calculations by the arithmetic processing unit 81 using Equations (1) to (4) are performed for each of the X-, Y-, and Z-direction components.

Next, in step S126, the arithmetic processing unit 81 determines whether the far electromagnetic field has been calculated at all the observation points 3 set within the range of the observation point height. If the far electromagnetic field has been calculated at all the observation points 3 (Y), the arithmetic processing unit 81 ends the arithmetic processing.

In step S126, if the far electromagnetic field has not been calculated at all the observation points 3 (N), then in step S127, the arithmetic processing unit 81 increases the observation point height by the observation point interval and returns to step S125. Steps S123 to S127 correspond to the fourth step and the second arithmetic processing.

The foregoing arithmetic processing thus determines the far electromagnetic fields at the plurality of observation points 3 set within the range of the observation point height entered.

In the example shown in FIG. 34 and FIG. 35, both the measurement-point electric fields and the measurement-point magnetic fields at the plurality of measurement points 11 are measured to calculate the far electromagnetic field at the observation point 3. In the first embodiment, however, the far electromagnetic field at the observation point 3 may be calculated by measuring either the measurement-point electric fields or the measurement-point magnetic fields, not both, at the plurality of measurement points 11. For example, the amplitudes and phases of either one of the measurement-point electric fields and the measurement-point magnetic fields at the plurality of measurement points 11 may be measured to determine by calculation the amplitudes and phases of the other of the measurement-point electric fields and the measurement-point magnetic fields using the measurement results, the ratio $PF_{Em}/PF_{Hm}$ and the difference $PF_{Ep}-PF_{Hp}$ described previously. Then, the far electromagnetic field at the observation point 3 may be calculated on the basis of the measurement-point electric fields and the measurement-point magnetic fields thus obtained by measurement and calculation. In such a case, either steps S104 to S107 or steps S108 to S111 of the measurement processing shown in FIG. 34 can be omitted.

More specifically, in such a case, only either the plurality of measurement-point electric fields or the plurality of measurement-point magnetic fields, not both, are measured in the second step (the second operation). In the third step (the first arithmetic processing), the plurality of measurement-point electric fields or magnetic fields not measured in the second step (the second operation) are calculated by using the measured plurality of measurement-point electric fields or magnetic fields, the ratio $PF_{Em}/PF_{Hm}$, and the difference $PF_{Ep}-PF_{Hp}$. In the third step (the first arithmetic processing), further, the plurality of mirror image measurement-point electric fields and the plurality of mirror image measurement-point magnetic fields are calculated on the basis of the measured plurality of measurement-point electric fields or magnetic fields and the calculated plurality of measurement-point electric fields or magnetic fields. In the fourth step (the second arithmetic processing), the far electromagnetic field at the observation point 3 is calculated on the basis of the plurality of measurement-point electric fields or magnetic fields measured by the second step (the second operation), the plurality of measurement-point electric fields or magnetic fields calculated by the third step (the first arithmetic processing), and the plurality of mirror image measurement-point electric fields and magnetic fields calculated by the third step (the first arithmetic processing).

In the first embodiment, the far electromagnetic field at the observation point 3 may be calculated by using Schelkunoff's equivalence theorem instead of Love's equivalence theorem. In such a case, the far electromagnetic field at the observation point 3 can be calculated by using only either the distribution of the surface electric current Js or the distribution of the surface magnetic current Ms on the surface 30. Methods for calculating the far electromagnetic field at the observation point 3 by using Schelkunoff's equivalence theorem will be described below.

First, the method for calculating the far electromagnetic field at the observation point 3 by using only the distribution of the surface electric current Js on the surface 30 will be described. In this case, the surface 30 is assumed to be a magnetic wall. In the second step (the second operation), only the plurality of measurement-point magnetic fields are measured. In the third step (the first arithmetic processing), only the plurality of mirror image measurement-point magnetic fields are calculated on the basis of the plurality of measurement-point magnetic fields measured. In the fourth step (the second arithmetic processing), only the distribution of the surface electric current Js on the surface 30 is determined on the basis of the plurality of measurement-point magnetic fields and the plurality of mirror image measurement-point magnetic fields by using the relationship that Js=2n×H and Ms=0, instead of Equations (1) and (2). In the fourth step (the second arithmetic processing), further, the far electromagnetic field at the observation point 3 is calculated from the distribution of the surface electric current Js on the surface 30 by letting Ms=0 in Equations (3) and (4).

Next, the method for calculating the far electromagnetic field at the observation point 3 by using only the distribution of the surface magnetic current Ms on the surface 30 will be described. In this case, the surface 30 is assumed to be an electric wall. In the second step (the second operation), only the plurality of measurement-point electric fields are measured. In the third step (the first arithmetic processing), only the plurality of mirror image measurement-point electric fields are calculated on the basis of the plurality of measurement-point electric fields measured. In the fourth step (the second arithmetic processing), only the distribution of the surface magnetic current Ms on the surface 30 is determined on the basis of the plurality of measurement-point electric fields and the plurality of mirror image measurement-point electric fields by using the relationship that Js=0 and Ms=−2n×E, instead of Equations (1) and (2). In the fourth step (the second arithmetic processing), further, the far electromagnetic field at the observation point 3 is calculated from the distribution of the surface magnetic current Ms on the surface 30 by letting Js=0 in Equations (3) and (4).

Second Embodiment

Figure 36:
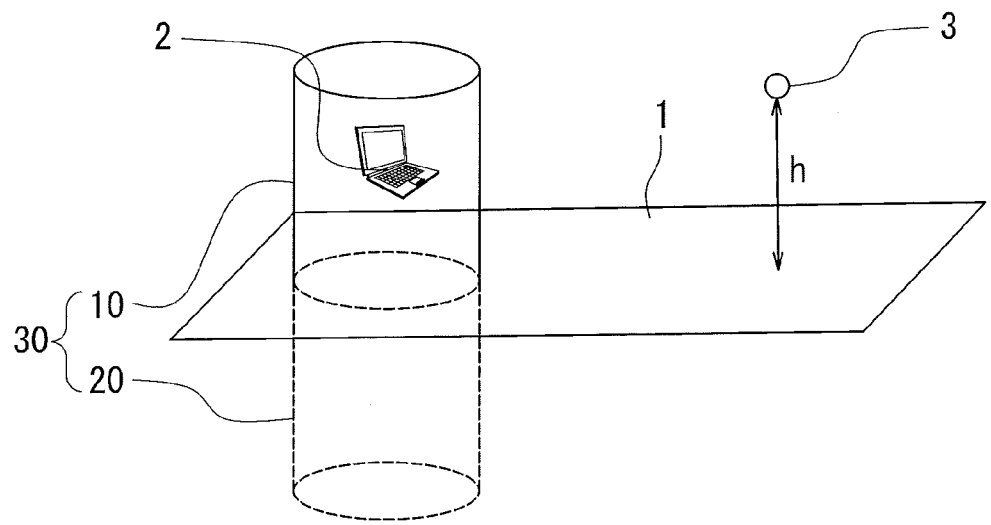
FIG. 36 is an explanatory diagram for explaining an overview of a far electromagnetic field estimation method according to a second embodiment of the invention.

A second embodiment of the invention will now be described. FIG. 36 is an explanatory diagram for explaining an overview of a far electromagnetic field estimation method according to the second embodiment. As shown in FIG. 36, the second embodiment differs from the first embodiment in the shape of the measurement surface 10. More specifically, the measurement surface 10 of the second embodiment is constituted by a cylindrical surface and a circular surface that closes an opening present at one axial end of the cylindrical surface. The measurement surface 10 is arranged in such an orientation that an opening present at the other axial end of the cylindrical surface is closed by the ground plane 1. As a result, the measurement surface 10 forms a closed surface in combination with the ground plane 1. The measurement surface 10 and the mirror image measurement surface 20, in combination, form a closed surface 30. The closed surface 30 has a shape formed by a cylindrical surface and two circular surfaces that close the two openings present at opposite axial ends of the cylindrical surface.

Figure 37:
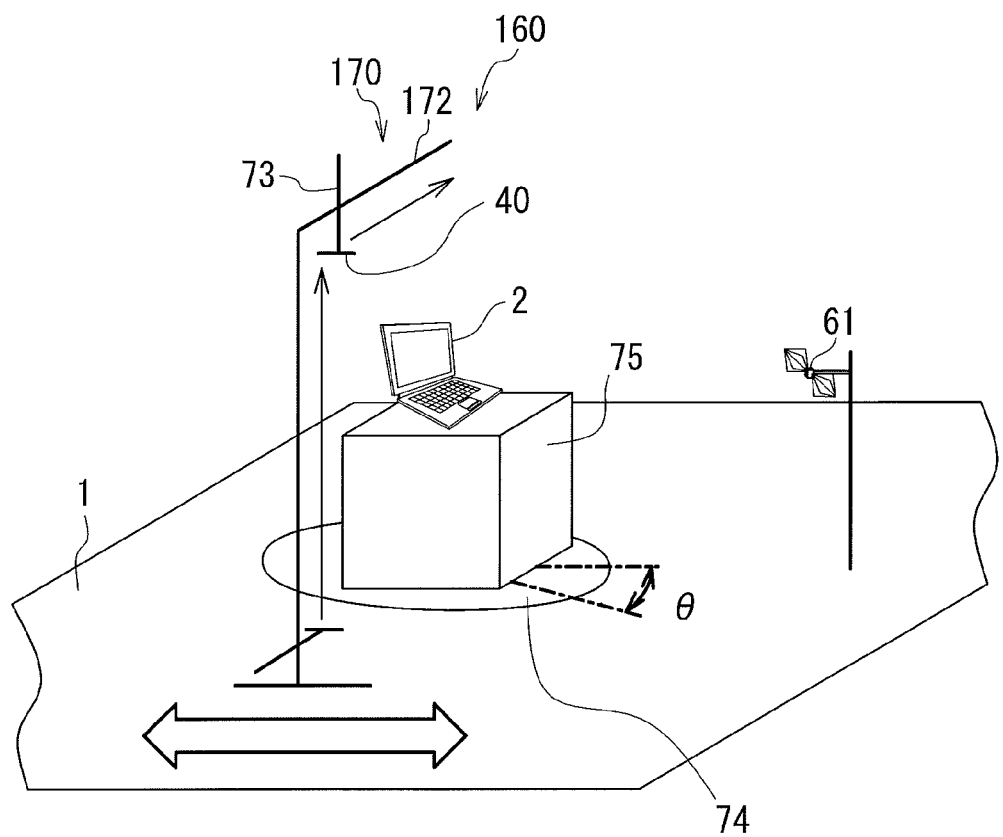
FIG. 37 is a perspective view illustrating a near electromagnetic field measurement apparatus according to the second embodiment of the invention.

FIG. 37 is a perspective view illustrating a near electromagnetic field measurement apparatus according to the second embodiment. The near electromagnetic field measurement apparatus 160 according to the second embodiment includes a position control mechanism 170 instead of the position control mechanism 70 of the near electromagnetic field measurement apparatus 60 according to the first embodiment.

The position control mechanism 170 includes a frame 172 fixed to the ground plane 1, instead of the rails 71, 71 and the movable frame 72 of the first embodiment. The frame 172 includes a vertical portion extending vertically, and a horizontal portion extending horizontally from the top end of the vertical portion. The arm 73 to support the electromagnetic field probe 40 is movable along the frame 172.

Figure 38:
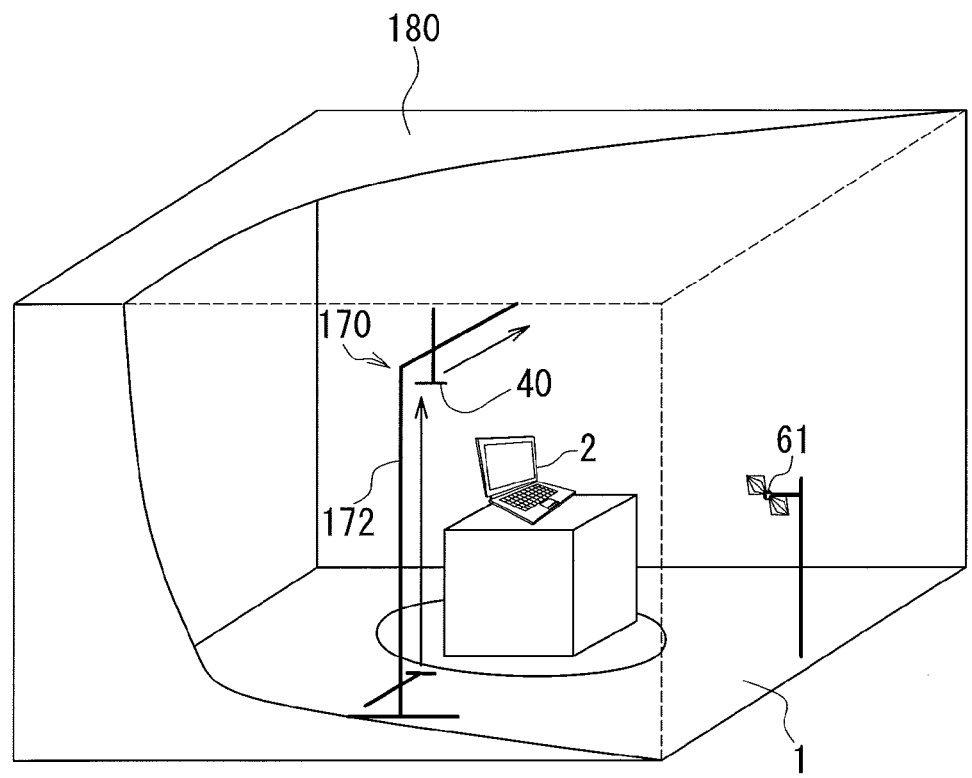
FIG. 38 is a perspective view illustrating an example of arrangement of the near electromagnetic field measurement apparatus shown in FIG. 37.

FIG. 38 is a perspective view illustrating an example of arrangement of the near electromagnetic field measurement apparatus 160 shown in FIG. 37. In this example, the radiation source 2, the electromagnetic field probe 40, the position control mechanism 170 and the reference point antenna 61 are disposed in a radio anechoic chamber 180 having a metal floor surface constituting the ground plane 1.

Figure 39:
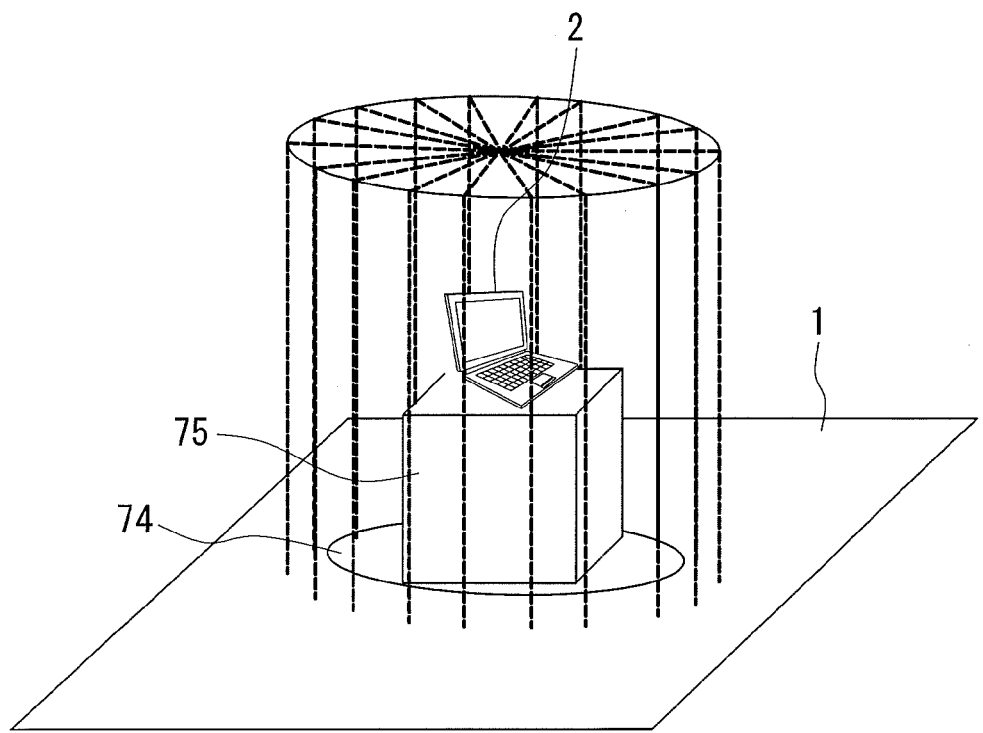
FIG. 39 is an explanatory diagram for explaining the arrangement of a plurality of measurement points in the second embodiment of the invention.

FIG. 39 is an explanatory diagram for explaining the arrangement of a plurality of measurement points 11 in the second embodiment. In FIG. 39, the plurality of broken lines drawn to surround the radiation source 2 represent the positions where the plurality of measurement points 11 are arranged. In the second embodiment, as shown in FIG. 39, some of the plurality of measurement points 11 are arranged on the circular surface in a radial pattern from the center of the circle. Some of the rest of the plurality of measurement points 11 are arranged in a plurality of rows on the cylindrical surface. The rows are parallel to the axial direction of the cylindrical surface. The intervals between every two adjacent rows on the measurement surface 10 are constant.

The plurality of measurement points 11 are arranged to be aligned in two intersecting directions on the measurement surface 10. More specifically, in the second embodiment, some of the plurality of measurement points 11 are arranged on the circular surface constituting part of the measurement surface 10 in such a manner as to be aligned in circumferential directions and radial directions of a plurality of concentric circles. On the cylindrical surface constituting part of the measurement surface 10, some of the rest of the plurality of measurement points 11 are arranged to be aligned in a direction parallel to the axial direction of the cylindrical surface and a circumferential direction of the cylindrical surface. In each of the two directions in which the measurement points 11 are aligned, the distance between two adjacent measurement points 11 on the measurement surface 10 is greater than 0 and smaller than or equal to ½ of the wavelength of the electromagnetic waves.

In each of the circular surface and the cylindrical surface constituting the measurement surface 10, ones of the plurality of measurement points 11 that are adjacent to the boundary with the other surface are preferably positioned extremely close to the boundary.

Now, the operation of the near electromagnetic field measurement apparatus 160 when used in measuring either the measurement-point electric fields or the measurement-point magnetic fields, or both, at the plurality of measurement points 11 will be described with reference to FIG. 37 and FIG. 39. In the second embodiment, as shown in FIG. 37, with the rotating table 74 in a predetermined initial position, the arm 73 is moved along the frame 172 and the orientation of the electromagnetic field probe 40 is adjusted to measure either the measurement-point electric fields or the measurement-point magnetic fields, or both, at the measurement points 11. Next, the rotating table 74 is rotated by a predetermined angle θ. Then, the arm 73 is moved along the frame 172 and the orientation of the electromagnetic field probe 40 is adjusted to measure either the measurement-point electric fields or the measurement-point magnetic fields, or both, at the measurement points 11. Such an operation is repeated to measure at least either the measurement-point electric fields or the measurement-point magnetic fields at the plurality of measurement points 11 on the plurality of broken lines shown in FIG. 39.

In the second embodiment, the positions of the measurement points 11 and the directions of the measurement-point electric fields and the measurement-point magnetic fields (the tangential directions of the measurement surface 10) are expressed in a cylindrical coordinate system, for example. In this case, the positions of the measurement points 11 and the directions of the measurement-point electric fields and the measurement-point magnetic fields can be transformed into respective positions and directions expressed in the XYZ coordinate system of the first embodiment by using a cylindrical coordinate transformation. This enables the same arithmetic processing as that of the first embodiment.

The remainder of configuration, function and effects of the second embodiment are similar to those of the first embodiment.

Third Embodiment

Figure 40:
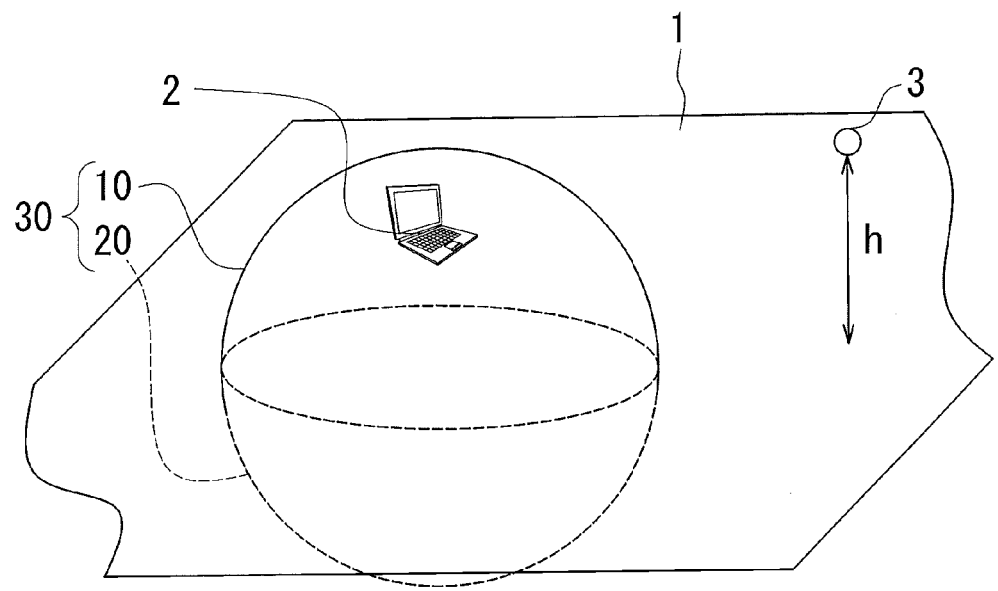
FIG. 40 is an explanatory diagram for explaining an overview of a far electromagnetic field estimation method according to a third embodiment of the invention.

A third embodiment of the invention will now be described. FIG. 40 is an explanatory diagram for explaining an overview of a far electromagnetic field estimation method according to the third embodiment. As shown in FIG. 40, the third embodiment differs from the first embodiment in the shape of the measurement surface 10. More specifically, the measurement surface 10 of the third embodiment is a semispherical surface which is a half of a spherical surface. The measurement surface 10 is arranged in such an orientation that the opening of the semispherical surface is closed by the ground plane 1. As a result, the measurement surface 10 forms a closed surface in combination with the ground plane 1. The measurement surface 10 and the mirror image measurement surface 20, in combination, form a closed surface 30. The closed surface 30 is a spherical surface.

Figure 41:
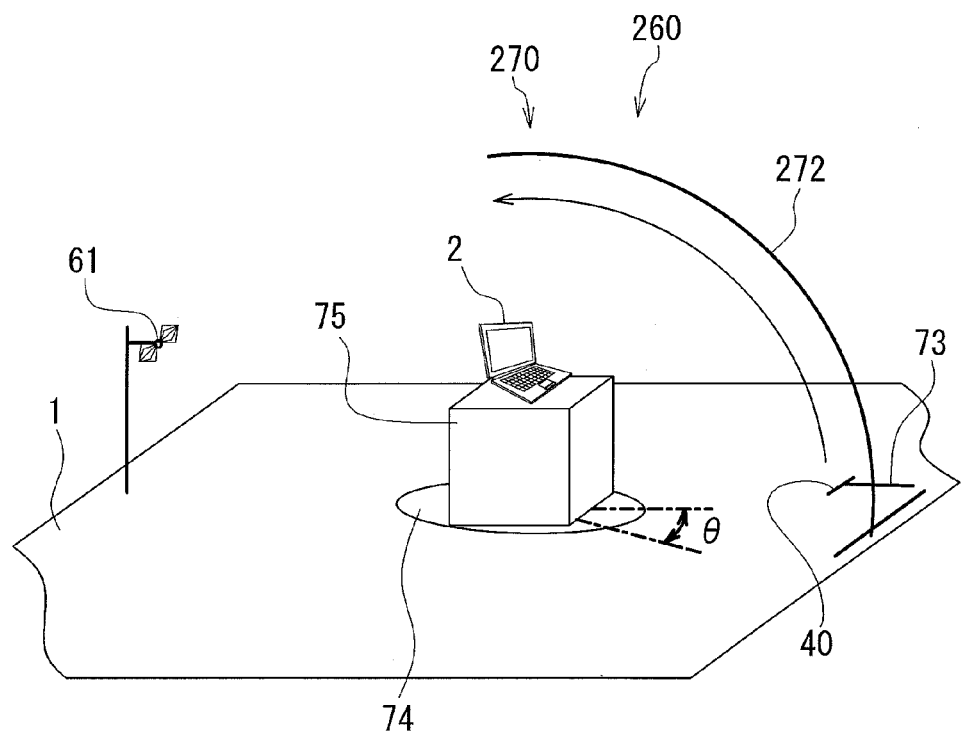
FIG. 41 is a perspective view of a near electromagnetic field measurement apparatus according to the third embodiment of the invention.

FIG. 41 is a perspective view illustrating a near electromagnetic field measurement apparatus according to the third embodiment. The near electromagnetic field measurement apparatus 260 according to the third embodiment includes a position control mechanism 270 instead of the position control mechanism 70 of the near electromagnetic field measurement apparatus 60 according to the first embodiment.

The position control mechanism 270 includes a frame 272 fixed to the ground plane 1, instead of the rails 71, 71 and the movable frame 72 of the first embodiment. The frame 272 has an arc shape and extends from the ground plane 1 to a position above the radiation source 2. The arm 73 to support the electromagnetic field probe 40 is movable along the frame 272.

Figure 42:
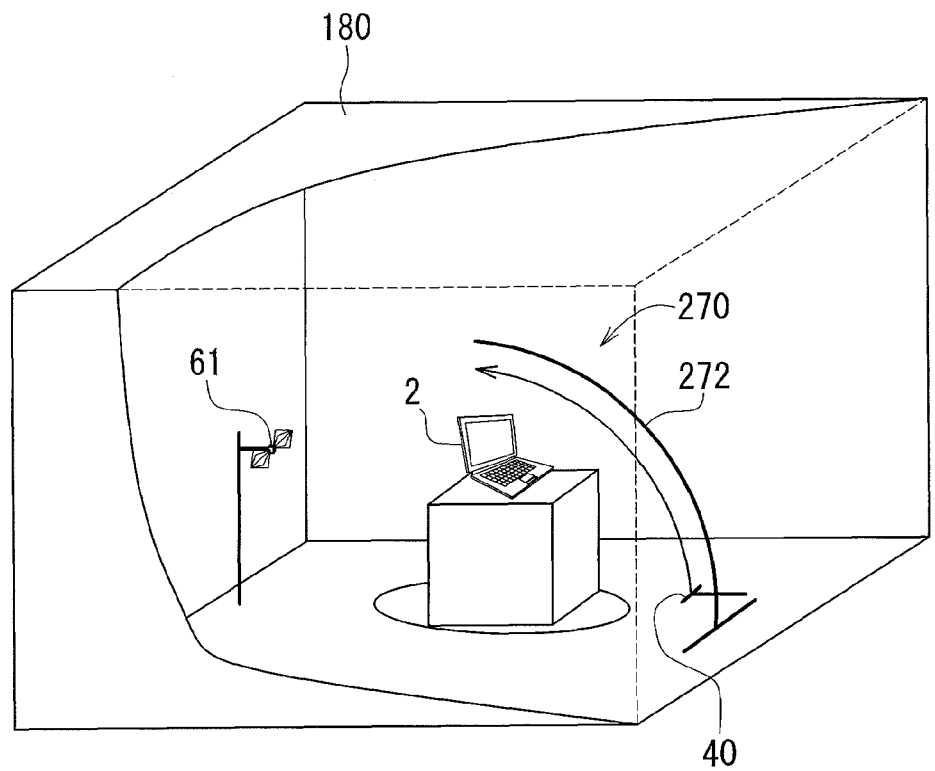
FIG. 42 is a perspective view illustrating an example of arrangement of the near electromagnetic field measurement apparatus shown in FIG. 41.

FIG. 42 is a perspective view illustrating an example of arrangement of the near electromagnetic field measurement apparatus 260 shown in FIG. 41. In this example, the radiation source 2, the electromagnetic field probe 40, the position control mechanism 270 and the reference point antenna 61 are disposed in a radio anechoic chamber 180 having a metal floor surface constituting the ground plane 1.

Figure 43:
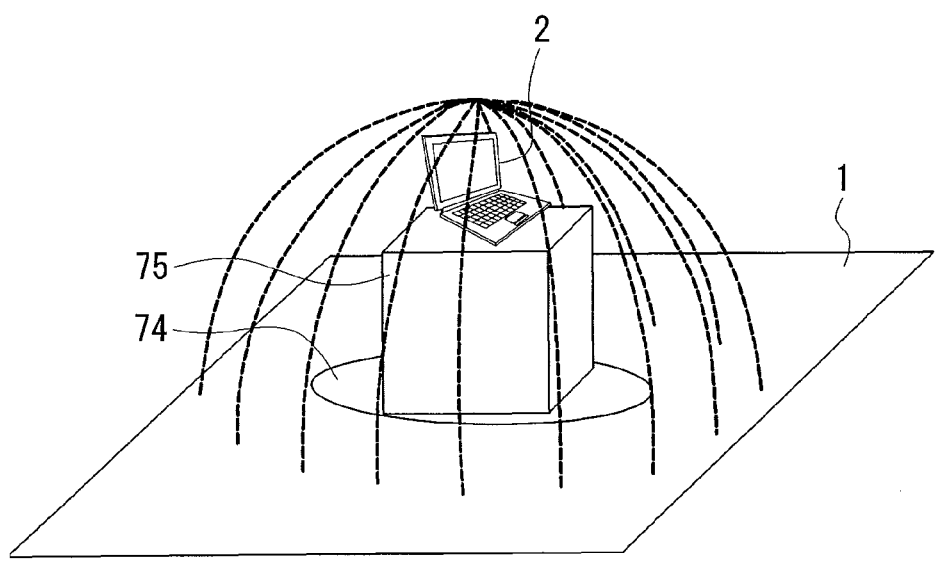
FIG. 43 is an explanatory diagram for explaining the operation of the near electromagnetic field measurement apparatus shown in FIG. 41.

FIG. 43 is an explanatory diagram for explaining the arrangement of a plurality of measurement points 11 in the third embodiment. In FIG. 43, the plurality of broken lines drawn to surround the radiation source 2 represent the positions where the plurality of measurement points 11 are arranged. As shown in FIG. 43, in the third embodiment the plurality of measurement points 11 are arranged on a plurality of arcs. The plurality of arcs extend from a plurality of points arranged at regular intervals on a circle formed by the semispherical surface and the ground plane 1 contacting each other to the apex of the semispherical surface above the radiation source 2.

The plurality of measurement points 11 are arranged to be aligned in two intersecting directions on the measurement surface 10. More specifically, in the third embodiment, the plurality of measurement points 11 are arranged on the semispherical surface constituting the measurement surface 10 in such a manner as to be aligned in circumferential directions of a plurality of concentric circles and in directions along the plurality of arcs. The plurality of concentric circles are about an axis that passes through the apex of the semispherical surface and is perpendicular to the ground plane 1. In each of the two directions in which the measurement points 11 are aligned, the distance between two adjacent measurement points 11 on the measurement surface 10 is greater than 0 and smaller than or equal to ½ of the wavelength of the electromagnetic waves.

Now, the operation of the near electromagnetic field measurement apparatus 260 when used in measuring either the measurement-point electric fields or the measurement-point magnetic fields, or both, at the plurality of measurement points 11 will be described with reference to FIG. 41 and FIG. 43. In the third embodiment, as shown in FIG. 41, with the rotating table 74 in a predetermined initial position, the arm 73 is moved along the frame 272 and the orientation of the electromagnetic field probe 40 is adjusted to measure either the measurement-point electric fields or the measurement-point magnetic fields, or both, at the measurement points 11. Next, the rotating table 74 is rotated by a predetermined angle θ. Then, the arm 73 is moved along the frame 272 and the orientation of the electromagnetic field probe 40 is adjusted to measure either the measurement-point electric fields or the measurement-point magnetic fields, or both, at the measurement points 11. Such an operation is repeated to measure at least either the measurement-point electric fields or the measurement-point magnetic fields at the plurality of measurement points 11 on the plurality of broken lines shown in FIG. 43.

In the third embodiment, the positions of the measurement points 11 and the directions of the measurement-point electric fields and the measurement-point magnetic fields (the tangential directions of the measurement surface 10) are expressed in a spherical coordinate system, for example. In this case, the positions of the measurement points 11 and the directions of the measurement-point electric fields and the measurement-point magnetic fields can be transformed into respective positions and directions expressed in the XYZ coordinate system of the first embodiment by using a spherical coordinate transformation. This enables the same arithmetic processing as that of the first embodiment.

The remainder of configuration, function and effects of the third embodiment are similar to those of the first embodiment.

The present invention is not limited to the foregoing embodiments, and various modifications may be made thereto. For example, the measurement surface 10 may have any shape as long as the measurement surface 10 in combination with the ground plane 1 can form a closed surface surrounding the radiation source 2 and the virtual observation point 3 is outside the space formed inside the closed surface.

It is apparent that the present invention can be carried out in various forms and modifications in the light of the foregoing descriptions. Accordingly, within the scope of the following claims and equivalents thereof, the present invention can be carried out in forms other than the foregoing most preferable embodiments.

What is claimed is:

1. A far electromagnetic field estimation method for determining at least either one of an electric field and a magnetic field that are estimated to be formed by a radiation source of an electromagnetic wave at a virtual observation point distant from the radiation source, the radiation source being located in either one of two spaces sectioned by a ground plane, the method comprising:
 a first step of assuming a measurement surface and setting a plurality of measurement points on the measurement surface, the measurement surface forming a closed surface in combination with the ground plane, the closed surface surrounding the radiation source, the virtual observation point being outside a space formed inside the closed surface;
 a second step of measuring either a plurality of measurement-point electric fields or a plurality of measurement-point magnetic fields, or both, the plurality of measurement-point electric fields being components of electric fields in tangential directions of the measurement surface at the plurality of measurement points, the plurality of measurement-point magnetic fields being components of magnetic fields in the tangential directions of the measurement surface at the plurality of measurement points;
 a third step of setting a plurality of mirror image measurement points which have a plane-symmetrical positional relationship with the plurality of measurement points about the ground plane on a mirror image measurement surface which has a plane-symmetrical positional relationship with the measurement surface about the ground plane, and calculating either a plurality of mirror image measurement-point electric fields or a plurality of mirror image measurement-point magnetic fields, or both, on the basis of either the plurality of measurement-point electric fields or the plurality of measurement-point magnetic fields, or both, measured in the second step, the plurality of mirror image measurement-point electric fields being components of electric fields in tangential directions of the mirror image measurement surface at the plurality of mirror image measurement points, the plurality of mirror image measurement-point magnetic fields being components of magnetic fields in the tangential directions of the mirror image measurement surface at the plurality of mirror image measurement points; and
 a fourth step of calculating at least either one of the electric field and the magnetic field that are estimated to be formed at the virtual observation point, on the basis of either the plurality of measurement-point electric fields or the plurality of measurement-point magnetic fields, or both, measured in the second step, and either the plurality of mirror image measurement-point electric fields or the plurality of mirror image measurement-point magnetic fields, or both, calculated in the third step.

2. The far electromagnetic field estimation method according to claim 1, wherein the plurality of measurement points are arranged to be aligned in two intersecting directions, and a distance between two adjacent measurement points in each of the two intersecting directions on the measurement surface is smaller than or equal to ½ of a wavelength of the electromagnetic wave.

3. The far electromagnetic field estimation method according to claim 1, wherein
 the plurality of measurement-point electric fields, the plurality of measurement-point magnetic fields, the plurality of mirror image measurement-point electric fields, and the plurality of mirror image measurement-point magnetic fields each include a horizontal component parallel to the ground plane and a vertical component perpendicular to the ground plane,
 the horizontal components of the plurality of mirror image measurement-point electric fields are equal in amplitude but opposite in phase to the horizontal components of respective corresponding ones of the plurality of measurement-point electric fields,
 the vertical components of the plurality of mirror image measurement-point electric fields are equal in amplitude and phase to the vertical components of the respective corresponding ones of the plurality of measurement-point electric fields,
 the horizontal components of the plurality of mirror image measurement-point magnetic fields are equal in amplitude and phase to the horizontal components of respective corresponding ones of the plurality of measurement-point magnetic fields, and
 the vertical components of the plurality of mirror image measurement-point magnetic fields are equal in amplitude but opposite in phase to the vertical components of the respective corresponding ones of the plurality of measurement-point magnetic fields.

4. The far electromagnetic field estimation method according to claim 1, wherein the radiation source is located in a radio anechoic chamber that has a metal floor surface constituting the ground plane.

5. A far electromagnetic field estimation apparatus for determining at least either one of an electric field and a magnetic field that are estimated to be formed by a radiation source of an electromagnetic wave at a virtual observation point distant from the radiation source, the radiation source being located in either one of two spaces sectioned by a ground plane, the far electromagnetic field estimation apparatus comprising a near electromagnetic field measurement apparatus and an arithmetic processing unit, wherein
 the near electromagnetic field measurement apparatus includes:
  a probe to detect at least either one of an electric field and a magnetic field;

a position control mechanism capable of changing a relative position of the probe with respect to the radiation source; and a control unit to control measurement of the at least either one of the electric field and the magnetic field, the measurement being performed using the probe and the position control mechanism, the control unit performs:

a first operation of assuming a measurement surface and setting a plurality of measurement points on the measurement surface, the measurement surface forming a closed surface in combination with the ground plane, the closed surface surrounding the radiation source, the virtual observation point being outside a space formed inside the closed surface; and a second operation of measuring either a plurality of measurement-point electric fields or a plurality of measurement-point magnetic fields, or both, by using the probe while controlling the position control mechanism, the plurality of measurement-point electric fields being components of electric fields in tangential directions of the measurement surface at the plurality of measurement points, the plurality of measurement-point magnetic fields being components of magnetic fields in the tangential directions of the measurement surface at the plurality of measurement points, and the arithmetic processing unit performs:

first arithmetic processing for setting a plurality of mirror image measurement points which have a plane-symmetrical positional relationship with the plurality of measurement points about the ground plane on a mirror image measurement surface which has a plane-symmetrical positional relationship with the measurement surface about the ground plane, and calculating either a plurality of mirror image measurement-point electric fields or a plurality of mirror image measurement-point magnetic fields, or both, on the basis of either the plurality of measurement-point electric fields or the plurality of measurement-point magnetic fields, or both, measured by the second operation, the plurality of mirror image measurement-point electric fields being components of electric fields in tangential directions of the mirror image measurement surface at the plurality of mirror image measurement points, the plurality of mirror image measurement-point magnetic fields being components of magnetic fields in the tangential directions of the mirror image measurement surface at the plurality of mirror image measurement points; and second arithmetic processing for calculating at least either one of the electric field and the magnetic field that are estimated to be formed at the virtual observation point, on the basis of either the plurality of measurement-point electric fields or the plurality of measurement-point magnetic fields, or both, measured by the second operation, and either the plurality of mirror image measurement-point electric fields or the plurality of mirror image measurement-point magnetic fields, or both, calculated by the first arithmetic processing.

6. The far electromagnetic field estimation apparatus according to claim 5, wherein the plurality of measurement points are arranged to be aligned in two intersecting directions, and a distance between two adjacent measurement points in each of the two intersecting directions on the measurement surface is smaller than or equal to ½ of a wavelength of the electromagnetic wave.

7. The far electromagnetic field estimation apparatus according to claim 5, wherein the plurality of measurement-point electric fields, the plurality of measurement-point magnetic fields, the plurality of mirror image measurement-point electric fields, and the plurality of mirror image measurement-point magnetic fields each include a horizontal component parallel to the ground plane and a vertical component perpendicular to the ground plane, the horizontal components of the plurality of mirror image measurement-point electric fields are equal in amplitude but opposite in phase to the horizontal components of respective corresponding ones of the plurality of measurement-point electric fields, the vertical components of the plurality of mirror image measurement-point electric fields are equal in amplitude and phase to the vertical components of the respective corresponding ones of the plurality of measurement-point electric fields, the horizontal components of the plurality of mirror image measurement-point magnetic fields are equal in amplitude and phase to the horizontal components of respective corresponding ones of the plurality of measurement-point magnetic fields, and the vertical components of the plurality of mirror image measurement-point magnetic fields are equal in amplitude but opposite in phase to the vertical components of the respective corresponding ones of the plurality of measurement-point magnetic fields.

8. The far electromagnetic field estimation apparatus according to claim 5, wherein the radiation source, the probe and the position control mechanism are located in a radio anechoic chamber that has a metal floor surface constituting the ground plane.

9. The far electromagnetic field estimation apparatus according to claim 5, wherein the probe includes an electric field detection unit configured to output a signal responsive to the electric field, and a magnetic field detection unit configured to output a signal responsive to the magnetic field.

10. The far electromagnetic field estimation apparatus according to claim 9, wherein the electric field detection unit includes: an electric field antenna unit configured to generate a differential signal responsive to the electric field; two electric field output ports configured to output the differential signal generated by the electric field antenna unit; and an electric field shielding unit for shielding a part of the electric field antenna unit, and the magnetic field detection unit includes: a magnetic field antenna unit configured to generate a differential signal responsive to the magnetic field; two magnetic field output ports configured to output the differential signal generated by the magnetic field antenna unit; and a magnetic field shielding unit for shielding a part of the magnetic field antenna unit.

11. A near electromagnetic field measurement apparatus for measuring either a plurality of measurement-point electric fields or a plurality of measurement-point magnetic fields, or both, the plurality of measurement-point electric fields being components of electric fields in tangential directions of a measurement surface at a plurality of measurement points on the measurement surface, the plurality of measurement-point magnetic fields being components of magnetic fields in the tangential directions of the measurement surface at the plurality of measurement points, the measurement surface being assumed to surround a radiation source of an electromagnetic wave, the radiation source being located in either one of two spaces sectioned by a ground plane, the near electromagnetic field measurement apparatus comprising:

a probe to detect at least either one of an electric field and a magnetic field;

a position control mechanism capable of changing a relative position of the probe with respect to the radiation source; and a control unit to control measurement of the at least either one of the electric field and the magnetic field, the measurement being performed using the probe and the position control mechanism, wherein the control unit performs:

a first operation of assuming the measurement surface to form, in combination with the ground plane, a closed surface that surrounds the radiation source, and setting the plurality of measurement points on the measurement surface; and a second operation of measuring either the plurality of measurement-point electric fields or the plurality of measurement-point magnetic fields, or both, by using the probe while controlling the position control mechanism.

12. The near electromagnetic field measurement apparatus according to claim 11, wherein the plurality of measurement points are arranged to be aligned in two intersecting directions, and a distance between two adjacent measurement points in each of the two intersecting directions on the measurement surface is smaller than or equal to ½ of a wavelength of the electromagnetic wave.

13. The near electromagnetic field measurement apparatus according to claim 11, wherein the radiation source, the probe and the position control mechanism are located in a radio anechoic chamber that has a metal floor surface constituting the ground plane.

14. The near electromagnetic field measurement apparatus according to claim 11, wherein the probe includes an electric field detection unit configured to output a signal responsive to the electric field, and a magnetic field detection unit configured to output a signal responsive to the magnetic field.

15. The near electromagnetic field measurement apparatus according to claim 14, wherein the electric field detection unit includes: an electric field antenna unit configured to generate a differential signal responsive to the electric field; two electric field output ports configured to output the differential signal generated by the electric field antenna unit; and an electric field shielding unit for shielding a part of the electric field antenna unit, and the magnetic field detection unit includes: a magnetic field antenna unit configured to generate a differential signal responsive to the magnetic field; two magnetic field output ports configured to output the differential signal generated by the magnetic field antenna unit; and a magnetic field shielding unit for shielding a part of the magnetic field antenna unit.

* * * * *